US012665034B2

(12) United States Patent
Tang et al.

(10) Patent No.: US 12,665,034 B2
(45) Date of Patent: Jun. 23, 2026

(54) MEMORY DEVICE, MEMORY SYSTEM, MEMORY CONTROLLER AND OPERATING METHOD THEREOF

(71) Applicant: YANGTZE MEMORY TECHNOLOGIES CO., LTD., Wuhan (CN)

(72) Inventors: Xingwei Tang, Wuhan (CN); Guangchang Ye, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 137 days.

(21) Appl. No.: 18/807,590

(22) Filed: Aug. 16, 2024

(65) Prior Publication Data

US 2025/0266102 A1 Aug. 21, 2025

Related U.S. Application Data

(63) Continuation of application No. PCT/CN2024/077810, filed on Feb. 20, 2024.

(51) Int. Cl.
| | |
|---|---|
| *G11C 16/26* | (2006.01) |
| *G06F 3/06* | (2006.01) |
| *G11C 16/04* | (2006.01) |
| *G11C 29/12* | (2006.01) |
| *G11C 29/42* | (2006.01) |

(52) U.S. Cl.
CPC ............ *G11C 16/26* (2013.01); *G06F 3/0611* (2013.01); *G06F 3/0659* (2013.01); *G06F 3/0679* (2013.01); *G11C 16/0483* (2013.01); *G11C 29/12005* (2013.01); *G11C 29/42* (2013.01)

(58) Field of Classification Search
CPC ....................................................... G11C 16/26
USPC ....................................................... 365/185.2
See application file for complete search history.

(56) References Cited

U.S. PATENT DOCUMENTS

| | | | |
|---|---|---|---|
| 2018/0294036 A1 | 10/2018 | Oh et al. | |
| 2019/0235954 A1* | 8/2019 | Gim | G11C 11/5671 |
| 2020/0264805 A1* | 8/2020 | Yoshii | G06F 3/065 |

(Continued)

FOREIGN PATENT DOCUMENTS

| | | |
|---|---|---|
| CN | 105097028 A | 11/2015 |
| CN | 108986865 A | 12/2018 |

(Continued)

*Primary Examiner* — Muna A Techane
(74) *Attorney, Agent, or Firm* — BAYES PLLC

(57) ABSTRACT

Examples of the present disclosure provide a memory device, memory system, memory controller and operating method thereof. The memory device includes a memory cell with multiple storage bits, a preset number of the memory cells form one code word, and the multiple storage bits correspond to multiple pages respectively. The multiple stages include a first stage and a second stage. The peripheral circuit of the memory device is configured to: obtain a predicted valley voltage in the first stage in accordance with the corresponding first result at the target read voltage in the first stage; obtain the predicted valley voltage in the second stage in accordance with the predicted valley voltage in the first stage; and perform a first read operation on at least one code word with the predicted valley voltage in the first stage and the predicted valley voltage in the second stage.

20 Claims, 34 Drawing Sheets

(56)          References Cited

U.S. PATENT DOCUMENTS

| | | | |
|---|---|---|---|
| 2022/0222138 A1* | 7/2022 | Park | G11C 29/021 |
| 2022/0283727 A1* | 9/2022 | Tocalli | G06F 3/0655 |
| 2023/0072467 A1* | 3/2023 | Thiers | G11C 29/12005 |

FOREIGN PATENT DOCUMENTS

| | | |
|---|---|---|
| CN | 110299176 A | 10/2019 |
| CN | 111883198 A | 11/2020 |
| CN | 116230062 A | 6/2023 |

* cited by examiner

<u>100</u>

301

300

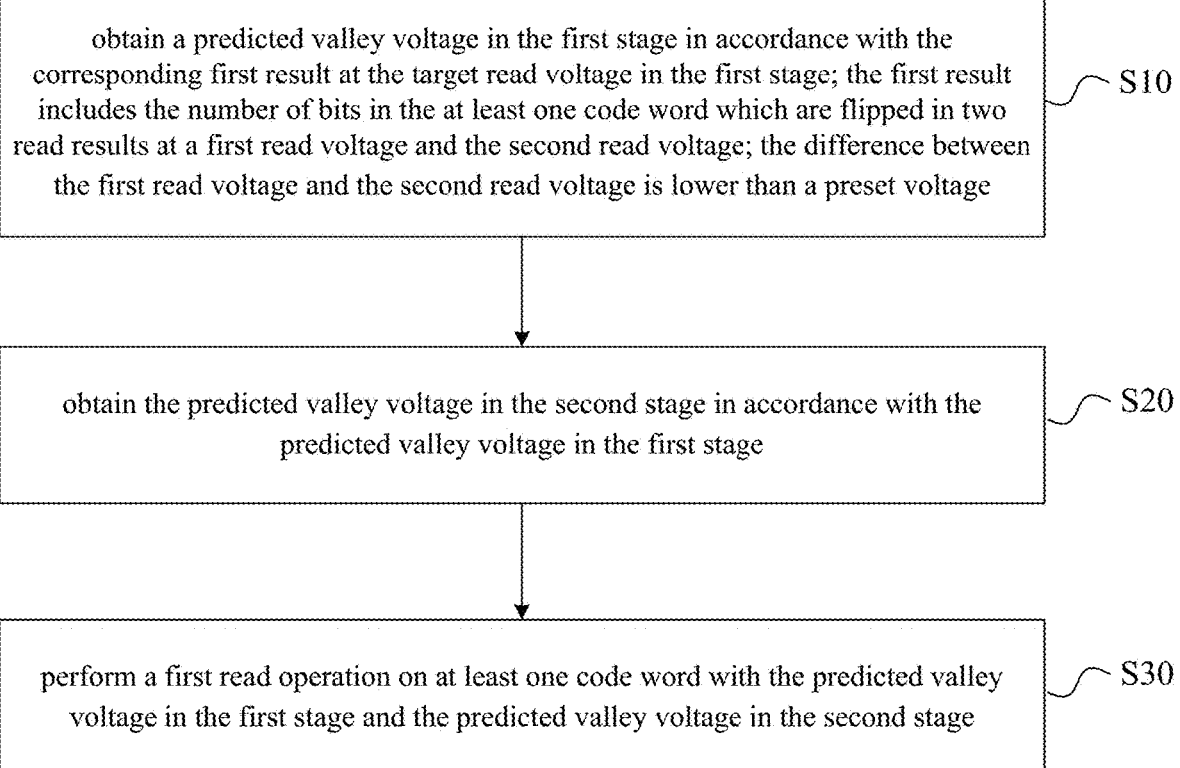

obtain a predicted valley voltage in the first stage in accordance with the corresponding first result at the target read voltage in the first stage; the first result includes the number of bits in the at least one code word which are flipped in two read results at a first read voltage and the second read voltage; the difference between the first read voltage and the second read voltage is lower than a preset voltage ⟿ S10 obtain the predicted valley voltage in the second stage in accordance with the predicted valley voltage in the first stage ⟿ S20 perform a first read operation on at least one code word with the predicted valley voltage in the first stage and the predicted valley voltage in the second stage ⟿ S30

Fig. 7

Cycle Type

DQx

MEMORY DEVICE, MEMORY SYSTEM, MEMORY CONTROLLER AND OPERATING METHOD THEREOF

CROSS-REFERENCE TO RELATED APPLICATIONS

The present application is a continuation to International Application No. PCT/CN2024/077810, filed on Feb. 20, 2024, which is hereby incorporated by reference in its entirety.

TECHNICAL FIELD

The present disclosure relates, but is not limited to, a memory device, memory system, memory controller and operating method thereof.

BACKGROUND

With the development of science and technology, the market size of the integrated circuit industry is getting larger and larger, and the process and technology of non-volatile memory devices in the entire integrated circuit industry have experienced rapid development in recent years, where NAND memory is particularly widely used. NAND memory implements data storage through capturing and storing charges in the gate dielectric layer of the memory cells it contains. However, with normal use time, the charge stored in the memory cell may change with the increase in use time, repeated read operations, cross temperature, etc., therefore affecting the accuracy of reading the data stored in the memory cell.

SUMMARY

According to one aspect of the present disclosure, a memory device is provided. The memory device may include an array of memory cells including a memory cell with multiple storage bits. A preset number of memory cells may form one code word. The multiple storage bits correspond to multiple pages respectively. At least part of the multiple pages corresponds to multiple stages. The multiple stages may include a first stage and a second stage. A voltage in the second stage may be lower than the read voltage in the first stage. The memory device may include a peripheral circuit coupled to the array of memory cells. The peripheral circuit may be configured to obtain a predicted valley voltage in the first stage in accordance with a corresponding first result at a target read voltage in the first stage. The first result may include the number of bits of at least one code word which are flipped in two read results at a first read voltage and a second read voltage. A difference between the first read voltage and the second read voltage may be lower than a preset voltage. The peripheral circuit may be configured to obtain a predicted valley voltage in the second stage in accordance with the predicted valley voltage in the first stage. The peripheral circuit may be configured to perform a first read operation on the at least one code word with the predicted valley voltage in the first stage and the predicted valley voltage in the second stage.

In some implementations, the peripheral circuit may be configured to take both the predicted valley voltage in the first stage and the predicted valley voltage in the second stage as initial target read voltages. In some implementations, the peripheral circuit may be configured to obtain a corresponding first result at the initial target read voltage. In some implementations, the peripheral circuit may be configured to determine the initial target read voltage to be a target valley voltage in accordance with the corresponding first result at the initial target read voltage meeting a preset condition.

In some implementations, the peripheral circuit may be configured to make at least one adjustment to the initial target read voltage, and obtain a corresponding first result at the adjusted target read voltage after each adjustment. In some implementations, the peripheral circuit may be configured to determine the adjusted target read voltage to be a target valley voltage in accordance with the corresponding first result at the adjusted target read voltage meeting a preset condition. In some implementations, the peripheral circuit may be configured to perform a second read operation on the at least one code word in accordance with the target valley voltage.

In some implementations, the peripheral circuit may be configured to take the predicted valley voltage in the first stage as an initial target read voltage, and obtain a corresponding first result at the initial target read voltage. In some implementations, the peripheral circuit may be configured to determine the initial target read voltage to be a target valley voltage in accordance with the corresponding first result at the initial target read voltage meeting a preset condition.

In some implementations, the peripheral circuit may be configured to make at least one adjustment to the initial target read voltage, and obtain a corresponding first result at the adjusted target read voltage after each adjustment. In some implementations, the peripheral circuit may be configured to determine a target valley voltage in accordance with the corresponding first result at the adjusted target read voltage meeting a preset condition. In some implementations, the peripheral circuit may be configured to obtain the predicted valley voltage in the second stage in accordance with the determined target valley voltage in the first stage. In some implementations, the peripheral circuit may be configured to perform a second read operation on the at least one code word in accordance with the determined target valley voltage in the first stage and the predicted valley voltage in the second stage.

In some implementations, each of the multiple pages may include multiple second stages. In some implementations, the peripheral circuit may be configured to obtain the predicted valley voltage in the second stage corresponding to the highest read voltage among read voltages in the multiple second stages for each of the pages in accordance with the predicted valley voltage in the first stage or the target valley voltage in the first stage for each of the pages. In some implementations, the peripheral circuit may be configured to obtain the predicted valley voltage in the second stage corresponding to a lower read voltage than a read voltage in an adjacent second stage, in accordance with the predicted valley voltage in the second stage corresponding to a higher read voltage among read voltages in the multiple second stages for each of the pages in sequence, until the predicted valley voltage in each of the second stages for each of the pages is obtained.

In some implementations, the peripheral circuit may be configured to obtain the predicted valley voltage in the second stage in accordance with the predicted valley voltage in the first stage or the target valley voltage in the first stage and a first mapping function, wherein the first mapping function represents a relationship between the predicted valley voltage in the first stage or the target valley voltage in the first stage and the predicted valley voltage in the second stage.

In some implementations, the peripheral circuit may be configured to, in a process of making at least one adjustment to the initial target read voltage, take the initial target read voltage as a baseline value. In some implementations, the peripheral circuit may be configured to, starting from the baseline value, making adjustments in two opposite directions with a step size being smaller than a first preset step size, in a process of making adjustments in each direction, count one for upward trend in accordance with the corresponding first result at a read voltage after a next adjustment being greater than the corresponding first result at a read voltage after a previous adjustment, and determine a first voltage boundary and a second voltage boundary with a total counted number being greater than or equal to a preset number. In some implementations, the peripheral circuit may be configured to, in a process of making adjustments in two directions, if the corresponding first result at the target read voltage after one adjustment is lower than a first threshold, or taking the minimum first result among multiple first results corresponding to target read voltages after multiple adjustments as a reference value, when the number of first results from remaining first results which differ from the reference value with a difference being less than a second threshold is greater than a preset number, stop the adjustments and take the target read voltage corresponding to the minimum first result among the multiple first results as the target valley voltage.

In some implementations, the peripheral circuit may be configured to, in the process of making adjustments in two directions, take the corresponding adjusted target read voltages as the first voltage boundary and the second voltage boundary respectively in accordance with the total counted number being equal to the preset number. In some implementations, the peripheral circuit may be configured to, in the process of making adjustments in two directions, if the first voltage boundary and the second voltage boundary have been determined, take the target read voltage for the last adjustment as an average of the first voltage boundary and the second voltage boundary. In some implementations, the peripheral circuit may be configured to take the read voltage corresponding to the minimum first result among the multiple corresponding first results at all the adjusted target read voltages as the target valley voltage.

In some implementations, the peripheral circuit may be configured to obtain the predicted valley voltage in the first stage in accordance with the corresponding first result at the target read voltage in the first stage, a stage number associated with the first stage, and a second mapping function. In some implementations, the second mapping function may represent a relationship between the corresponding first result at the target read voltage, a respective stage number associated with each stage, and the predicted valley voltage.

In some implementations, the peripheral circuit may be configured to read storage data of the at least one code word at the first read voltage to obtain a second result. In some implementations, the peripheral circuit may be configured to read storage data of the at least one code word at the second read voltage to obtain a third result. In some implementations, the peripheral circuit may be configured to perform a logical operation on the second result and the third result to obtain a fourth result. In some implementations, the peripheral circuit may be configured to count the number of bits in the fourth result that represents flip of bits in the third result relative to the second result to obtain the first result.

In some implementations, the peripheral circuit may include a first latch configured to store the second result. In some implementations, the peripheral circuit may include a second latch configured to store the third result. In some implementations, the peripheral circuit may include a third latch configured to store the fourth result.

According to a further aspect of the present disclosure, a memory system is provided. The memory system may include one or more memory devices. The one or more memory devices may include an array of memory cells including a memory cell with multiple storage bits. A preset number of memory cells form one code word. The multiple storage bits correspond to multiple pages respectively. At least part of the multiple pages may correspond to multiple stages. The multiple stages may include a first stage and a second stage. A read voltage in the second stage may be lower than a read voltage in the first stage. The memory system may include peripheral circuit coupled to the array of memory cells. The peripheral circuit may be configured to obtain a predicted valley voltage in the first stage in accordance with a corresponding first result at a target read voltage in the first stage. The first result may include the number of bits of at least one code word which are flipped in two read results at a first read voltage and a second read voltage. A difference between the first read voltage and the second read voltage may be lower than a preset voltage. The peripheral circuit may be configured to obtain a predicted valley voltage in the second stage in accordance with the predicted valley voltage in the first stage. The peripheral circuit may be configured to perform a first read operation on the at least one code word with the predicted valley voltage in the first stage and the predicted valley voltage in the second stage. The memory system may include a memory controller coupled to the memory device and to control the memory device.

In some implementations, the memory controller may be configured to send a first instruction. In some implementations, the first instruction may indicate to obtain information representing target valley voltages in multiple stages. In some implementations, the memory device may be configured to: receive the first instruction, obtain information representing the predicted valley voltages in multiple stages, and send the obtained information representing the predicted valley voltages in multiple stages to the memory controller. In some implementations, the memory controller may be further configured to: control the memory device to perform a first read operation with the predicted valley voltage in the information representing the predicted valley voltages in multiple stages, and perform a first error correction decode operation on a first read result of the first read operation.

In some implementations, the memory controller may be configured to output the first read result in accordance with a success of the first error correction decode. In some implementations, the memory controller may be configured to send a second instruction in accordance with a failure of the first error correction decode. In some implementations, the second instruction may indicate to reobtain the information representing the target valley voltages in the multiple stages. In some implementations, the memory device may be configured to: receive the second instruction, redetermine the target valley voltages in the multiple stages, and send second information representing the target valley voltages to the memory controller. In some implementations, the memory controller may be further configured to control the memory device to perform a second read operation with the target valley voltage in the second information, and perform a second error correction decode operation on a second read result of the second read operation.

According to a further aspect of the present disclosure, a memory controller is provided. The memory controller may be coupled to at least one memory device. The at least one memory device may include a memory cell with multiple storage bits. The multiple storage bits may correspond to multiple pages respectively. At least part of the multiple pages may correspond to multiple stages. The multiple stages may include a first stage and a second stage. A read voltage in the second stage may be lower than the read voltage in the first stage. The memory controller may include a control component. The control component may be configured to obtain a predicted valley voltage in the first stage in accordance with a corresponding first result at a target read voltage in the first stage. The first result may include a number of bits of at least one code word formed by a preset number of the memory cells which are flipped in two read results at a first read voltage and a second read voltage. A difference between the first read voltage and the second read voltage may be lower than a preset voltage. The control component may be configured to obtain a predicted valley voltage in the second stage in accordance with the predicted valley voltage in the first stage. The control component may be configured to control the memory device to perform a first read operation with the predicted valley voltage in the first stage and the predicted valley voltage in the second stage, and perform a first error correction decode on a first read result of the first read operation.

In some implementations, the control component may be configured to take both the predicted valley voltage in the first stage and the predicted valley voltage in the second stage as initial target read voltages in accordance with a failure of the first error correction decode; obtain a corresponding first result at the initial target read voltage; and determine the initial target read voltage to be a target valley voltage in accordance with the corresponding first result at the initial target read voltage meeting a preset condition. In some implementations, the control component may be configured to make at least one adjustment to the initial target read voltage, and obtain a corresponding first result at the adjusted target read voltage after each adjustment. In some implementations, the control component may be configured to determine the adjusted target read voltage to be the target valley voltage in accordance with the corresponding first result at the adjusted target read voltage meeting a preset condition. In some implementations, the control component may be configured to control the memory device to perform a second read operation on the at least one code word in accordance with the target valley voltage, and perform a second error correction decode on a second read result of the second read operation.

In some implementations, the control component may be configured to take the predicted valley voltage in the first stage as an initial target read voltage in accordance with a failure of the first error correction decode, obtain the first result for the initial target read voltage, and determine the initial read voltage to be a target valley voltage in accordance with the corresponding first result at the initial read voltage meeting a preset condition. In some implementations, the control component may be configured to make at least one adjustment to the initial target read voltage, and obtain a corresponding first result at the adjusted target read voltage after each adjustment. In some implementations, the control component may be configured to determine the target valley voltage in accordance with the corresponding first result at the adjusted target read voltage meeting a preset condition. In some implementations, the control component may be configured to obtain the predicted valley voltage in the second stage in accordance with the determined target valley voltage in the first stage. In some implementations, the control component may be configured to control the memory device to perform a second read operation on the at least one code word in accordance with the determined target valley voltage in the first stage and the predicted valley voltage in the second stage, and perform a second error correction decode on a second read result of the second read operation.

In some implementations, each of the multiple pages may include multiple second stages. In some implementations, the control component may be configured to obtain the predicted valley voltage in the second stage corresponding to the highest read voltage among read voltages in the multiple second stages for each of the pages in accordance with the predicted valley voltage in the first stage or the target valley voltage in the first stage for each of the pages. In some implementations, the control component may be configured to obtain the predicted valley voltage in the second stage corresponding to a lower read voltage than a read voltage in an adjacent second stage, in accordance with the predicted valley voltage in the second stage corresponding to a higher read voltage among read voltages in the multiple second stages for each of the pages in sequence, until the predicted valley voltage in each of the second stages for each of the pages is obtained.

In some implementations, the control component may be configured to obtain the predicted valley voltage in the second stage in accordance with the predicted valley voltage in the first stage or the target valley voltage in the first stage and a first mapping function. In some implementations, the first mapping function may represent a relationship between the predicted valley voltage in the first stage or the target valley voltage in the first stage and the predicted valley voltage in the second stage.

In some implementations, the control component may be configured to, in a process of making at least one adjustment to the initial target read voltage, take the initial target read voltage as a baseline value. In some implementations, the control component may be configured to starting from the baseline value, making adjustments in two opposite directions with a step size being smaller than a first preset step size, in a process of making adjustments in each direction, count one for upward trend in accordance with the corresponding first result at a read voltage after a next adjustment being greater than the corresponding first result at a read voltage after a previous adjustment, and determine a first voltage boundary and a second voltage boundary with a total counted number greater than or equal to a preset number. In some implementations, the control component may be configured to, in a process of making adjustments in two directions, if a corresponding first result at a target read voltage after one adjustment is lower than a first threshold, or taking the minimum first result among multiple first results corresponding to target read voltages after multiple adjustments as a reference value, when the number of first results from remaining first results which differ from the reference value with a difference being less than a second threshold is greater than a preset number, stop the adjustments and take the target read voltage corresponding to the minimum first result among the multiple first results as the target valley voltage.

In some implementations, the control component may be configured to, in the process of making adjustments in two directions, take the corresponding adjusted target read voltages as the first voltage boundary and the second voltage boundary respectively in accordance with the total counted number being equal to the preset number. In some implementations, the control component may be configured to, in the process of making adjustments in two directions, if the first voltage boundary and the second voltage boundary have been determined, take the target read voltage for the last adjustment as an average of the first voltage boundary and the second voltage boundary. In some implementations, the control component may be configured to take the read voltage corresponding to the minimum first result among the multiple corresponding first results at all the adjusted target read voltages as the target valley voltage.

In some implementations, the control component may be configured to control the memory device to output a corresponding read result in accordance with a success of the first error correction decode or a success of the second error correction decode. In some implementations, the control component may be configured to determine a failure of error correction in accordance with a failure of the second error correction decode.

In some implementations, the control component may be configured to obtain the predicted valley voltage in the first stage in accordance with the corresponding first result at the target read voltage in the first stage, a stage number associated with the first stage, and the second mapping function; wherein the second mapping function represents a relationship between a corresponding first result at the target read voltage, a respective stage number associated with each stage, and the predicted valley voltage.

According to yet another aspect of the present disclosure, a method for operating a memory device is provided. The method may include obtaining a predicted valley voltage in a first stage in accordance with a corresponding first result at a target read voltage in the first stage. The first result may include a number of bits of at least one code word formed by a preset number of memory cells in the memory device which are flipped in two read results at a first read voltage and a second voltage. A difference between the first read voltage and the second read voltage may be lower than a preset voltage. The memory cell may include multiple storage bits, and the multiple storage bits corresponding to multiple pages respectively. At least part of the multiple pages correspond to multiple stages. The multiple stages may include the first stage and a second stage. A read voltage in the second stage may be lower than a read voltage in the first stage. The method may include obtaining a predicted valley voltage in the second stage in accordance with the predicted valley voltage in the first stage. The method may include performing a first read operation on the at least one code word with the predicted valley voltage in the first stage and the predicted valley voltage in the second stage.

According to yet a further aspect of the present disclosure a method for operating a memory system. The method may include sending, by a memory controller in the memory system, a first instruction. The first instruction may indicate to obtain information representing target valley voltages in multiple stages. The method may include receiving, by a memory device in the memory system, the first instruction, and obtaining information representing predicted valley voltages in multiple stages, and sending the information representing the predicted valley voltages in multiple stages to the memory controller. The method may include controlling, by the memory controller, the memory device to perform a first read operation with the information representing the predicted valley voltages in the multiple stages, and performing a first error correction decode operation on a first read result of the first read operation. The obtaining information representing the predicted valley voltages in multiple stages may include obtaining a predicted valley voltage in a first stage in accordance with a corresponding first result at a target read voltage in the first stage. The first result may include a number of bits of at least one code word formed by a preset number of memory cells in the memory device which are flipped in two read results at a first read voltage and a second voltage. A difference between the first read voltage and the second read voltage may be lower than a preset voltage. The memory cell may include multiple storage bits. The multiple storage bits may correspond to multiple pages respectively. At least part of the multiple pages may correspond to multiple stages. The multiple stages may include the first stage and a second stage. A read voltage in the second stage may be lower than a read voltage in the first stage. The method may include obtaining a predicted valley voltage in the second stage in accordance with the predicted valley voltage in the first stage. The method may include performing a first read operation on the at least one code word with the predicted valley voltage in the first stage and the predicted valley voltage in the second stage.

According to yet another aspect of the present disclosure, a method for operating a memory controller is provided. The method may include obtaining a predicted valley voltage in a first stage in accordance with a corresponding first result at a target read voltage in the first stage. The first result may include a number of bits of at least one code word formed by a preset number of memory cells in at least one memory device coupled to the memory controller which are flipped in two read results at a first read voltage and a second read voltage. A difference between the first read voltage and the second read voltage may be lower than a preset voltage. The memory cell may include multiple storage bits. The multiple storage bits may correspond to multiple pages respectively. At least part of the pages correspond to multiple stages. The multiple stages may include the first stage and a second stage. A read voltage in the second stage may be lower than a read voltage in the first stage. The method may include obtaining a predicted valley voltage in the second stage in accordance with a predicted valley voltage in the first stage. The method may include controlling the memory device to perform a first read operation with the predicted valley voltage in the first stage and the predicted valley voltage in the second stage, and performing a first error correction decode on a first read result of the first read operation.

According to still another aspect of the present disclosure, a non-transitory storage medium having executable instructions stored thereon, which, when executed by a processor, may implement a method for operating a memory device. The method may include obtaining a predicted valley voltage in a first stage in accordance with a corresponding first result at a target read voltage in the first stage. The first result may include a number of bits of at least one code word formed by a preset number of memory cells in the memory device which are flipped in two read results at a first read voltage and a second voltage. A difference between the first read voltage and the second read voltage may be lower than a preset voltage. The memory cell may include multiple storage bits. The multiple storage bits correspond to multiple pages respectively. At least part of the multiple pages may correspond to multiple stages. The multiple stages may include the first stage and a second stage. A read voltage in the second stage may be lower than a read voltage in the first stage. The method may include obtaining a predicted valley voltage in the second stage in accordance with the predicted valley voltage in the first stage. The method may include performing a first read operation on the at least one code word with the predicted valley voltage in the first stage and the predicted valley voltage in the second stage.

According to yet a further aspect of the present disclosure, a non-transitory storage medium having executable instructions stored thereon, which, when executed by a processor, may implement a method for operating a memory system. The method may include sending, by a memory controller in the memory system, a first instruction. The first instruction may indicate to obtain information representing target valley voltages in multiple stages. The method may include receiving, by a memory device in the memory system, the first instruction, and obtaining information representing predicted valley voltages in multiple stages, and sending the information representing the predicted valley voltages in multiple stages to the memory controller. The method may include controlling, by the memory controller, the memory device to perform a first read operation with the information representing the predicted valley voltages in the multiple stages, and performing a first error correction decode operation on a first read result of the first read operation. The obtaining information representing the predicted valley voltages in multiple stages may include obtaining a predicted valley voltage in a first stage in accordance with a corresponding first result at a target read voltage in the first stage. The first result may include a number of bits of at least one code word formed by a preset number of memory cells in the memory device which are flipped in two read results at a first read voltage and a second voltage. A difference between the first read voltage and the second read voltage may be lower than a preset voltage; the memory cell including multiple storage bits. The multiple storage bits may correspond to multiple pages respectively. At least part of the multiple pages may correspond to multiple stages. The multiple stages may include the first stage and a second stage, and a read voltage in the second stage being lower than a read voltage in the first stage. The method may include obtaining a predicted valley voltage in the second stage in accordance with the predicted valley voltage in the first stage. The method may include performing a first read operation on the at least one code word with the predicted valley voltage in the first stage and the predicted valley voltage in the second stage.

According to still another aspect of the present disclosure, a non-transitory storage medium having executable instructions stored thereon, which, when executed by a processor, may implement a method for operating a memory controller. The method may include obtaining a predicted valley voltage in a first stage in accordance with a corresponding first result at a target read voltage in the first stage. The first result may include a number of bits of at least one code word formed by a preset number of memory cells in at least one memory device coupled to the memory controller which are flipped in two read results at a first read voltage and a second read voltage. A difference between the first read voltage and the second read voltage may be lower than a preset voltage; the memory cell including multiple storage bits, and the multiple storage bits may correspond to multiple pages respectively. At least part of the multiple pages may correspond to multiple stages. The multiple stages may include the first stage and a second stage. A read voltage in the second stage may be lower than a read voltage in the first stage. The method may include obtaining a predicted valley voltage in the second stage in accordance with a predicted valley voltage in the first stage. The method may include controlling the memory device to perform a first read operation with the predicted valley voltage in the first stage and the predicted valley voltage in the second stage, and performing a first error correction decode on a first read result of the first read operation.

BRIEF DESCRIPTION OF THE DRAWINGS

In the accompanying drawings, unless otherwise specified, same baseline numbers refer to same or similar parts or elements throughout multiple accompanying drawings. The accompanying drawings are not necessarily to scale. It should be understood that these accompanying drawings depict only some examples disclosed in accordance with the present disclosure and should not be considered as limiting the scope of the present disclosure.

FIG. 7 is a schematic diagram of the implementation process of operating a method that peripheral circuit of a memory device provided by an example of the present disclosure is configured to perform;

DETAILED DESCRIPTION

Figure 1:
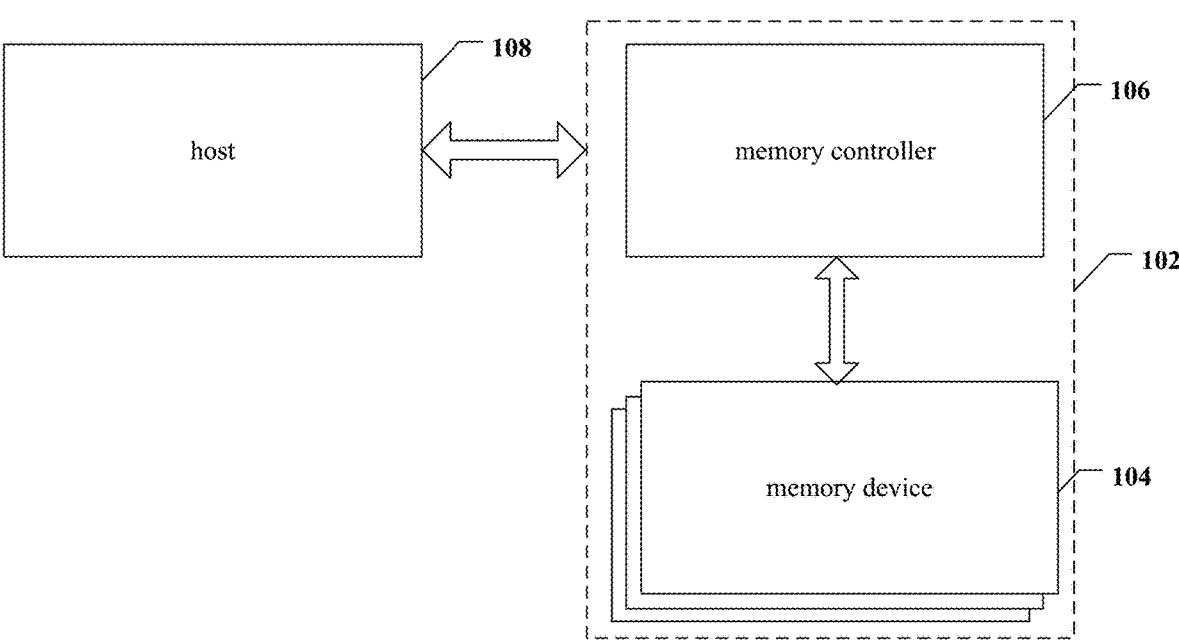
FIG. 1 is a schematic diagram of an example system with a memory system in an example of the present disclosure.

Example implementations disclosed in the present disclosure will be described in more detail below with reference to the accompanying drawings. Although example implementations of the present disclosure are shown in the accompanying drawings, it should be understood that the present disclosure may be implemented in various forms and should not be limited to the implementations set forth herein. Rather, these examples are provided so that the present disclosure can be more thoroughly understood and the scope of the present disclosure can be fully conveyed to those skilled in the art.

In the following description, numerous specific details are given in order to provide a more thorough understanding of the present disclosure. However, it will be apparent to one skilled in the art that the present disclosure may be practiced without one or more of these details. In other examples, in order to avoid confusion with the present disclosure, some technical features known in the art are not described; that is, not all features of the actual example are described here, and well-known functions and structures are not described in detail.

Furthermore, accompanying drawings are merely schematic illustrations of the present disclosure and are not necessarily drawn to scale. Same baseline numerals in the accompanying drawings represent same or similar parts, and thus repeated description thereof will be omitted. Some of the block diagrams shown in the accompanying drawings are functional entities and do not necessarily correspond to physically or logically separate entities. These functional entities may be implemented in software form, or implemented in one or more hardware modules or integrated circuits, or implemented in different networks and/or processor devices and/or microcontroller devices.

The flowcharts shown in the accompanying drawings are illustrative only and do not necessarily include all operations. For example, some operations may be decomposed, and some operations may be merged or partially merged, thus the actual order of execution may change according to the actual situation.

A term used herein is for the purpose of describing a particular example only and is not to be considered as limitation of the present disclosure. As used herein, the singular forms "a", "an" and "said/the" are intended to include the plural forms as well, unless the context clearly dictates otherwise. It should also be understood that the terms "consists of" and/or "comprising", when used in this description, identify the presence of stated features, integers, operations, operations, elements and/or parts, but do not exclude the presence of one or more other features, integers, operations, operations, elements, parts and/or groups. As used herein, the term "and/or" includes any and all combinations of the associated listed items.

Memory devices in examples of the present disclosure include but are not limited to a three-dimensional NAND memory, and for ease of understanding, a three-dimensional NAND memory is taken as an example for illustration.

FIG. 1 illustrates a block diagram of an example system 100 with memory devices in accordance with some aspects of the present disclosure. The system 100 may be a mobile phone, a desktop computer, a laptop computer, a tablet, a vehicle computer, a gaming console, a printer, a positioning device, a wearable electronic device, a smart sensor, a Virtual Reality (VR) device, an Augment Reality (AR) device, or any other suitable electronic devices having memory device therein. As shown in in FIG. 1, system 100 may include a host 108 and a memory system 102, and the memory system 102 has one or more memory devices 104 and a memory controller 2. The host 108 may be a processor of an electronic device (e.g., a Central Processing Unit (CPU)) or a System of Chip (SoC) (e.g., an Application Processor (AP)). Host 108 may be configured to send data to or receive data from memory device 104.

According to some implementations, memory controller 106 is coupled to memory device 104 and host 108 and is configured to control memory device 104. Memory controller 106 may manage data stored in memory device 104 and communicate with host 108. In some implementations, the memory controller 106 is designed to operate in low duty cycle environments, e.g., Secure Digital (SD) card, Compact Flash (CF) card, Universal Serial Bus (USB) flash drive, or other media for use in electronic devices such as personal computer, digital camera, mobile phone, etc.

In some implementations, the memory controller 106 is designed to operate in high duty cycle environment Solid State Drive (SSD) or Embedded Multi Media Card (eMMC), where SSD or eMMC is used as data storage for mobile devices such as smartphone, tablet computer, laptop computer, and enterprise storage array.

Memory controller 106 may be configured to control operations of memory device 104, e.g., read, erase and program operations. Memory controller 106 may also be configured to manage various functions related to data stored or to be stored in memory device 104, including but not limited to bad block management, garbage collection, logical-to-physical address translation, wear leveling, etc. In some implementations, memory controller 106 is also configured to process error correction code related to data read from or written to memory device 104.

The memory controller 106 may also perform any other suitable functions, e.g., formatting the memory device 104. Memory controller 106 may communicate with external devices (e.g., host 108) according to a particular communication protocol. For example, the memory controller 106 may communicate with external devices through at least one of various interface protocols, such as USB protocol, MMC protocol, Peripheral Component Interconnect (PCI) protocol, PCI Express (PCI-E) protocol, Advanced Technology Attachment (ATA) protocol, Serial ATA protocol, Parallel ATA protocol, Small Computer Small Interface (SCSI) protocol, Enhanced Small Disk Interface (ESDI) protocol, Integrated Drive Electronics (IDE) protocol, Firewire protocol, etc.

The memory controller 106 and one or more memory device 104 may be integrated into various types of storage devices, e.g., included in the same package (e.g., Universal Flash Storage (UFS) package or eMMC package). That is, memory system 102 may be implemented and packaged into different types of end electronic products.

Figure 2A:
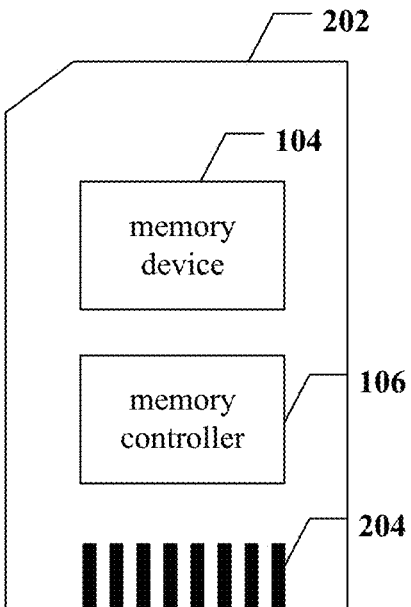
FIG. 2A is a schematic diagram of an example memory card with a memory system in an example of the present disclosure.

In one example as shown in FIG. 2A, memory controller 106 and a single memory device 104 may be integrated into a memory card 202. Memory card 202 may include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 202 may further include a memory card connector 204 coupling memory card 202 with a host (e.g., host 108 in FIG. 1).

Figure 2B:
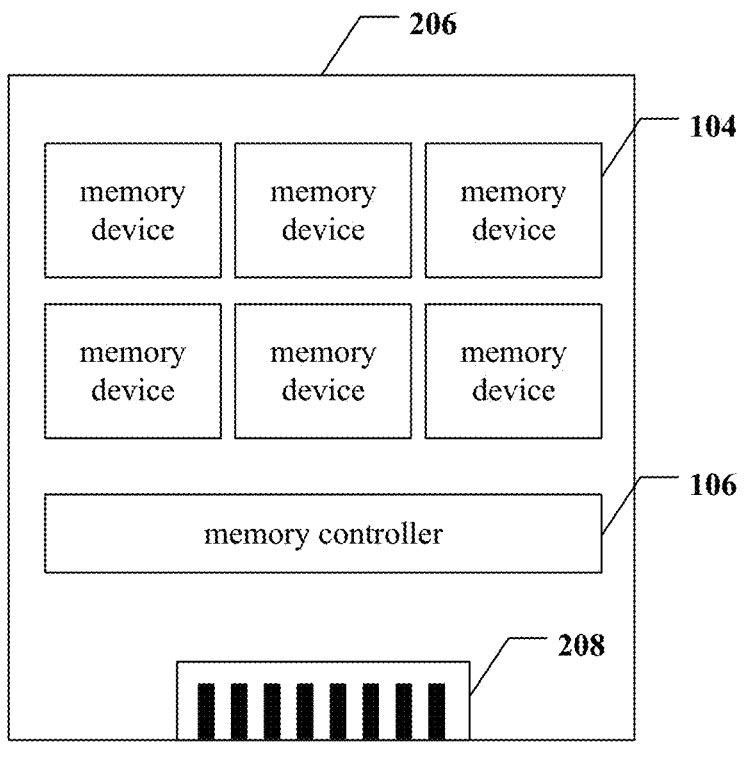
FIG. 2B is a schematic diagram of an example solid-state drive with a memory system in an example of the present disclosure.

In another example as shown in FIG. 2B, memory controller 20 and multiple memory devices may be integrated into a SSD 206. SSD 206 may further include an SSD connector 208 coupling the SSD 206 with a host (e.g., host 108 in FIG. 1). In some implementations, the storage capacity and/or operating speed of SSD 206 is greater than the storage capacity and/or operating speed of memory card 202.

In some examples, each memory block may be coupled to multiple word lines, and multiple memory cells coupled to each word line form a physical page.

Figure 3:
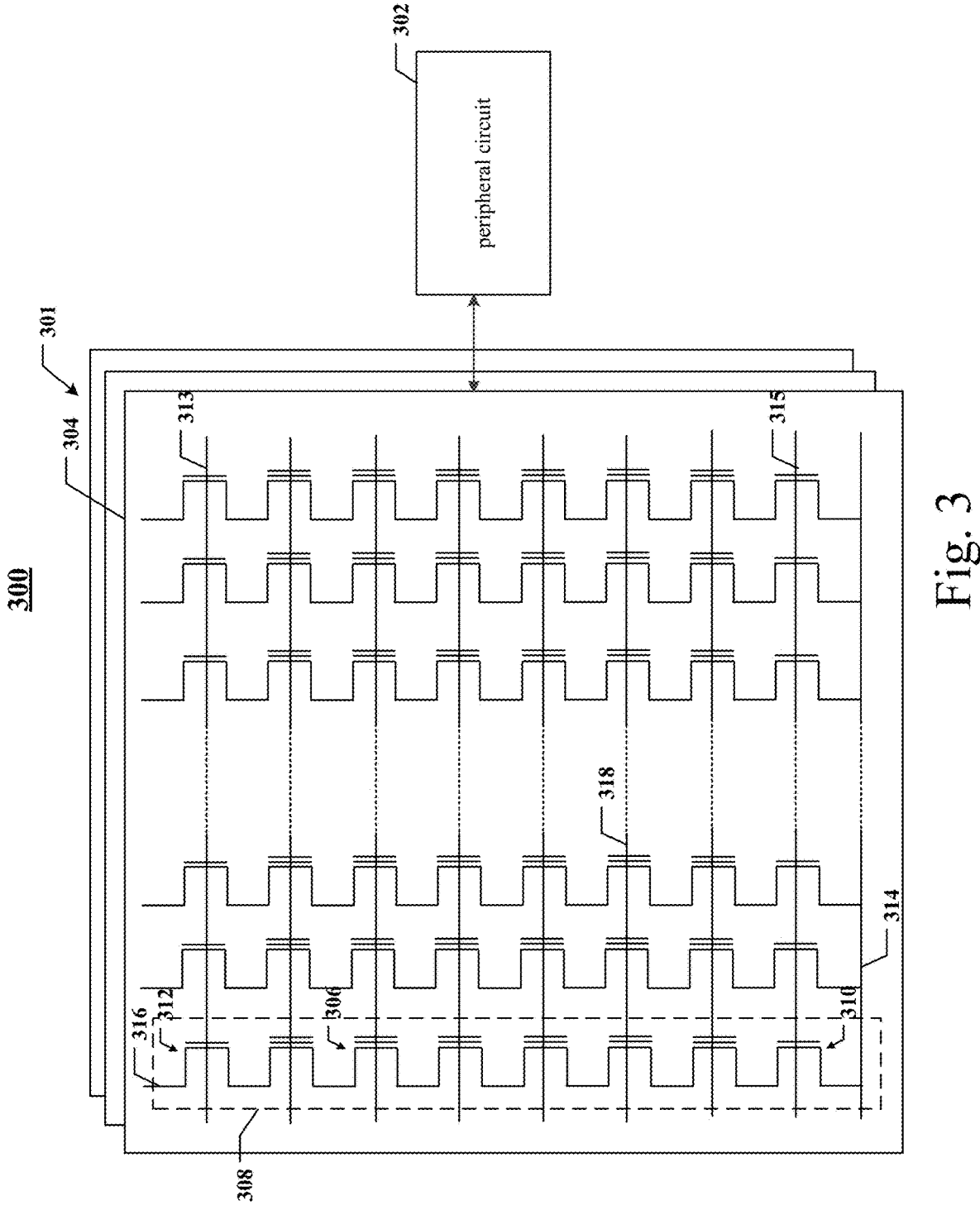
FIG. 3 is a schematic diagram of an example memory including peripheral circuit in an example of the present disclosure.

FIG. 3 illustrates a schematic circuit diagram of an example memory device 300 including peripheral circuit according to some aspects of the present disclosure. Memory device 300 may be an example of memory device 104 in FIG. 1. The memory device 300 may include an array of memory cells 301 and a peripheral circuit 302 coupled to the array of memory cells 301. Taking memory cell array 301 being a three-dimensional NAND memory cell array as an example for illustration, where memory cells 306 is a NAND-type memory cell, and memory cells 306 are provided in the form of an array of memory strings 308, each memory string 308 extending vertically over a substrate (not shown). In some implementations, each memory string 308 includes multiple memory cells 306 coupled in series and stacked vertically. Each memory cell 306 may retain a continuous analog value, e.g., voltage or charge, depending on the number of electrons trapped within the area of the memory cell 306. Each memory cell 306 may be a "floating gate" type memory cell including a floating gate transistor, or a "charge trap" type memory cell including a charge trap transistor.

In some implementations, each memory cell 306 is a Single-level Cell (SLC) that has two possible memory states and may thus store one bit of data. For example, a first memory state of "0" may correspond to a first voltage range, and a second memory state of "1" may correspond to a second voltage range. In some implementations, each memory cell 306 is a Multi-Level Cell (MLC) capable of storing more than a single bit of data in more than four memory states. For example, an MLC may store two bits per cell (also known as a Double-Level Cell), three bits per cell (also known as a Trinary-Level Cell (TLC)), four bits per cell (also known as a Quad-Level Cell (QLC)), five bits per cell (also known as a Penta-level cell (PLC)), or more than five bits per cell. Each MLC can be programmed to assume a range of possible nominal storage values. In one example, if each MLC stores two bits of data, the MLC can be programmed to assume one of three possible programming levels from the erased state through writing one of three possible nominal storage values into the cell, a fourth nominal storage value may be used for the erase state.

It should be noted that the storage state mentioned here is also the storage state of the memory cell mentioned in this application. Different memory cells have different numbers of storage states. e.g., an SLC type memory cell has 2 storage states (e.g., two memory states), where the 2 storage states include a programming state and an erase state. As another example, an MLC type memory cell has 4 storage states, where the four storage states include 1 erase state and 3 programming states. As yet another example, a TLC type memory cell has 8 storage states, where the 8 storage states include one erase state and 7 programming states. In some implementations, the QLC type memory cell has 16 storage states, where the 16 storage states include 1 erase state and 15 programming states.

As shown in FIG. 3, each memory string 308 may include a bottom select gate (BSG) 310 (also referred to as a source side select gate) at its source terminal and a top select gate (TSG) 312 (also referred to as a drain side select gate) at its drain terminal. BSG 310 and TSG 312 may be configured to activate the selected memory cell string 308 during read operation and program operation. In some implementations, the sources of memory strings 308 in a same memory block 304 are coupled through a same source line (SL) 314 (e.g., a common SL). In other words, according to some implementations, all memory strings 308 in a same memory block 304 have an array common source (ACS). According to some implementations, TSG 312 of each memory string 308 is coupled to a corresponding bit line (BL) 316 from which data may be read or written via an output bus (not shown). In some implementations, each memory string 308 is configured to be selected or deselected through applying a select voltage (e.g., above the threshold voltage of a transistor with a TSG 312) or a deselect voltage (e.g., 0V) to the corresponding TSG 312 via one or more TSG lines 313 and/or applying a select voltage (e.g., above the threshold voltage of a transistor with a BSG 310) or a deselect voltage (e.g., 0V) to the corresponding BSG 310 via one or more BSG lines 315.

As also shown in FIG. 3, a memory string 308 may be organized into multiple memory blocks 304 each of which may have a common source line 314 (e.g., coupled to ground). In some implementations, each memory block 304 is the basic data unit for an erase operation, e.g., all memory cells 306 on the same memory block 304 are erased simultaneously. To erase the memory cell 306 in the selected memory block 304, the source line 314 coupled to the selected memory block 304 and to the unselected memory blocks 304 in the same plane as the selected memory block 304 may be biased with an erase voltage (Vers) (e.g., a high positive voltage (e.g., 20V or higher)). It should be understood that, in some examples, erase operations may be performed at the half-memory block level, at the quarter-memory block level, or at a level with any suitable number of memory blocks or any suitable fraction of memory blocks. The memory cells 306 of adjacent memory strings 308 may be coupled through a word line 318 that selects which row of memory cells 306 is affected by read and program operations.

Referring to FIG. 3, each memory cell 306 of the multiple memory cells is coupled to a corresponding word line 318, and each memory string 308 is coupled to a corresponding bit line 316 through a corresponding select transistor (e.g., top select transistor (TSG) 312).

Figure 4:
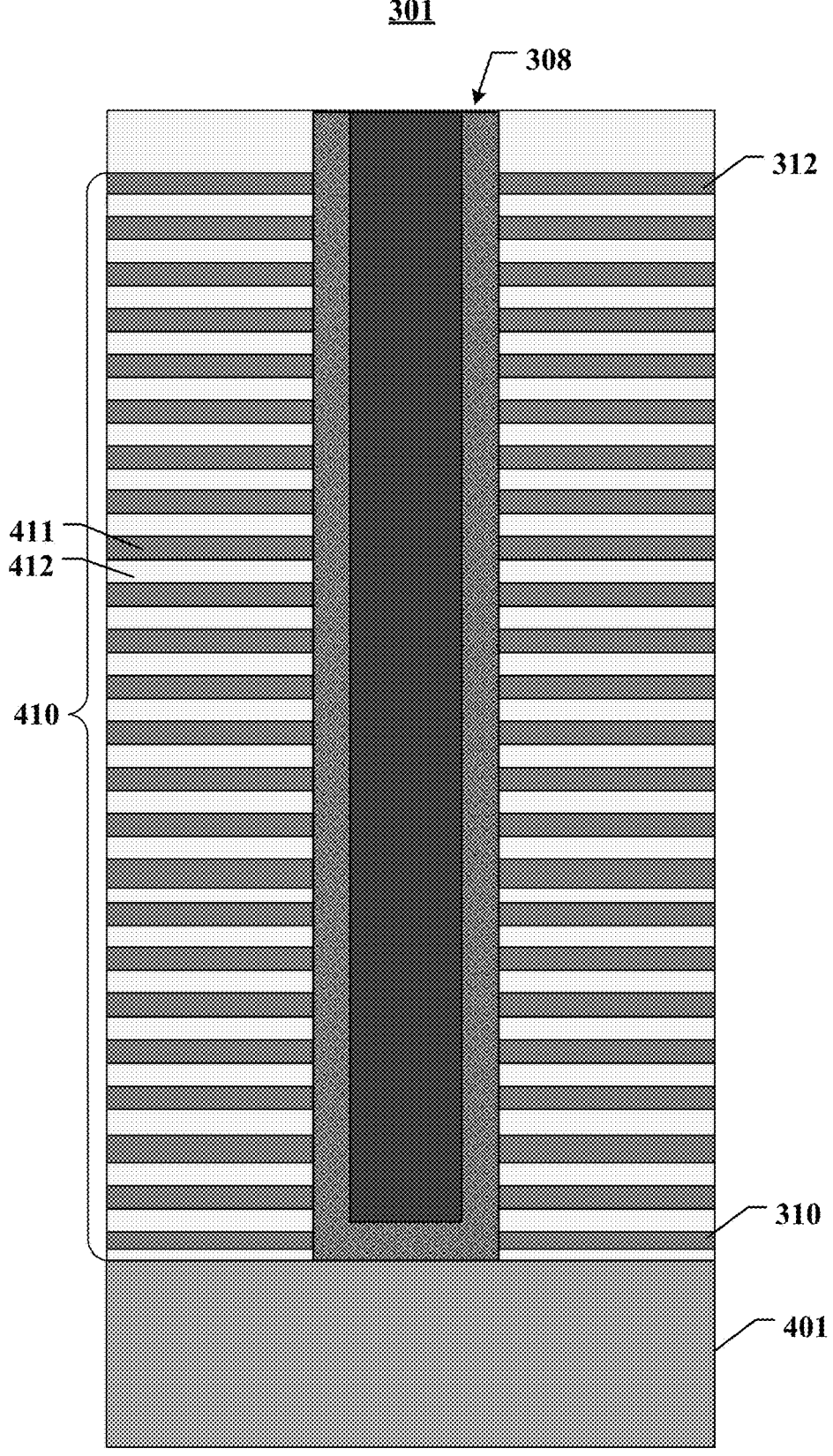
FIG. 4 is a schematic cross-sectional view of an array of memory cells including NAND-type memory strings in an example of the present disclosure.

FIG. 4 illustrates a schematic cross-sectional view of an example memory cell array 301 including memory strings 308, e.g., NAND, according to some aspects of the present disclosure. As shown in FIG. 4, the NAND memory cell array 301 may include a stacked structure 410, the stacked structure 410 includes multiple gate layers 411 and multiple insulating layers 412 alternately stacked in sequence, and the channel structure vertically penetrating through the gate layers 411 and the insulating layers 412, where the channel structure is coupled to each gate layer to form a memory cell, and the channel structure is coupled to multiple gate layers in the stacked structure 410 to form the memory string 308. Gate layers 411 and the insulating layers 412 may be stacked alternately, and two adjacent gate layers 411 are separated by an insulating layer 412.

A constituent material of the gate layer 411 may include a conductive material. Conductive materials include, but are not limited to, tungsten (W), cobalt (Co), copper (Cu), aluminum (Al), polysilicon, doped silicon, silicide, or any combination thereof. In some examples, each gate layer 411 includes a metal layer, e.g., a tungsten layer. In some examples, each gate layer 411 includes a doped polysilicon layer. Each gate layer 411 may include a control gate surrounding a memory cell. A gate layer 411 at the top of a stacked structure 410 may extend laterally as an upper selection gate line, a gate layer 411 at the bottom of a stacked structure 410 may extend laterally as a lower selection gate line, and a gate layer 411 extending laterally between a upper selection gate line and a lower selection gate line may serve as a word line layer.

In some examples, a stacked structure 410 may be disposed on a substrate 401. The substrate 401 may include silicon (e.g., monocrystalline silicon), silicon germanium (SiGe), gallium arsenide (GaAs), germanium (Ge), silicon-on-insulator (SOI), germanium-on-insulator (GOI), or any other appropriate material.

In some examples, a memory string 308 includes a channel structure extending vertically through stacked structure 410. In some implementations, a channel structure includes a channel hole filled with semiconductor material (s) (e.g., as a semiconductor channel) and dielectric material (s) (e.g., as a memory film). In some implementations, a semiconductor channel includes silicon, e.g., polysilicon. In some implementations, a memory film is a composite dielectric layer including a tunneling layer, a storage layer (also referred to as a "charge trapping/storage layer"), and a blocking layer. A channel structure may have a cylindrical shape (e.g., a pillar shape). According to some implementations, a semiconductor channel, a tunneling layer, a storage layer and a blocking layer are radially arranged in this order from the center of the pillar toward the outer surface of the pillar. A tunneling layer may include silicon oxide, silicon oxynitride, or any combination thereof. A storage layer may include silicon nitride, silicon oxynitride, or any combination thereof. A barrier layer may include silicon oxide, silicon oxynitride, a high-k (high-k) dielectric, or any combination thereof. In an example, a memory film may include a composite layer of silicon oxide/silicon oxynitride/silicon oxide (ONO).

Figure 5:
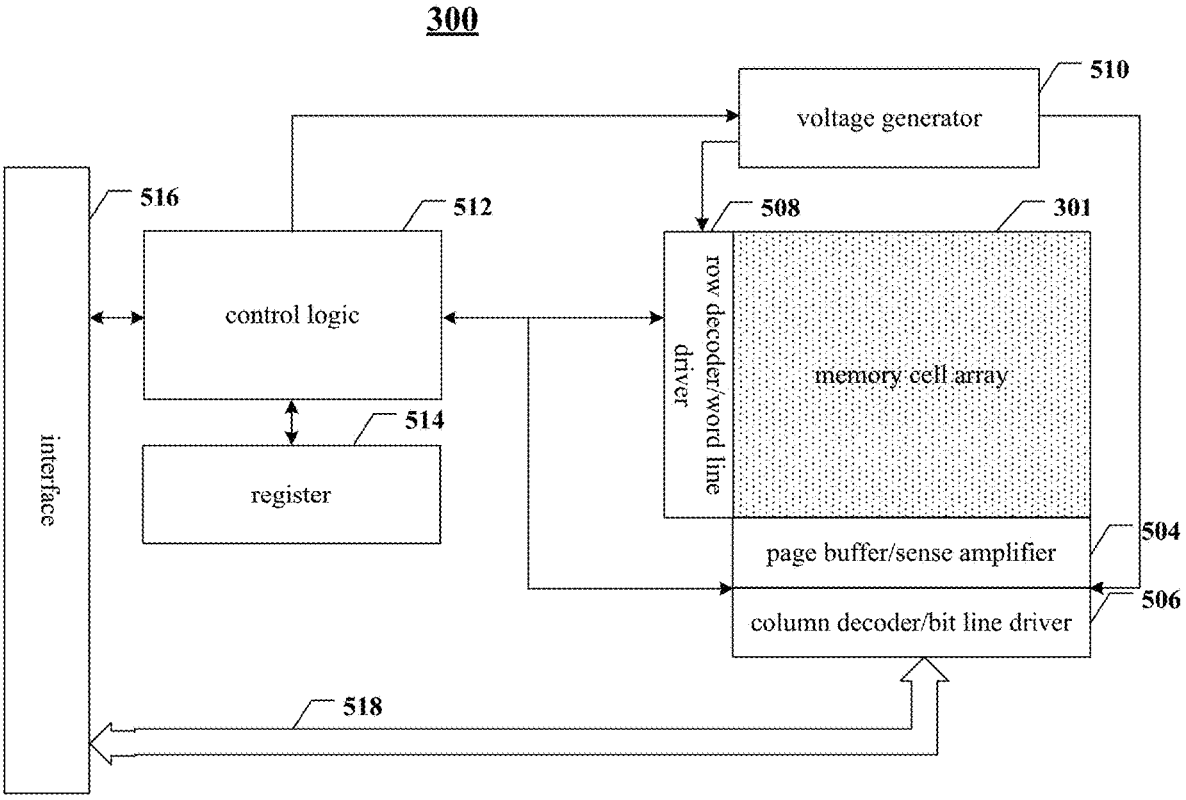
FIG. 5 is a schematic diagram of an example memory device including an array of memory cells and peripheral circuit in an example of the present disclosure.

Referring back to FIG. 3, the peripheral circuit 302 may be coupled to the array of memory cells 301 through bit line 316, word line 318, source line 314, BSG line 315, and TSG line 313. The peripheral circuit 302 may include any suitable analog, digital, and mixed-signal circuitry for facilitating operation of the array of memory cells 301 through applying a voltage signal and/or a current signal to and sensing a voltage signal and/or current signal from each target memory cell 306 via bit line 316, word line 318, source line 314, BSG line 315, and TSG line 313. The peripheral circuit 302 may include various types of peripheral circuit formed with metal-oxide-semiconductor (MOS) technology. For example, FIG. 5 illustrates some example peripheral circuit, the peripheral circuit includes page buffer/sense amplifier 504, column decoder/bit line driver 506, row decoder/word line driver 508, voltage generator 510, control logic 512, register 514, interface 516 and data bus 518. It should be understood that in some examples, additional peripheral circuit not shown in FIG. 5 may also be included.

The page buffer/sense amplifier 504 may be configured to read data from and program (write) data to the array of memory cells 301 according to control signals from the control logic 512. In one example, the page buffer/sense amplifier 504 may store programming data (written data) to be programmed into the array of memory cells 301. In another example, the page buffer/sense amplifier 504 may perform a programming verify operation to ensure that data has been correctly programmed into memory cell 306 coupled to selected word line 318. In yet another example, the page buffer/sense amplifier 504 may also sense a low power signal from bit line 316 representing a data bit stored in memory cell 306 and amplify a small voltage swing to a recognizable logic level during a read operation. The column decoder/bit line driver 506 may be configured to be controlled by control logic 512 and to select one or more memory strings 308 through applying a bit line voltage obtained from voltage generator 510.

The row decoder/word line driver 508 may be configured to be controlled by control logic 512 and select/deselect memory block 304 of memory cell array 301 and select/deselect word line 318 of memory block 304. The row decoder/word line driver 508 may also be configured to drive word line 318 with a word line voltage obtained from voltage generator 510. In some implementations, the row decoder/word line driver 508 may also select/deselect and drive the BSG line 315 and the TSG line 313. As described in detail below, the row decoder/word line driver 508 is configured to perform programming operations on the memory cells 306 coupled to the selected word line 318. The voltage generator 510 may be configured to be controlled by the control logic 512, and obtain word line voltage (e.g., read voltage, programming voltage, pass voltage, channel boost voltage, verify voltage, etc.), bit line voltage and source line voltage to be supplied to the array of memory cells 301.

The control logic 512 may be coupled to each of other portions of the peripheral circuit described above, and configured to control operations of each of the other portions of the peripheral circuit. The register 514 may be coupled to the control logic 512 and include status register, command register and address register for storing status information, command operation code (OP code) and command address for controlling operations of each of the peripheral circuit. The interface 516 may be coupled to control logic 512 and act as a control buffer to buffer and relay control commands received from a host (not shown) to control logic 512 and to buffer and relay status information received from the control logic 512 to the host. Interface 516 may also be coupled to column decoder/bit line driver 506 via data bus 518 and act as a data I/O interface and data buffer to buffer and relay data to/from memory cell array 301.

The basic principle of three-dimensional NAND memory is that carriers (electrons or holes) cross the charge barrier and inject a certain amount of charge into the memory cell to complete the process of data write, the storage data may then be read in accordance with the threshold voltage when the memory cell is turned on. Therefore, in order to read correct data, an error correction algorithm with strong error correction capability and high efficiency is usually introduced when reading data.

However, as the use time increases, the charge stored in the memory cell will change with the increase in use time, repeated read operations, cross temperature, etc., therefore affecting the accuracy of data reading. When the threshold voltage offsets upward or downward significantly, when the original read voltage is to read the data of the memory cell, the possibility of occurring read error will be very high, and a read error exceeding the error correction capability will also cause data read of the memory cell to fail.

Figure 6:
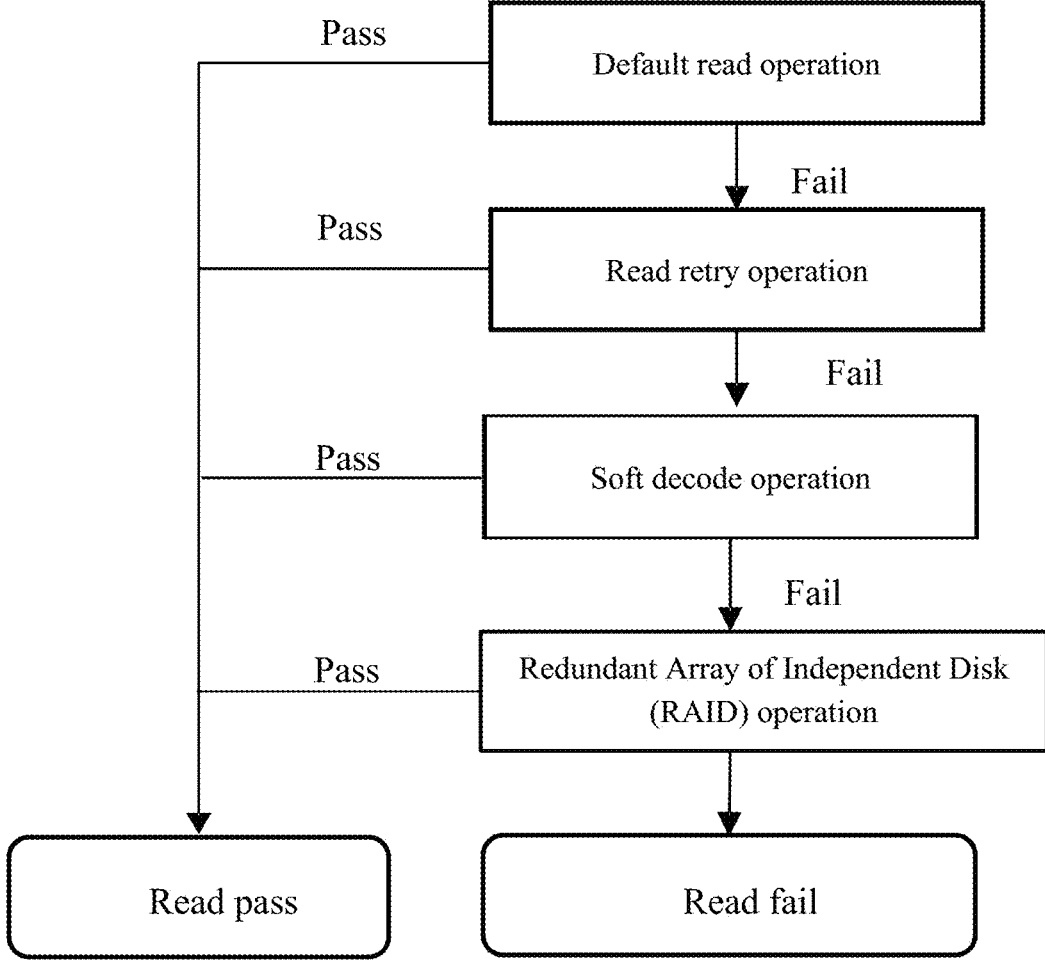
FIG. 6 is a schematic diagram of an example flow of a read operation on a memory system provided by the present disclosure.

FIG. 6 illustrates a schematic diagram of an example flow of a read operation on a memory system. In conjunction with what is shown in FIG. 6, when the memory controller controls the memory device to perform a read operation, a default read operation (FW) is first performed on the memory cell at the corresponding physical address; if the default read operation fails, a read retry operation is performed; after the read retry operation fails, a soft decode operation is performed; after the soft decode fails, a Redundant Array of Independent Disk (RAID) operation is performed; and after the RAID operation fails, the read operation stops and the read fails because the error cannot be corrected, then the memory controller sends a read fail signal to the host 108. Read retry operation and default read operation may be applicable to hard decode.

In some implementations, the read retry operation may usually be performed through querying the retry table provided by the manufacturer. The essence of the read retry operation is an error correction mechanism, the retry table may provide a baseline voltage for reading data, which attempts to read each memory cell again with a read voltage that deviates from the normal threshold voltage through querying the retry table, combined with error correction algorithm for error correction, thereby attempting to read the data correctly. If the erroneous read data is corrected, query for the retry table is stopped. If the erroneous read data cannot be corrected, the retry table will be queried until the entire retry table is traversed.

The read retry operation described above requires querying the retry table one by one, which will inevitably increase the number of retry and take a long time. In addition, the retry table provided by the manufacturer is only a reference value in some environments, and the real usage scenarios are ever-changing; therefore, many scenarios cannot be covered by the retry table provided by the manufacturer, therefore, even if the retry table is traversed, the data may not be corrected, resulting in a lot of wasted time processing the command. In summary, the method of performing the read retry operation through repeatedly polling the retry table takes a long time, affects the response time of subsequent commands, and thus affects the performance of the device.

Based on one or more of the problems described above, in a first aspect, an example of this application proposes a memory device. As shown in FIG. 7, the memory device includes: an array of memory cells including a memory cell with multiple storage bits, where a preset number of the memory cells form one code word, and the multiple storage bits correspond to multiple pages respectively; at least part of the pages corresponds to multiple stages, the multiple stages include a first stage and a second stage, and a read voltage in the second stage is lower than a read voltage in the first stage; peripheral circuit coupled to the array of memory cells and configured to perform the following operations:

At operation S10, a predicted valley voltage in the first stage is obtained in accordance with the corresponding first result at the target read voltage in the first stage; the first result includes the number of bits in the at least one code word which are flipped in two read results at a first read voltage and the second read voltage; the difference between the first read voltage and the second read voltage is lower than a preset voltage.

At operation S20, the predicted valley voltage in the second stage is obtained in accordance with the predicted valley voltage in the first stage.

At operation S30, a first read operation is performed on at least one code word with the predicted valley voltage in the first stage and the predicted valley voltage in the second stage.

Here, the structure of the memory device refers to FIG. 3 described above and will not be repeated here.

In some examples, the memory device including an array of memory cells, the array of memory cells including multiple memory cells, a preset number of the memory cells forming one code word (CW).

In some examples, the number of memory cells contained in one code word is the same as the number of memory cells contained in one pass of encode or decode when error correction encode or decode is being performed. In some examples, the number of memory cells contained in a code word may be lower than or equal to the number of memory cells coupled to one physical page, e.g., the number of memory cells contained in one code word is ¼ of the number of memory cells coupled to one physical page. In some examples, a code word may include a number ranging from $2^4$ to $2^{12}$ of memory cells. In one example, a code word may include $2^4$, $2^8$, or $2^{12}$ memory cells.

In general, code words with different sizes may be chosen by different memory systems to meet their requirement for performance, reliability, and storage.

Memory cells in different types of memory devices (e.g., MLC, TLC or QLC) may store different numbers of bits.

It should be noted that, in practice, some additional reserved space in a code word may be reserved for management and error correction; thus, the actual number of memory cells required may slightly exceed the calculation results described above.

It may be understood that a code word may include multiple memory cells, and the number of memory cells included in a code word may be adjusted according to actual situations.

In some examples, during the process of reading the memory device, one read operation reads data of one physical page, and when the number of memory cells included in one code word may be lower than the number of memory cells coupled to one physical page, the code word is a unit that may be performed to obtain the first result, but the case of multiple code words is not excluded. That is to say, the first result corresponding to at least one code word at the current read voltage may be obtained here. For example, one physical page may include 4 code words, the page buffer hardware operation may count the Fail Bit Count (FBC) of each of the 4 code words at one time, and then the FBC of the four code words are added to obtain the FBC of one physical page, and the added value is used by subsequent calculations. It may be understood that the first result here may be data based on one physical page, and one physical page may include multiple code words.

In some examples, the array of memory cells includes memory cells with P storage bits, and the P storage bits correspond to P pages respectively, and the memory cell with P bits reads its P bits of storage data through Q-level read voltages; where P, Q are both integers greater than 1, and $Q=2^P-1$.

Figure 8A:
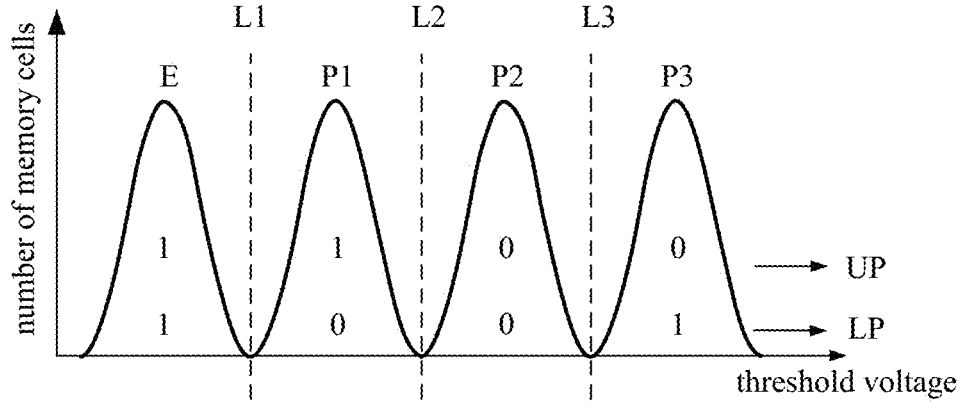
FIG. 8A is a schematic diagram of the threshold voltage distribution corresponding to a memory cell including 2 memory bits provided by an example of the present disclosure.

In one example, when the storage bits of the memory cell includes two bits, the corresponding storage states include the 0-th state to the 4-th state, referring to FIG. 8A, the 4 states are the 0-th (also referred to as erase state) state E, the 1st state (also referred to as the 1st storage state) P1, the 2nd state (also referred to as the 2nd storage state) P2 and the 3rd state (also referred to as the 3rd storage state) P3 respectively, and the binary data corresponding to the 4 states are 11, 10, 00, 01 respectively. Accordingly, the memory device includes two pages which are a Lower Page (LP) and an Upper Page (UP) respectively.

Taking the memory cell shown in FIG. 8A as an example, the memory cell with 2 bits reads storage data with two bits and four states through read voltages in 3 levels (the first-level read voltage L1, the second-level read voltage L2, and the third-level read voltage L3 in shown in FIG. 8A).

In one example, one of the pages corresponds to read voltages at multiple levels, and another page corresponds to a one-level read voltage, as shown in FIG. 8A, the binary data corresponding to the lower page is 1001 respectively, and the reading of the lower page requires the corresponding first-level read voltage L1 and third-level read voltage L3. The binary data corresponding to the upper page is 1100 respectively, and the reading of the upper page requires the corresponding second-level read voltage L2.

Figure 8B:
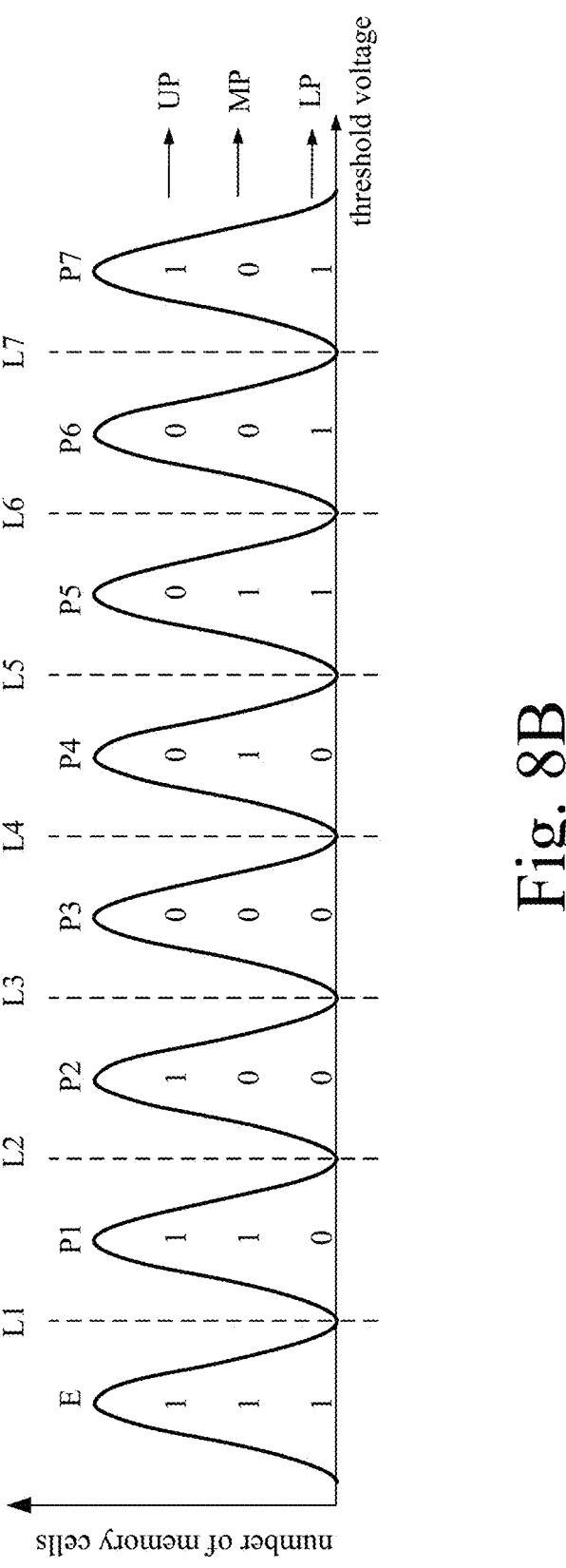
FIG. 8B is a schematic diagram of the threshold voltage distribution corresponding to a memory cell including 3 memory bits provided by an example of the present disclosure.

In one example, when the storage bits of the memory cell include three bits, the corresponding storage states include the 0-th state to the 7-th state, referring to FIG. 8B, the 8 states are the 0-th (also referred to as erase state) state E, the 1st state (also referred to as the 1st storage state) P1, the 2nd state (also referred to as the 2nd storage state) P2 . . . the 7th state (also referred to as the 7-th storage state) P7 respectively, and the binary data corresponding to the 8 states are 111, 110, 100, 000, 010, 011, 001, 101, respectively. Accordingly, the memory device includes three pages which are a Lower Page (LP), a Middle Page (MP), and an Upper Page (UP).

Taking the memory cell shown in FIG. 8B as an example, the memory cell with three bits reads its storage data with three bits and eight states through read voltages at 7 levels (the first-level read voltage L1, the second-level read voltage L2, and the third-level read voltage L3, the fourth-level read voltage L4, the fifth-level read voltage L5, the sixth-level read voltage L6 and the seventh-level read voltage L7 as shown in FIG. 8B).

In one example, each page corresponds to read voltages at multi levels, as shown in FIG. 8B, the binary data corresponding to the lower page is 10000111 respectively, and the reading of the lower page requires the corresponding first-level read voltage L1 and fifth-level read voltage L5. The binary data corresponding to the middle page is 11001100 respectively, and the reading of the middle page requires the corresponding second-level read voltage L2, fourth-level read voltage L4 and sixth-level read voltage L6. The binary data corresponding to the upper page is 11100001 respectively, and the reading of the upper page requires the corresponding third-level read voltage L3 and seventh-level read voltage L7.

Figure 8C:
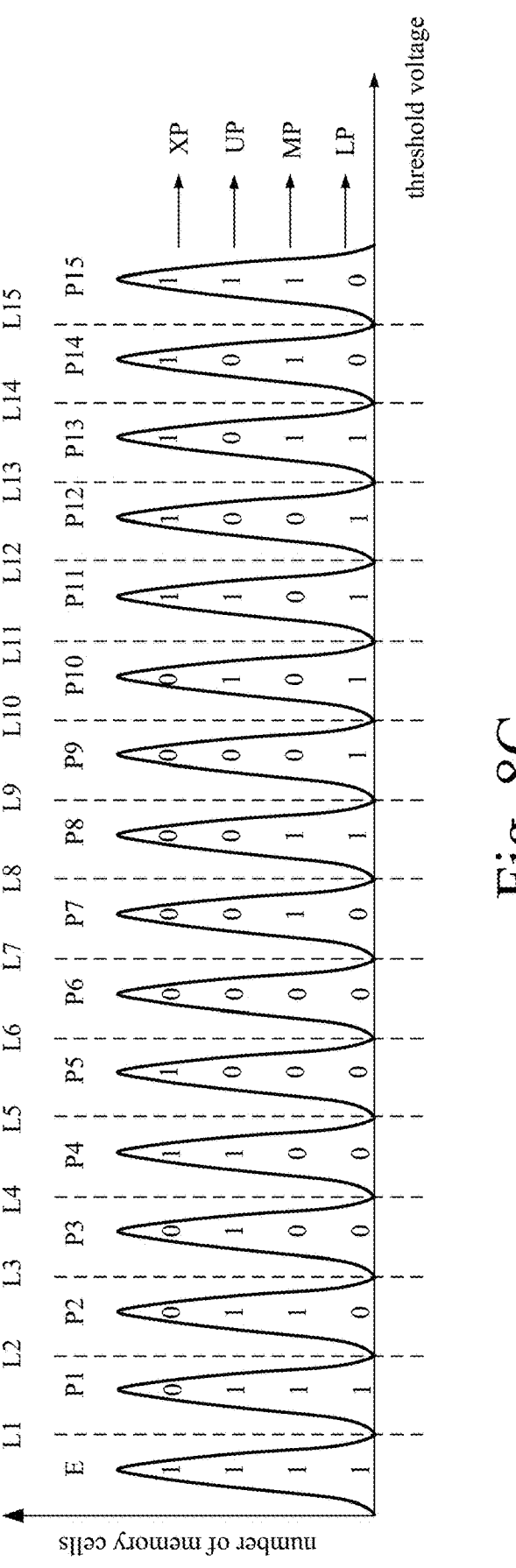
FIG. 8C is a schematic diagram of the threshold voltage distribution corresponding to a memory cell including 4 memory bits provided by an example of the present disclosure.

In one example, when the storage bits of the memory cell include four bits, the corresponding storage states include the 0-th state to the 15-th state, referring to FIG. 8C, the 16 states are the 0-th (also referred to as erase state) state E, the 1st state (also referred to as the 1st storage state) P1, the 2nd state (also referred to as the 2nd storage state) P2 . . . the 15-th state (also referred to as the 15-th storage state) P15, and the binary data corresponding to the 16 states are 1111, 0111, 0110 . . . 1110 respectively. Accordingly, the memory device includes four pages which are lower page, middle page, upper page, and extra page (XP). Here, the four storage bits corresponding to the 16 states are stored in the lower page, middle page, upper page, and extra page respectively.

Taking the memory cell shown in FIG. 8C as an example, the memory cell with four bits reads storage data with four bits and sixteen states through read voltages at 15 levels (the first-level read voltage L1, the second-level read voltage L2, and the third-level read voltage L3, the fourth-level read voltage L4, the fifth-level read voltage L5, the sixth-level read voltage L6, the seventh-level read voltage L7, the eighth-level read voltage L8, the ninth-level read voltage L9, the tenth-level read voltage L10, the eleventh-level read voltage L11, the twelfth-level read voltage L12, the thirteenth-level read voltage L13, the fourteenth-level read voltage L14, the fifteenth-level read voltage L15 as shown in FIG. 8C).

In one example, each page corresponds to read voltages at multiple levels, as shown in FIG. 8C, the binary data corresponding to the lower page is 1100000011111100 respectively, and the reading of the lower page requires the corresponding second-level read voltage L2, eighth-level read voltage L8, and fourteenth-level read voltage L14. The binary data corresponding to the middle page is 1110000110000111 respectively, and the reading of the middle page requires the corresponding third-level read voltage L3, seventh-level read voltage L7, ninth-level read voltage L9 and thirteenth-level read voltage L13. The binary data corresponding to the upper page is 1111100000110001 respectively, and the reading of the upper page requires the corresponding fifth-level read voltage L5, tenth-level read voltage L10, twelfth-level read voltage L12, and fifteenth-level read voltage L15. The binary data corresponding to the extra page is 1000110000011111 respectively, and the reading of the extra page requires the corresponding first-level read voltage L1, fourth-level read voltage L4, sixth-level read voltage L6 and eleventh-level read voltage L11.

The lower page is usually closest to the source/drain; thus, the read voltages at each of the levels corresponding to the lower page is preferred to be determined, with the fastest access speed and the shortest response time, and balanced performance and durability during data access are ensured.

It should be noted that the method of preferring to determine the read voltages at each of the levels corresponding to the lower page is only an example and is not used to limit the order of determining the read voltages at each of the multiple levels corresponding to at least part of the pages in the example of the present disclosure.

In some examples, at least part of the pages corresponds to read voltages in multiple stages, read voltages in multiple stages includes a read voltage in a first stage and a read voltage in a second stage, where a read voltage in the second stage is lower than a read voltage in the first stage. For example, the read voltage in the first stage may be understood as the highest read voltage among the read voltages in multiple stages for each page, and the read voltage in the second stage may be understood as other read voltages lower than the highest read voltage among the read voltages in multiple stages for each page.

It should be noted that the first stage and the second stage are to distinguish the high-level read voltage from the low-level read voltage in the read voltages in the multiple stages corresponding to at least part of the pages, and the low-level read voltage is lower than the high-level read voltage. For a memory cell containing multiple storage bits, a page corresponding to one storage bit may include one or more stages, and one stage may include one or more levels.

In one example, referring to FIG. 8A, the memory device includes a lower page and an upper page, where the lower page corresponds to multiple stages, and the multiple stages for the lower page include a first level and a third level, the first-level read voltage L1 is lower than the third-level read voltage L3. Here, the third-level read voltage L3 corresponds to the read voltage in the first stage for the lower page (the high-level read voltage for the lower page), and the first-level read voltage L1 corresponds to the read voltage in the second stage for the lower page (the low-level read voltage for the lower page).

In one example, referring to FIG. 8B, the memory device includes a lower page, a middle page and an upper page, where each page corresponds to multiple stages, the multiple stages for the lower page include a first level and a fifth level, and the first-level read voltage L1 is lower than the fifth-level read voltage L5; the multiple stages for the middle page include a second level, a fourth level and a sixth level, and the second-level read voltage L2 and the fourth-level read voltage L4 are both lower than the sixth-level read voltage L6; the multiple stages for the upper page include a third level and a seventh level, and the third-level read voltage L3 is lower than the seventh-level read voltage L7. Here, the fifth-level read voltage L5, the sixth-level read voltage L6, and the seventh-level read voltage L7 correspond to the read voltages in the first stages for the lower page, the middle page, and the upper page, respectively; and the first-level read voltage L1, the second-level read voltage L2, the fourth-level read voltage L4, and the third-level read voltage L3 correspond to the read voltages in the second stages for the lower page, the middle page, and the upper page, respectively.

In one example, referring to FIG. 8C, the memory device includes a lower page, a middle page, an upper page and an extra page, where each page corresponds to multiple stages, the multiple stages for the lower page include a second level, an eighth level and a fourteenth level, the second-level read voltage L2 and the eighth-level read voltage L8 are both lower than the fourteenth-level read voltage L14; the multiple stages for the middle page include a third level, a seventh level, a ninth level and a thirteenth level, the third-level read voltage L3, the seventh-level read voltage L7 and the ninth-level read voltage L9 are all lower than the thirteenth level read voltage L13; the multiple stages for the upper page include a fifth level, a tenth level, a twelfth level and a fifteenth level, the fifth-level read voltage L5, the tenth-level read voltage L10 and the twelfth-level read voltage L12 are lower than the fifteenth-level read voltage L15; the multiple stages for the extra page include a first level, a fourth level, a sixth level and a eleventh level, the first-level read voltage L1, the fourth-level read voltage L4, and the sixth-level read voltage L6 are lower than the eleventh-level read voltage L11. Here, the fourteenth-level read voltage L14, the thirteenth-level read voltage L13, the fifteenth-level read voltage L15 and the eleventh-level read voltage L11 correspond to the read voltages in the first stages for the lower page, the middle page, the upper page and the extra page, respectively; and the second-level read voltage L2 and the eighth-level read voltage L8 correspond to the read voltages in the second stage for the lower page; the third-level read voltage L3, the seventh-level read voltage L7, and the ninth-level read voltage L9, correspond to the read voltages in the second stage in the middle page; the fifth-level read voltage L5, the tenth-level read voltage L10, and the twelfth-level read voltage L12 correspond to the read voltages in the second stage for the upper page; the first-level read voltage L1, the fourth-level read voltage L4, and the sixth-level read voltage L6 correspond to the read voltages in the second stage for the extra page.

It should be noted that the difference between the first read voltage and the second read voltage may be lower than the preset voltage. In some examples, the second read voltage is greater than the first read voltage, and the range of the difference between the first read voltage and the second read voltage is set to 5 mV to 20 mV, e.g., may be 5 mV, 10 mV, 15 mV, and 20 mV. In some other examples, the second read voltage is lower than the first read voltage, and the range of the difference between the first read voltage and the second read voltage is set to −5 mV to −20 mV, e.g., may be −5 mV, −10 mV, −15 mV, and −20 mV.

It should be noted that the first read voltage and the second read voltage here are related in sequence, that is to say, the second read voltage is obtained in accordance with the first read voltage after a third adjustment. Based on this, the voltage difference between the first read voltage and the second read voltage is the step size for the third adjustment. The difference between the first read voltage and the second read voltage being lower than the preset voltage may be understood that the voltage difference between the first read voltage and the second read voltage is relatively small. The preset voltage is related to the step size for the third adjustment, and may be a voltage slightly greater than the step size for the third adjustment. In some examples, the range of the preset voltage is set to 6 mV to 21 mV, e.g., the preset voltage may be 6 mV, 11 mV, 16 mV, and 21 mV. In some examples, the range of the preset voltage is set to −6 mV to −21 mV, e.g., the preset voltage may be −6 mV, −11 mV, −16 mV, and −21 mV.

It should be noted that the first read voltage and the second read voltage are both general concepts, and the target read voltage and all read voltages obtained after making a first adjustment and a second adjustment to the target read voltage may be referred to as a first read voltage, and all read voltages obtained after the third adjustment to the first read voltage may be referred to as a second read voltage. That is to say, the first read voltage is a general concept, which may be understood as the target read voltage or the adjusted target read voltage (the voltage obtained after making a first adjustment or a second adjustment to the target read voltage with the target step size; where, the range of the target step size may be set to 20 mV to 40 mV, e.g., the step size for the second adjustment may be 20 mV, 30 mV, 40 mV; the range of the target step size may also be set to 50 mV to 150 mV, e.g., the first adjustment step size may be 50 mV, 60 mV, 70 mV, 80 mV, 100 mV, 120 mV or 150 mV).

In examples of the present disclosure, a corresponding first result at a voltage may be understood as: a third adjustment is made to a voltage, e.g., a first voltage difference $\Delta V1$ between the voltage and the voltage after the third adjustment exists, the number of bits in a preset number of memory cells which are flipped in two read results at the voltage and the voltage after the third adjustment may be taken as the corresponding first result at the voltage, where the preset number of memory cells may form at least one code word.

In one example, a corresponding first result at a first read voltage may be understood as: a third adjustment is made to the first read voltage, e.g., a first voltage difference $\Delta V1$ between the first read voltage and a second read voltage exists, the number of bits in a preset number of memory cells which are flipped in two read results at the first read voltage and the second read voltage may be taken as the corresponding first result at the first read voltage. The first read voltage may be the target read voltage in the first stage (V0 shown in FIG. 9D), and the second read voltage may be the read voltage obtained after making the third adjustment to the first read voltage (V1 shown in FIG. 9D); or the first read voltage may be the adjusted target read voltage in the first stage (V2 shown in FIG. 9D), and the second read voltage may be the read voltage obtained after making the third adjustment to the adjusted target read voltage (V3 shown in FIG. 9D).

In various examples of the present disclosure, the obtaining of the target valley voltage may be understood as follows: determine a voltage to be the target valley voltage in accordance with the corresponding first result at a voltage meeting a preset condition. For example, in accordance with the corresponding first result at the read voltage in the first stage being lower than or equal to a second preset value, the read voltage in the first stage is determined to be the target valley voltage in the first stage; the range of the second preset value is set to 5 to 30, in one example, the second preset value may be 5, 10, 15, 20, 25, 30.

In various examples of the present disclosure, obtaining the predicted valley voltage may be understood as follows: obtaining the predicted valley voltage in accordance with a voltage and a first mapping function. For example, the predicted valley voltage in the second stage is obtained in accordance with the predicted valley voltage in the first stage/the target valley voltage in the first stage and a first mapping function, where the first mapping function represents the relationship between the predicted valley voltage in the first stage/the target valley voltage in the first stage and the predicted valley voltage in the second stage. The obtaining of the predicted valley voltage may also be understood as follows: obtaining the predicted valley voltage in accordance with the corresponding first result at a voltage, the stage in which a voltage is, and the second mapping function. For example, the predicted valley voltage in the first stage is obtained in accordance with the corresponding first result at the target read voltage in the first stage, the stage number at which the first stage is, and the second mapping function; the second mapping function represents the relationship between the corresponding first result at the target read voltage, the stage number at which each stage is, and the predicted valley voltage.

In various examples of the present disclosure, the obtaining of a voltage after an adjustment (e.g. read voltage after an adjustment/target read voltage after an adjustment) may be understood as: the voltage obtained after making adjustments to a voltage according to the target step size. For example, multiple first adjustments are made to the target read voltage with a first step size, and the target read voltages after the multiple first adjustments are obtained, respectively; or multiple second adjustments are made to the target read voltage with a second step size, and the target read voltages after the multiple second adjustments are obtained, respectively; a range of the first step size value is set to 50 mV to 150 mV, the first step size value may be 50 mV, 60 mV, 70 mV, 80 mV, 100 mV, 120 mV or 150 mV, the range of the second step size value is set to 20 mV to 40 mV, and the second step size value may be 20 mV, 30 mV and 40 mV.

In some examples, before obtaining the first result corresponding to the at least one code word at the target read voltage in the first stage, the read mode of the memory device is set to a single level read (SLR) mode; the single level read mode including reading at least one bit of the storage data stored in the memory cell through one-level read voltage. In some examples, the memory device is configured to: enter a single level read mode in response to a mode set command, and, in the single level read mode, obtain a first result corresponding to at least one code word at a target read voltage in the first stage.

In some examples, the peripheral circuit is configured to: obtain the predicted valley voltage in the first stage in accordance with the corresponding first result at the target read voltage in the first stage; obtain the predicted valley voltage in the second stage in accordance with the predicted valley voltage in the first stage; perform a first read operation on at least one code word with the predicted valley voltage in the first stage and the predicted valley voltage in the second stage.

It should be noted that the predicted valley voltage here may be directly taken as the target valley voltage to perform a read operation on the data to be read according to the requirements, or to obtain the target valley voltage after further processing. The method of obtaining the predicted valley voltage will be further described later.

Here and below, taking the array of memory cells including a memory cell with 3 storage bits as an example for detailed description, but this is not used to limit the examples of the present disclosure. In one example, as shown in FIGS. 9A, 9B, 9C, 9D, 9E and 9F, the number of storage bits of the memory cell of at least one code word is 3, corresponding to the lower page, the middle page, and the upper page respectively; each page corresponds to multiple stages, the multiple stages for the lower page include a first level and a fifth level, and the first-level read voltage L1 is lower than the fifth-level read voltage L5; the multiple stages for the middle page include a second level, a fourth level and a sixth level, and the second-level read voltage L2 and the fourth-level read voltage L4 are both lower than the sixth-level read voltage L6; the multiple stages for the upper page include a third level and a seventh level, and the third-level read voltage L3 is lower than the seventh-level read voltage L7. Here, the fifth-level read voltage L5, the sixth-level read voltage L6, and the seventh-level read voltage L7 correspond to read voltages in the first stage for the lower page, the middle page, and the upper page, respectively; and the first-level read voltage L1 corresponds to the read voltage in the second stage for the lower page, the second-level read voltage L2 and the fourth-level read voltage L4 correspond to the read voltages in the second stage for the middle page, and the third-level read voltage L3 corresponds to the read voltage in the second stage for the upper page.

Figure 9A:
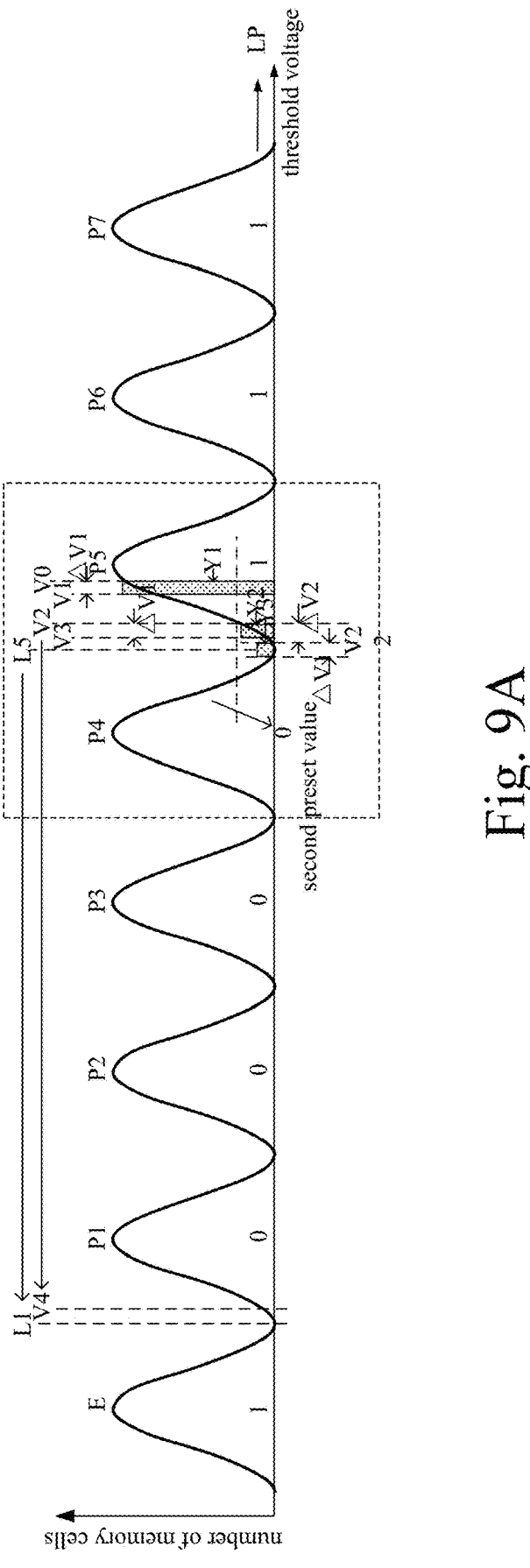
FIG. 9A is a schematic diagram of a method for confirming the predicted valley voltage/target valley voltage in the first stage and the second stage corresponding to the lower page shown in FIG. 8B provided by an example of the present disclosure.
Figure 9B:
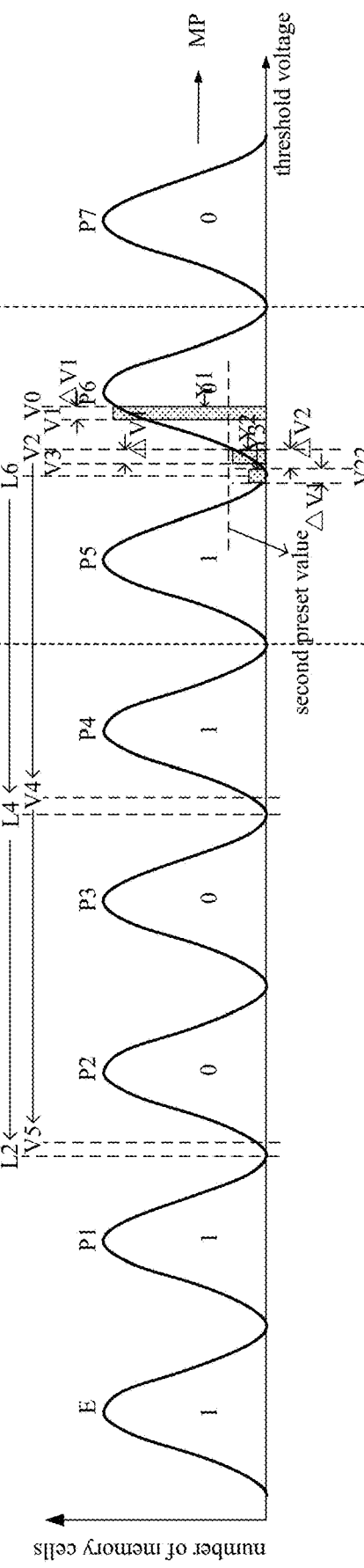
FIG. 9B is a schematic diagram of a method for confirming the predicted valley voltage/target valley voltage in the first stage and the second stage corresponding to the middle page shown in FIG. 8B provided by an example of the present disclosure.
Figure 9C:
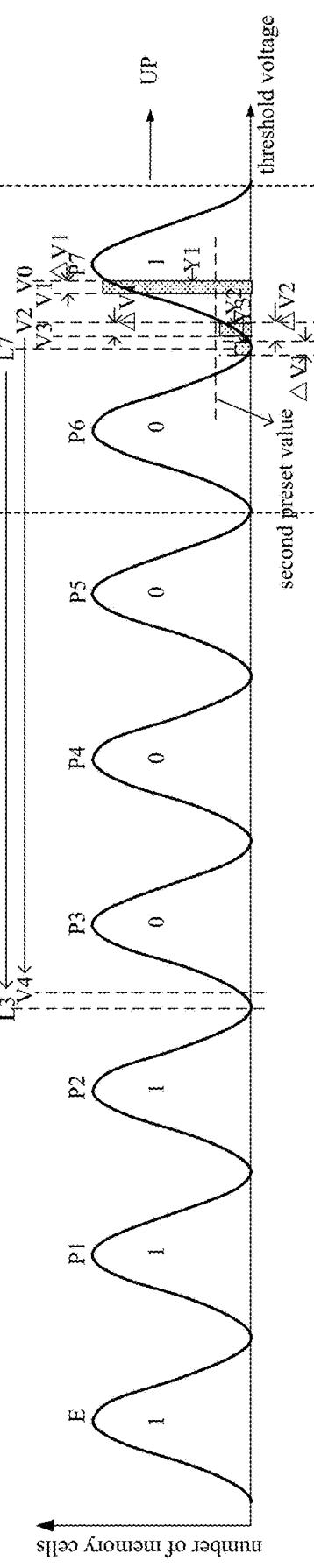
FIG. 9C is a schematic diagram of a method for confirming the predicted valley voltage/target valley voltage in the first stage and the second stage corresponding to the upper page shown in FIG. 8B provided by an example of the present disclosure.
Figure 9D:
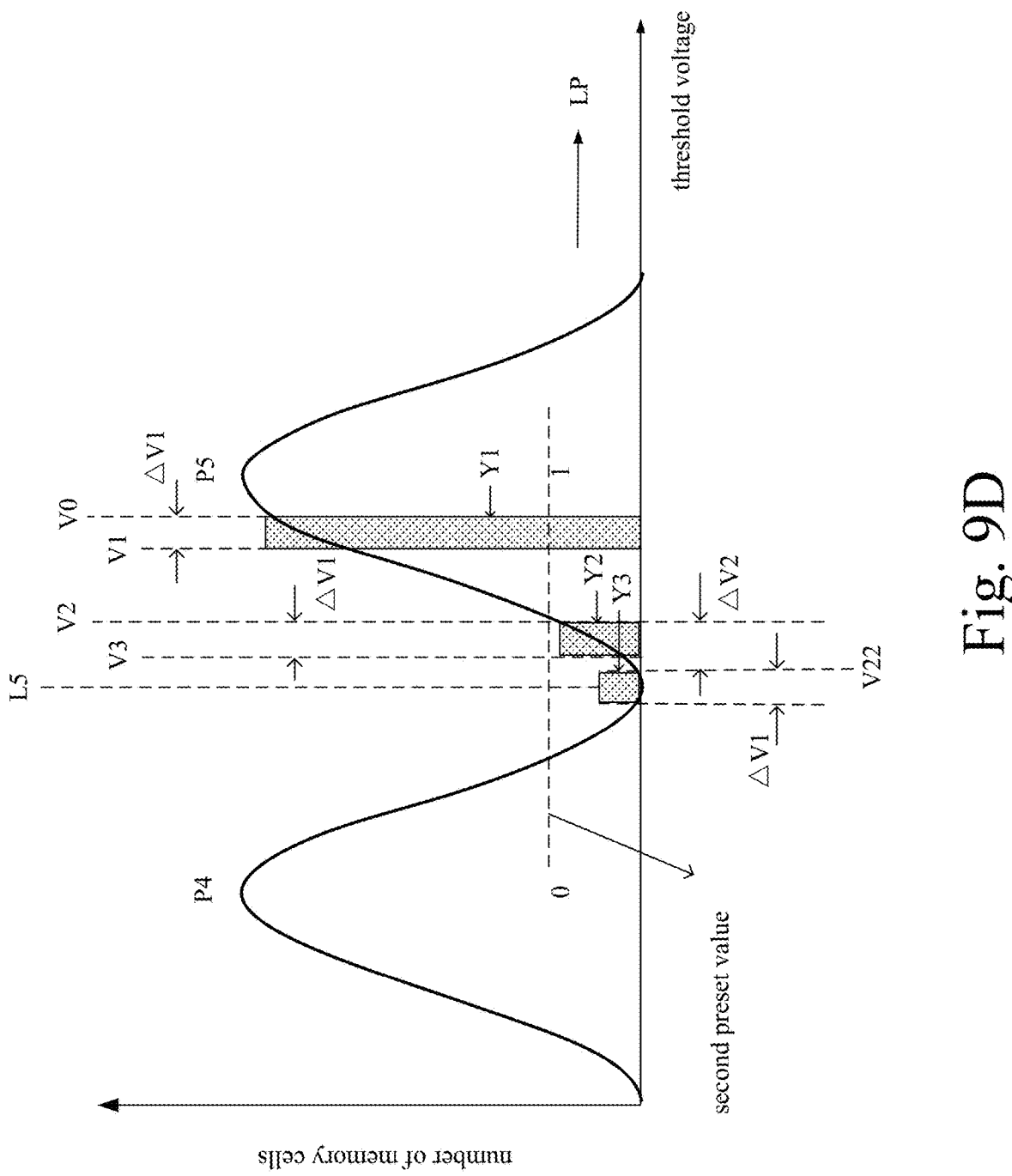
FIG. 9D is an enlarged schematic diagram of the rectangular dotted frame area of FIG. 9A.

In one example, as shown in FIGS. 9A and 9D, the peripheral circuit is configured to: obtain the predicted valley voltage at the fifth level (V2 shown in FIGS. 9A and 9D) in accordance with the corresponding first result Y1 at the target read voltage at the fifth level (V0 shown in FIGS. 9A and 9D); obtain the predicted valley voltage in the first stage (V4 shown in FIG. 9A) in accordance with the predicted valley voltage at the fifth level; and perform a first read operation on the lower page of at least one code word with the predicted valley voltage at the fifth level and the predicted valley voltage in the first stage.

Figure 9E:
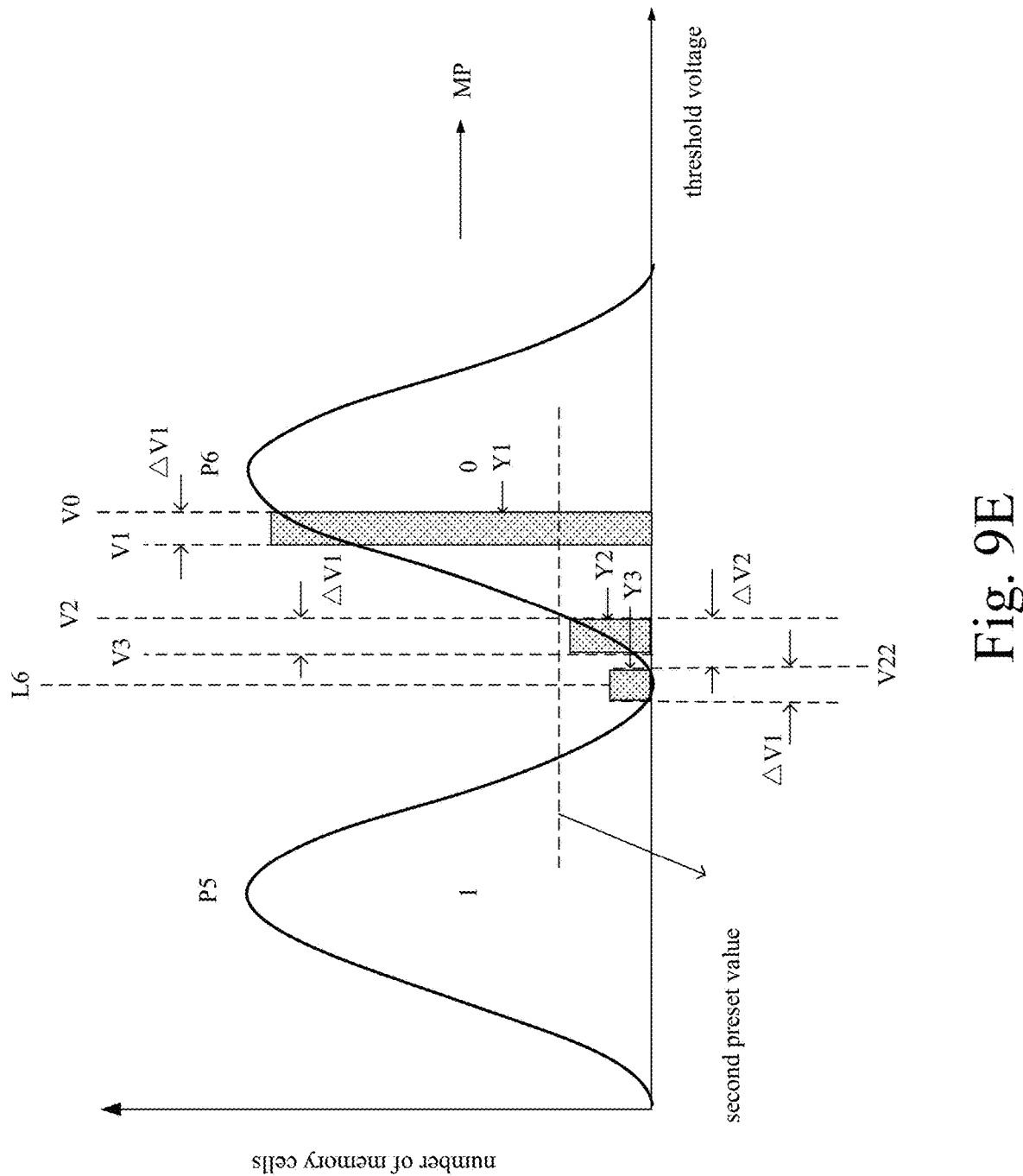
FIG. 9E is an enlarged schematic diagram of the rectangular dotted frame area of FIG. 9B.

In one example, as shown in FIGS. 9B and 9E, the peripheral circuit is configured to: obtain the predicted valley voltage at the sixth level (V2 shown in FIGS. 9B and 9E) in accordance with the corresponding first result Y1 at the target read voltage at the sixth level (V0 shown in FIGS. 9B and 9E); obtain the predicted valley voltage at the fourth level (V4 shown in FIG. 9B) and predicted valley voltage at the second level (V5 shown in FIG. 9B) in accordance with the predicted valley voltage at the sixth level; and perform a first read operation on the middle page of at least one code word with the predicted valley voltage at the sixth level and the predicted valley voltage at the second level and the predicted valley voltage at the fourth level.

Figure 9F:
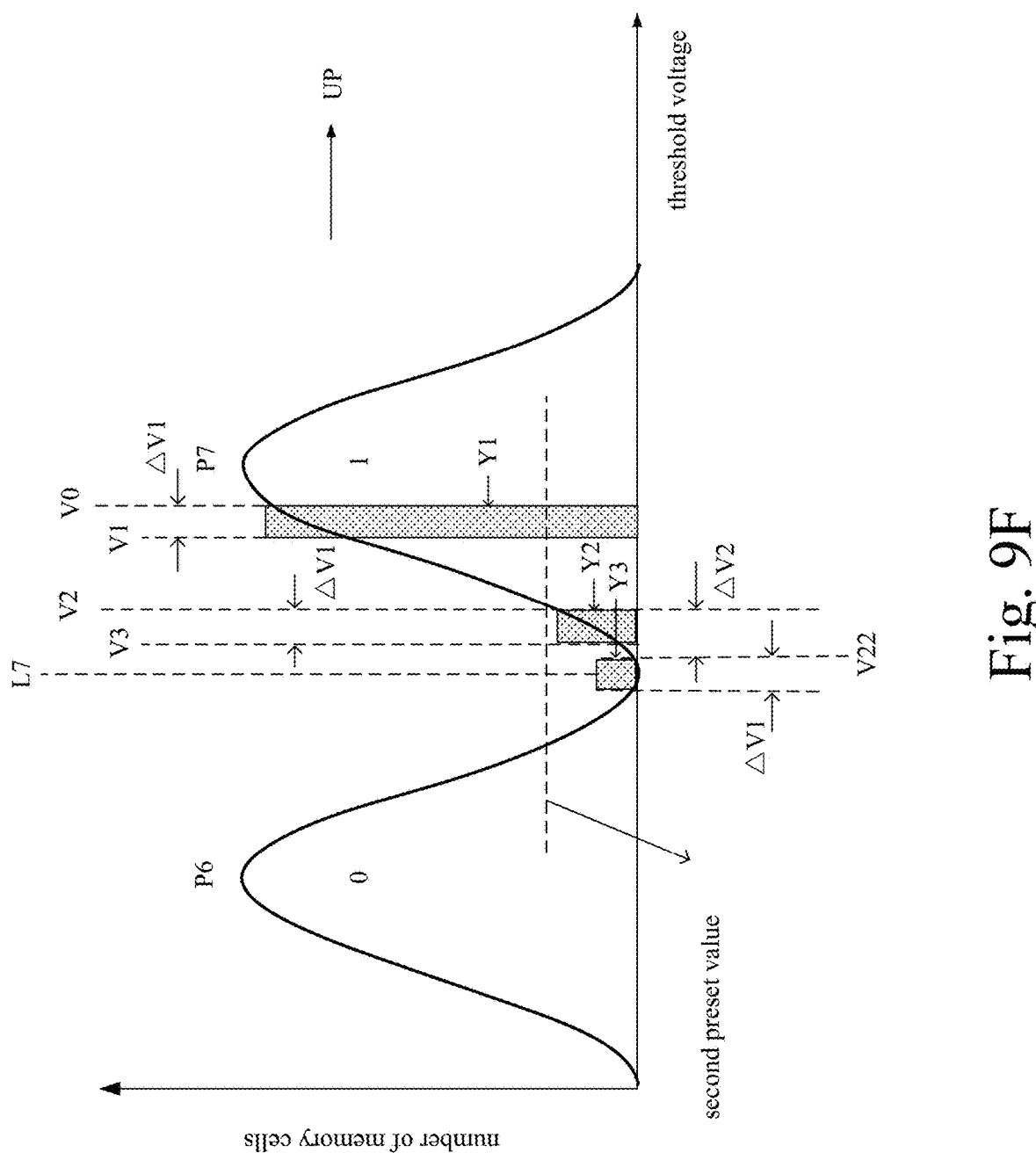
FIG. 9F is an enlarged schematic diagram of the rectangular dotted frame area of FIG. 9C.

As shown in FIGS. 9C and 9F, the peripheral circuit is configured to: obtain the predicted valley voltage at the seventh level (V2 shown in FIGS. 9C and 9F) in accordance with the corresponding first result Y1 at the target read voltage at the seventh level (V0 shown in FIGS. 9C and 9F); obtain the predicted valley voltage at the third level (V4 shown in FIG. 9C) in accordance with the predicted valley voltage at the seventh level; and perform a first read operation on the upper page of at least one code word with the predicted valley voltage at the seventh level and the predicted valley voltage at the third level.

In other examples, the peripheral circuit is further configured to: obtain the predicted valley voltage at the sixth level for the middle page (V2 shown in FIGS. 9B and 9E) and/or the predicted valley voltage at the fifth level for the upper page (V2 shown in FIGS. 9A and 9D) in accordance with the predicted valley voltage at the seventh level (V2 shown in FIGS. 9A and 9D).

In some examples, the peripheral circuit is further configured to: obtain the predicted valley voltage at the sixth level for the middle page (V2 shown in FIGS. 9B and 9E) and the predicted valley voltage at the fifth level for the upper page (V2 shown in FIGS. 9A and 9D) in accordance with the predicted valley voltage at the seventh level (V2 shown in FIGS. 9A and 9D), obtain the read voltages in the first stages for the lower page, middle page, and upper page, obtain the read voltages of the second stages for the lower page, middle page, and upper page respectively in accordance with the read voltages in the first stages for the lower page, middle page, and upper page; the obtained read voltage in the first stage and the read voltage in the second stage may be respectively to perform a first read operation on the lower page, middle page, and upper page of at least one code word.

In some examples, the peripheral circuit is configured to: take both the predicted valley voltage in the first stage and the predicted valley voltage in the second stage as the initial target read voltages; obtain a corresponding first result at the initial target read voltage; determine the initial target read voltage to be the target valley voltage in accordance with the corresponding first result at the initial target read voltage meeting a preset condition; and perform a second read operation on at least one code word in accordance with the target valley voltage.

In some examples, the preset condition may be that the corresponding first result at the initial target read voltage is lower than or equal to a second preset value; and the second preset value is taken as the determination threshold for the target valley voltage, that is, when the first result is lower than or equal to the second preset value, it indicates that the error rate of the read result is low and the reliability of the read result is high when the read voltage corresponding to the first result is the target valley voltage. Here, the magnitude of the second preset value is related to the type of memory device, storage density, etc. The second preset value may be an empirical value, or it may be default values configured when the memory device leaves the factory, the default value is obtained through extensive simulation experiments before the memory device leaves the factory. In one example, the range of the second preset value is set to 5 to 30, and in one example, the second preset value may be 5, 10, 15, 20, 25, 30.

In one example, as shown in FIGS. 9A and 9D, peripheral circuit is configured to: take the predicted valley voltage at the fifth level (V2 shown in FIGS. 9A and 9D) as the initial target read voltage at the fifth level; obtain the corresponding first result Y2 at the initial target read voltage at the fifth level; determine initial target read voltage at the fifth level to be the fifth-level read voltage L5 in accordance with the corresponding first result Y2 at the initial target read voltage at the fifth level being lower than or equal to a second preset value. The first-level read voltage L1 is determined in a similar way as determining the fifth-level read voltage L5.

In one example, as shown in FIGS. 9B and 9E, peripheral circuit is configured to: take the predicted valley voltage at the sixth level (V2 shown in FIGS. 9B and 9E) as the initial target read voltage at the sixth level; obtain the corresponding first result Y2 at the initial target read voltage at the sixth level; determine initial target read voltage at the sixth level to be the sixth-level read voltage L6 in accordance with the corresponding first result Y2 at the initial target read voltage at the sixth level being lower than or equal to a second preset value. The fourth-level read voltage L4 and the second-level read voltage L2 are determined in a similar way as determining the sixth-level read voltage L6.

In one example, as shown in FIGS. 9C and 9F, peripheral circuit is configured to: take the predicted valley voltage at the seventh level (V2 shown in FIGS. 9C and 9F) as the initial target read voltage at the seventh level; obtain the corresponding first result Y2 at the initial target read voltage at the seventh level; determine initial target read voltage at the seventh level to be the seventh-level read voltage L7 in accordance with the corresponding first result Y2 at the initial target read voltage at the seventh level being lower than or equal to a second preset value. The third-level read voltage L3 is determined in a similar way as determining the seventh-level read voltage L7.

A second read operation is performed on the lower page of at least one code word in accordance with the determined fifth-level read voltage L5 and the determined first-level read voltage L1; a second read operation is performed on the middle page of at least one code word in accordance with the determined sixth-level read voltage L6, the determined fourth-level read voltage L4 and the determined second-level read voltage L2; a second read operation is performed on the upper page of at least one code word in accordance with the determined seventh-level read voltage L7 and the determined third-level read voltage L3.

In some examples, the peripheral circuit is configured to: take both the predicted valley voltage in the first stage and the predicted valley voltage in the second stage as the initial target read voltages; make at least one adjustment to the initial target read voltage, and obtain a corresponding first result at the adjusted target read voltage after each adjustment; determine the adjusted target read voltage to be the target valley voltage in accordance with the corresponding first result at the adjusted target read voltage meeting a preset condition; performing a second read operation on at least one code word in accordance with the target valley voltage.

In some examples, at least one adjustment may be a first adjustment; the first adjustment may be understood as an adjustment with a relatively large amplitude, and the amplitude of the first adjustment is greater than the amplitude of a second adjustment. In some examples, the range of the step size for the first adjustment is set to 50 mV to 150 mV, e.g., the step size for the first adjustment may be 50 mV, 60 mV, 70 mV, 80 mV, 100 mV, 120 mV or 150 mV. In one example, as shown in 9A and FIG. 10, a first adjustment is made to the predicted valley voltage V2 at the fifth level to obtain the adjusted target read voltage V22 at the fifth level, a second voltage difference ΔV2 between the predicted valley voltage V2 at the fifth level and the adjusted target read voltage V22 at the fifth level exists, and the size of the second voltage difference ΔV2 is the step size for the first adjustment. The step size for the first adjustment is greater than the step size for the third adjustment, e.g., the second voltage difference ΔV2 is greater than the first voltage difference ΔV1.

In one example, as shown in FIGS. 9A and 9D, peripheral circuit is configured to: take the predicted valley voltage at the fifth level (V2 shown in FIG. 9D) as the initial target read voltage at the fifth level; make at least one adjustment to the predicted valley voltage at the fifth level, and obtain the corresponding first result Y3 at the adjusted target read voltage (V22 shown in FIG. 9D) after each adjustment; determine the initial target read voltage at the fifth level to be the fifth-level read voltage L5 in accordance with the corresponding first result at the adjusted target read voltage being lower than or equal to a second preset value. The first-level read voltage L1 is determined in a similar way as determining the fifth-level read voltage L5. As shown in FIGS. 9B and 9E, FIGS. 9C and 9F, the sixth-level read voltage L6, the fourth-level read voltage L4, and the second-level read voltage L2 are determined, and the seventh-level read voltage L7, the third-level read voltage L3 are determined by using a method similar to determining the fifth-level read voltage L5.

A second read operation is performed on the lower page of at least one code word in accordance with the determined fifth-level read voltage L5 and the determined first-level read voltage L1; a second read operation is performed on the middle page of at least one code word in accordance with the determined sixth-level read voltage L6 and the determined fourth-level read voltage L4, the second-level read voltage L2; a second read operation is performed on the upper page of at least one code word in accordance with the determined seventh-level read voltage L7 and the determined third-level read voltage L3.

In some examples, the peripheral circuit is configured to: take the predicted valley voltage in the first stage as the initial target read voltage, obtain a corresponding first result at the initial target read voltage; determine the initial read voltage to be the target valley voltage in accordance with the corresponding first result at the initial read voltage meeting a preset condition; and performing a second read operation on at least one code word in accordance with the determined target valley voltage in the first stage and the predicted valley voltage in the second stage.

In one example, as shown in FIGS. 9A and 9D, peripheral circuit is configured to: take the predicted valley voltage at the fifth level (V2 shown in FIGS. 9A and 9D) as the initial target read voltage at the fifth level, obtain the corresponding first result Y2 at the initial target read voltage at the fifth level; determine initial target read voltage at the fifth level to be the fifth-level read voltage L5 in accordance with the corresponding first result Y2 at the initial target read voltage at the fifth level being lower than or equal to a second preset value. As shown in FIGS. 9B and 9E, FIGS. 9C and 9F, the sixth-level read voltage L6 and the seventh-level read voltage L7 are determined by using a method similar to determining the fifth-level read voltage L5.

A second read operation is performed on the lower page of at least one code word in accordance with determining the fifth-level read voltage L5 and the predicted valley voltage at the first level (V4 shown in FIG. 9A); a second read operation is performed on the middle page of at least one code word in accordance with determining the sixth-level read voltage L6, the predicted valley voltage at the fourth level (V4 shown in FIG. 9A) and the predicted valley voltage at the second level (V5 shown in FIG. 9B); a second read operation is performed on the upper page of at least one code word in accordance with determining the seventh-level read voltage L7 and the predicted valley voltage at the third level (V4 shown in FIG. 9C).

In some examples, the peripheral circuit is configured to: take the predicted valley voltage in the first stage as the initial target read voltage, make at least one adjustment to the initial target read voltage, and obtain a corresponding first result at the adjusted target read voltage after each adjustment; determine the target valley voltage in accordance with the corresponding first result at the adjusted target read voltage meeting the preset condition; obtaining the predicted valley voltage in the second stage in accordance with the determined target valley voltage in the first stage; and performing a second read operation on at least one code word in accordance with the determined target valley voltage in the first stage and the predicted valley voltage in the second stage.

In one example, as shown in FIGS. 9A and 9D, peripheral circuit is configured to: take the predicted valley voltage at the fifth level (V2 shown in FIGS. 9A and 9D) as the initial target read voltage at the fifth level; make at least one adjustment to the predicted valley voltage at the fifth level, and obtain the corresponding first result Y3 at the adjusted target read voltage (V22 shown in FIGS. 9A and 9D) after each adjustment; determine the initial target read voltage at the fifth level to be the fifth-level read voltage L5 in accordance with the corresponding first result at the adjusted target read voltage being lower than or equal to a second preset value. As shown in FIGS. 9B and 9E, FIGS. 9C and 9F, the sixth-level read voltage L6 and the seventh-level read voltage L7 are determined by using a method similar to determining the fifth-level read voltage L5.

A second read operation is performed on the lower page of at least one code word in accordance with determining the fifth-level read voltage L5 and the predicted valley voltage at the first level (V4 shown in FIG. 9A), a second read operation is performed on the middle page of at least one code word in accordance with determining the sixth-level read voltage L6, the predicted valley voltage at the fourth level (V4 shown in FIG. 9A) and the predicted valley voltage at the second level (V5 shown in FIG. 9B); a second read operation is performed on the upper page of at least one code word in accordance with determining the seventh-level read voltage L7 and the predicted valley voltage at the third level (V4 shown in FIG. 9C).

In some examples, each of the multiple pages includes multiple second stages; and the peripheral circuit is configured to: obtain the predicted valley voltage in the second stage corresponding to the highest read voltage among read voltages in the multiple second stages for each of the pages in accordance with the predicted valley voltage in the first stage/the target valley voltage in the first stage for each of the pages; and obtain the predicted valley voltage in the second stage corresponding to a lower read voltage than a read voltage in an adjacent second stage, in accordance with the predicted valley voltage in the second stage corresponding to a higher read voltage among read voltages in the multiple second stages for each of the pages in sequence, until the predicted valley voltage in each of the second stages for each of the pages is obtained.

In one example, as shown in FIG. 9B, a middle page contains a first stage (e.g., a sixth level) and multiple second stages (e.g., a fourth level and a second level); the peripheral circuit is configured to: obtain the predicted valley voltage at the fourth level for the middle page in accordance with the predicted valley voltage at the sixth level for the middle page/determined target valley voltage at the sixth level; obtain the predicted valley voltage at the second level for the middle page in accordance with the predicted valley voltage at the fourth level for the middle page. As shown in FIG. 9A, the predicted valley voltage at the first level for the lower page is obtained in accordance with the predicted valley voltage at the fifth level for the lower page/determined target valley voltage at the fifth level. As shown in FIG. 9C, the predicted valley voltage at the third level for the upper page is obtained in accordance with the predicted valley voltage at the seventh level for the upper page/determined target valley voltage at the seventh level.

In some implementations, in the scenario of a QLC type memory cell, the number of storage bits of the memory cell includes four bits, the corresponding storage states include the 0th state to the 15th state, and the four storage bits corresponding to the 16 states are stored in a lower page, a middle page, an upper page, and an extra page respectively; a lower page contains one first stage (e.g., a fourteenth level) and multiple second stages (e.g., an eighth level and a second level); a middle page contains one first stage (e.g., a thirteenth level) and multiple second stages (e.g., the ninth level, the seventh level, and the third level); an upper page contains one first stage (e.g., a fifteenth level) and multiple second stages (e.g., a twelfth level, a tenth level and a fifth level); an extra page contains one first stage (e.g., an eleventh level) and multiple second stages (e.g., a sixth level, a fourth level and a first level).

In some implementations, the peripheral circuit is configured to: obtain the predicted valley voltage at the eighth level for the lower page in accordance with the predicted valley voltage at the fourteenth level for the lower page/determined target valley voltage at the fourteenth level, obtain the predicted valley voltage at the second level for the lower page in accordance with the predicted valley voltage at the eighth level for the lower page; obtain the predicted valley voltage at the ninth level for the middle page in accordance with the predicted valley voltage at the thirteenth level for the middle page/determined target valley voltage at the thirteenth level, obtain the predicted valley voltage at the seventh level for the middle page in accordance with the predicted valley voltage at the ninth level for the middle page, obtain the predicted valley voltage at the third level for the middle page in accordance with the predicted valley voltage at the seventh level for the middle page; obtain the predicted valley voltage at the twelfth level for the upper page in accordance with the predicted valley voltage at the fifteenth level for the upper page/determined target valley voltage at the fifteenth level, obtain the predicted valley voltage at the tenth level for the upper page in accordance with the predicted valley voltage at the twelfth level for the upper page, obtain the predicted valley voltage at the fifth level for the upper page in accordance with the predicted valley voltage at the tenth level for the upper page; obtain the predicted valley voltage at the sixth level for the extra page in accordance with the predicted valley voltage at the eleventh level for the extra page/determined target valley voltage at the eleventh level, obtain the predicted valley voltage at the fourth level for the extra page in accordance with the predicted valley voltage at the sixth level for the extra page, obtain the predicted valley voltage at the first level for the extra page in accordance with the predicted valley voltage at the fourth level for the extra page. In this way, the 15 voltages required to read the QLC type memory cell are obtained, e.g., the 15 voltages are the 15 predicted valley voltages, or a part of the 15 voltages is the target valley voltage, and the other part is the predicted valley voltage obtained in accordance with the target valley voltage.

In some examples, the peripheral circuit is configured to: obtain the predicted valley voltage in the second stage in accordance with the predicted valley voltage in the first stage/the target valley voltage in the first stage and a first mapping function, where the first mapping function represents the relationship between the predicted valley voltage in the first stage/the target valley voltage in the first stage and the predicted valley voltage in the second stage.

In some examples, the predicted valley voltage in the second stage may refer to the predicted read voltage after predicting in accordance with the predicted valley voltage in the first stage/target voltage in the first stage and usage scenario of the memory device (e.g., data retention scenario or read disturb scenario). The predicted valley voltage in the second stage is obtained by querying the preset mapping table in accordance with the predicted valley voltage in the first stage/the target valley voltage in the first stage, the preset mapping table stores the empirical value of the predicted valley voltage in the second stage corresponding to the predicted valley voltage in the first stage/the target valley voltage in the first stage, and these empirical values are obtained through a large number of simulation experiments.

In some examples, the first mapping function represents the relationship between the difference of the predicted valley voltage in the first stage/the target valley voltage in the first stage relative to the target read voltage in the first stage, and the predicted valley voltage in the second stage, and the relationship between the usage scenario of memory device and the predicted valley voltage in the second stage.

In one example, in the scenario of data retention scenario, when the difference of the predicted valley voltage in the first stage/the target valley voltage in the first stage relative to the target read voltage in the first stage exceeds a threshold, it may be considered that the threshold voltage VT of the memory cell of the memory device is in a strong left-offset state in accordance with the characteristics of the memory device. According to the difference of the predicted valley voltage in the first stage/the target valley voltage in the first stage and the predicted valley voltage in the first stage/the target valley voltage in the first stage relative to the target read voltage, the predicted valley voltage in the second stage may be obtained based on the predicted valley voltage in the second stage obtained after adjustment by the first mapping function, where the predicted valley voltage in the second stage is in a strong left-offset state relative to the target read voltage in the second stage.

In one example, in the scenario of read operation interference, when the difference of the predicted valley voltage in the first stage/the target valley voltage in the first stage relative to the target read voltage exceeds a threshold, it may be preferentially considered that the threshold voltage VT of the memory cell of the memory device is in a strong right-offset state in accordance with the characteristics of the memory device, in accordance with the difference of the predicted valley voltage in the first stage/the target valley voltage in the first stage and the predicted valley voltage in the first stage/the target valley voltage in the first stage relative to the target read voltage, the predicted valley voltage in the second stage may be obtained based on adjustment by the first mapping function.

In some examples, the peripheral circuit is configured to: in the process of making at least one adjustment to the initial target read voltage, take the initial target read voltage as a baseline value; starting from the baseline value, making adjustments in two opposite directions with a step size being smaller than the first preset step size, in the process of making adjustments in each direction, count one for upward trend in accordance with the corresponding first result at the read voltage after the next adjustment being greater than the corresponding first result at the read voltage after the previous adjustment, and determine the first voltage boundary and the second voltage boundary with total counted number being greater than or equal to the preset number; in the process of making adjustments in two directions, if the corresponding first result at the target read voltage after one adjustment is lower than the first threshold, or taking the minimum first result among multiple first results corresponding to target read voltages after multiple adjustments as a reference value, when the number of first results from remaining first results which differ from the reference value with a difference being less than a second threshold is greater than a preset number, stop the adjustments and take the target read voltage corresponding to the minimum first result among the multiple first results as the target valley voltage.

In some examples, the peripheral circuit is configured to: in the process of making adjustments in two directions, take the corresponding adjusted target read voltages as the first voltage boundary and the second voltage boundary respectively in accordance with the total counted number being equal to the preset number; in the process of making adjustments in two directions, if the first voltage boundary and the second voltage boundary have been determined, take the target read voltage for the last adjustment as an average of the first voltage boundary and the second voltage boundary; take the read voltage corresponding to the minimum first result among the multiple corresponding first results at all the adjusted target read voltages as the target valley voltage.

In some examples, the peripheral circuit is configured to: in the process of performing M first adjustments to the near-valley point voltage with a first step size, starting from the near-valley point voltage, make adjustments in a first direction with the first step size until the corresponding first result at the target read voltage after the adjustment in the first direction is greater than the near-valley threshold; starting from the near-valley point voltage, make adjustments in a second direction opposite to the first direction with the first step size until the corresponding first result at the adjusted target read voltage in the second direction is greater than the near-valley threshold.

Here, the first adjustment is required to be made in two directions. The first direction may be a left direction (or a negative direction), and the second direction may be a right direction (or a positive direction); or the first direction may be a right direction (or a positive direction), and the second direction may be a left direction (or a negative direction). During the process of making the M first adjustments, the sequence of adjustments in the first direction and the second direction may be adjusted according to actual needs.

In other examples, the first adjustment may also be made in one direction. It should be noted that in the case of the application scenario being determined, and the offset direction for threshold voltage being inferred, the first adjustment may be made in only one direction, e.g., in the case of the application scenario being determined as data retention, it may be inferred that the threshold voltage distribution of the memory cell offsets to the left, and the first adjustment may also be adjusted only in the left direction (or referred to as the negative direction).

Figure 10A:
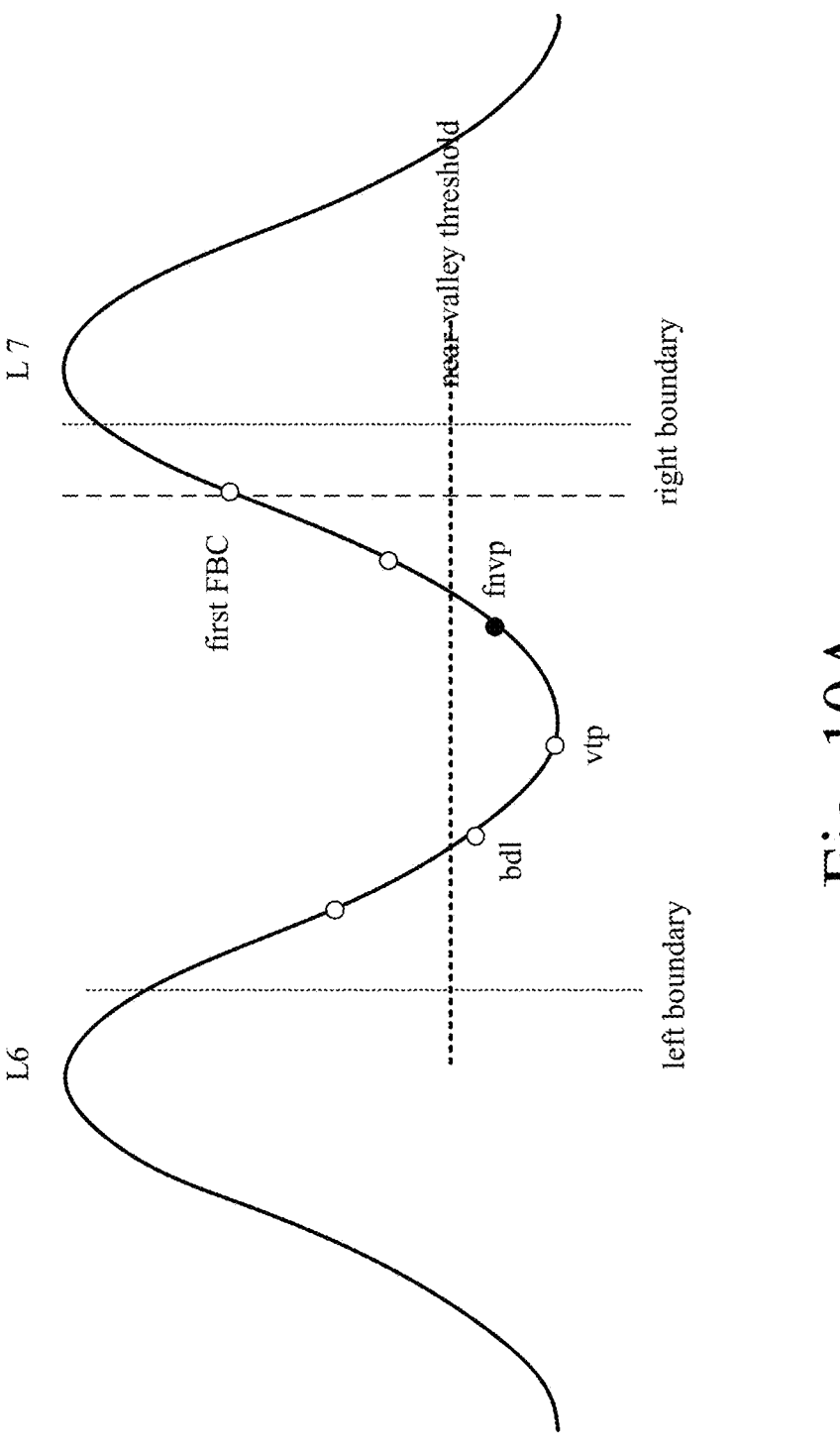
FIG. 10A is a schematic diagram of the distribution of near-valley points and near-valley thresholds provided by an example of the present disclosure.

In one example, as shown in FIG. 10A, the corresponding first result at the initial target read voltage is the first FBC, the near-valley threshold is obtained in accordance with the first FBC and the first mapping function, and the near-valley point fnvp is found in accordance with the first FBC and the second mapping function (one or more iterations). Starting from the near-valley point, adjustments in the left and right directions (or referred to as forward directions) are made with a first step size until the first results corresponding to the read voltages after the adjustments in both directions are greater than the near-valley threshold.

In some examples, the peripheral circuit is configured to: in the process of making N second adjustments to the knee-point voltage with the second step size, starting from the knee-point voltage, making adjustments in two opposite directions with the second step size, in the process of making adjustments in each direction, count one for upward trend when the corresponding first result at the target read voltage after the next adjustment is greater than the corresponding first result at the target read voltage after the previous adjustment, and determine the first boundary voltage and the second boundary voltage in accordance with a total counted number being greater than or equal to the preset number; in the process of making adjustments in two directions, if the corresponding first result at the target read voltage after one adjustment is lower than a preset threshold, or taking the minimum first result among multiple first results corresponding to target read voltages after multiple adjustments as a reference value, when the number of first results from remaining first results which differ from the reference value with a difference being less than a second threshold is greater than a preset number, stop the adjustments and take the adjusted target read voltage corresponding to the minimum first result among the multiple first results as the target valley voltage.

Here, the target read voltage after the previous adjustment and the target read voltage after the next adjustment are both general concepts. The previous and next adjustments are any two adjacent second adjustments, where one is at an earlier adjustment time and the other one is at a later adjustment time.

Here, the preset number represents the degree to which the knee point is lifted, the preset number may be adjusted according to the actual situation, and in some examples, the preset number is 3, 4, 5, 6, or 7, in one example, the preset number of may be 3, 5, or 7.

During a process of making adjustments in each direction, if the corresponding first result at the target read voltage after the next adjustment is greater than the corresponding first result at the target read voltage after the previous adjustment, it indicates that the corresponding first result at the target read voltage after the next adjustment shows the upward trend relative to the corresponding first result at the target read voltage after the last adjustment, and at this point, one for upward trends is counted. If the corresponding first result at the target read voltage after the next adjustment is lower than or equal to the corresponding first result at the target read voltage after the previous adjustment, it indicates that the corresponding first result at the target read voltage after the next adjustment shows the downward or unchanged trend relative to the corresponding first result at the target read voltage after the last adjustment, and at this point, one for upward trends is not counted, that is to say, the counted number for upward trend remains unchanged in this count.

Here, the preset threshold represents the maximum value in the range of predicted effective target valley voltages. The preset threshold may be determined in accordance with the first result at the initial target read voltage. It may be understood that when performing a read operation, the further the threshold voltage for the memory cell offsets from the threshold voltage for writing, the higher the first result of reading with the initial target read voltage will generally be, based on this, the value of the first result at the initial target read voltage may be used to confirm the preset threshold, and the preset threshold represents the change (lifting) in the target valley voltage caused by the offset of the threshold voltage of the memory cell.

It should be noted that although the preset threshold and the aforementioned near-valley threshold are both obtained in accordance with the corresponding first result at the initial target read voltage, a difference between the preset threshold and the aforementioned near-valley threshold exists, and when the first result is lower than the near-valley threshold, it indicates that more refined adjustments or searches may be carried out next; and when the first result is lower than the preset threshold, it indicates that it may be considered to stop the adjustment or search and directly determine the target valley voltage.

In some examples, when the first result is lower than the preset threshold, it indicates that the adjusted target read voltage corresponding to the first result at this time may be taken as the target valley voltage.

In some examples, taking the minimum first result among multiple corresponding first results at the target read voltages after N second adjustments as a reference value, when the number of first results from remaining first results which differ from the reference value with a difference being less than a second threshold is greater than a preset number, the searching is stopped and the adjusted target read corresponding to the minimum first result among the multiple first results is taken as the target valley voltage. Here, the preset difference and the preset quantity may be set together according to the actual situation, generally, if the preset difference is set slightly larger, the preset quantity will be relatively larger; and if the preset difference is set slightly smaller, the preset quantity will also be relatively smaller.

In some examples, the peripheral circuit is configured to: in the process of making N second adjustments to the knee-point voltage with a second step size, starting from the knee-point voltage, make adjustments in a first direction with the second step size until the total counted number for upward trend in the process of adjustments in the first direction is equal to the preset number; starting from the knee-point voltage, make adjustments in a second direction opposite to the first direction with the second step size until the total counted number for upward trend in the process of adjustments in the second direction is equal to the preset number.

Here, the second adjustment is required to be made in two directions, where the first direction may be a left direction (or a negative direction), and the second direction may be a right direction (or a positive direction); or the first direction may be a right direction (or a positive direction), and the second direction may be a left direction (or a negative direction). During the process of making the M first adjustments, the sequence of adjustments in the first direction and the second direction may be adjusted according to actual needs.

Here, when the total counted number for upward trend in the process of adjustments in the first direction/second direction is equal to the preset number, the second adjustment is stopped.

In some examples, the peripheral circuit is configured to: in the process of making an adjustment in a first direction, in accordance with the total counted number for upward trend being equal to the preset number, take the corresponding adjusted target read voltage as a first boundary voltage; in the process of making an adjustment in a second direction, in accordance with the total counted number for upward trend being equal to the preset number, take the corresponding adjusted target read voltage as a second boundary voltage; in the process of making adjustments in two directions, if the first boundary voltage and the second boundary voltage have been determined, obtain the corresponding first result at the read voltage for the last adjustment, take the read voltage for the last adjustment as an average of the first boundary voltage and the second boundary voltage; and take the read voltage corresponding to the minimum first result among the multiple corresponding first results at all the adjusted read voltages as the target valley voltage.

Here, the boundary corresponding to the first boundary voltage may be the left boundary, and the boundary corresponding to the second boundary voltage may be the right boundary; or the boundary corresponding to the first boundary voltage may be the right boundary, and the boundary corresponding to the second boundary voltage may be the left boundary.

Figure 10B:
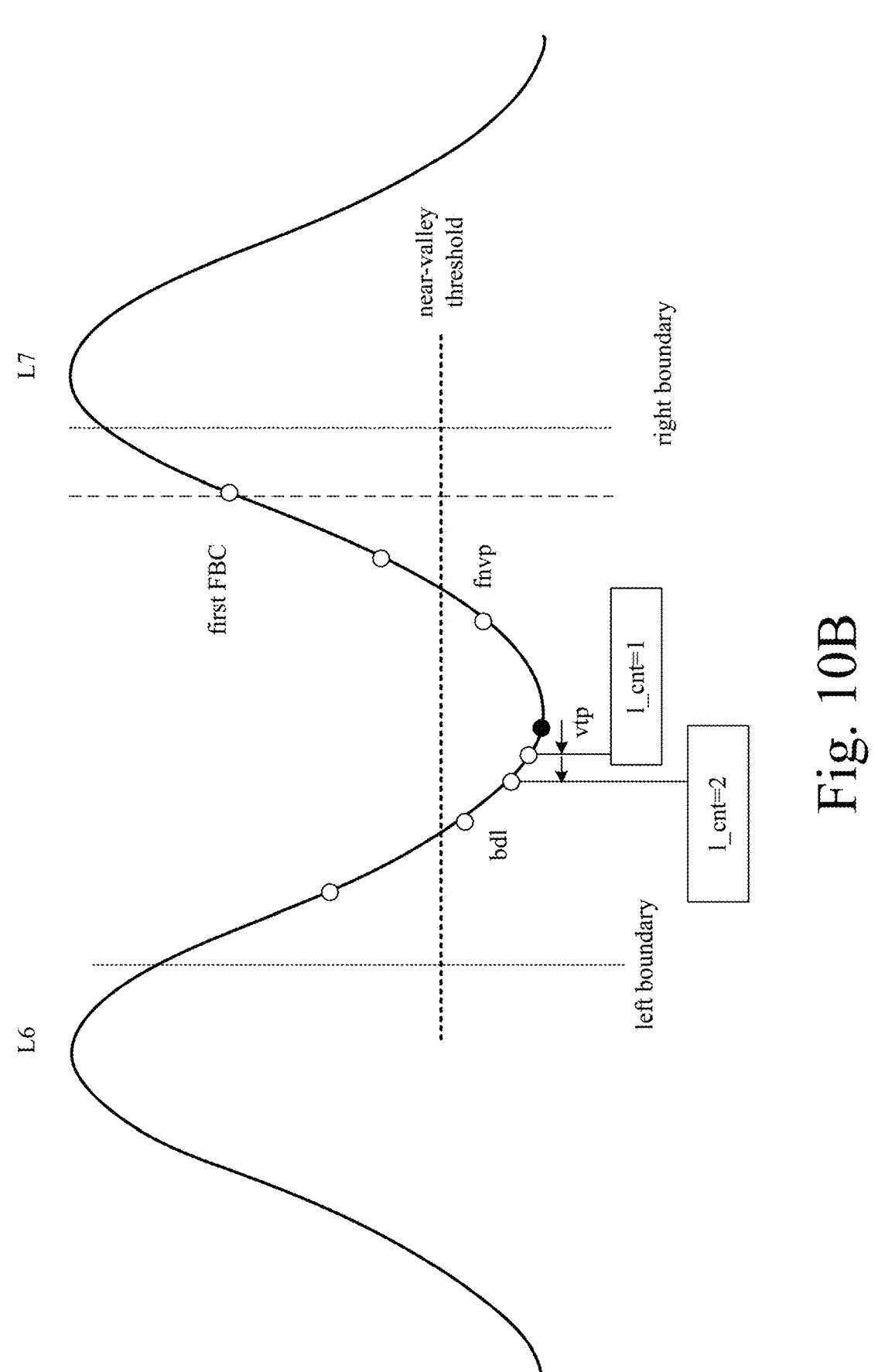
FIG. 10B is a schematic diagram of the statistics showing an upward trend when the second adjustment is made to the left provided by an example of the present disclosure.

For example, as shown in FIG. 10B, after making M first adjustments, the point corresponding to the minimum first result among the M first results corresponding to the M first adjustments is determined as the knee point vtp. Starting from the knee point vtp, adjustments in the left direction are made with a second step size, and when a corresponding first result at the target read voltage after a next adjustment is greater than the corresponding first result at the target read voltage after a previous adjustment, the number for upward trend is counted, in FIG. 10B, both of the two second adjustments in the left show the upward trend, and the total counted number for the upward trend is 2. After that, according to the setting of the preset number, if the preset number has been reached, it may be started to make the second adjustment in the right direction with the second step size; if the preset number has not been reached, it may continue to make the second adjustment in the left direction until the preset number is reached.

Figure 10C:
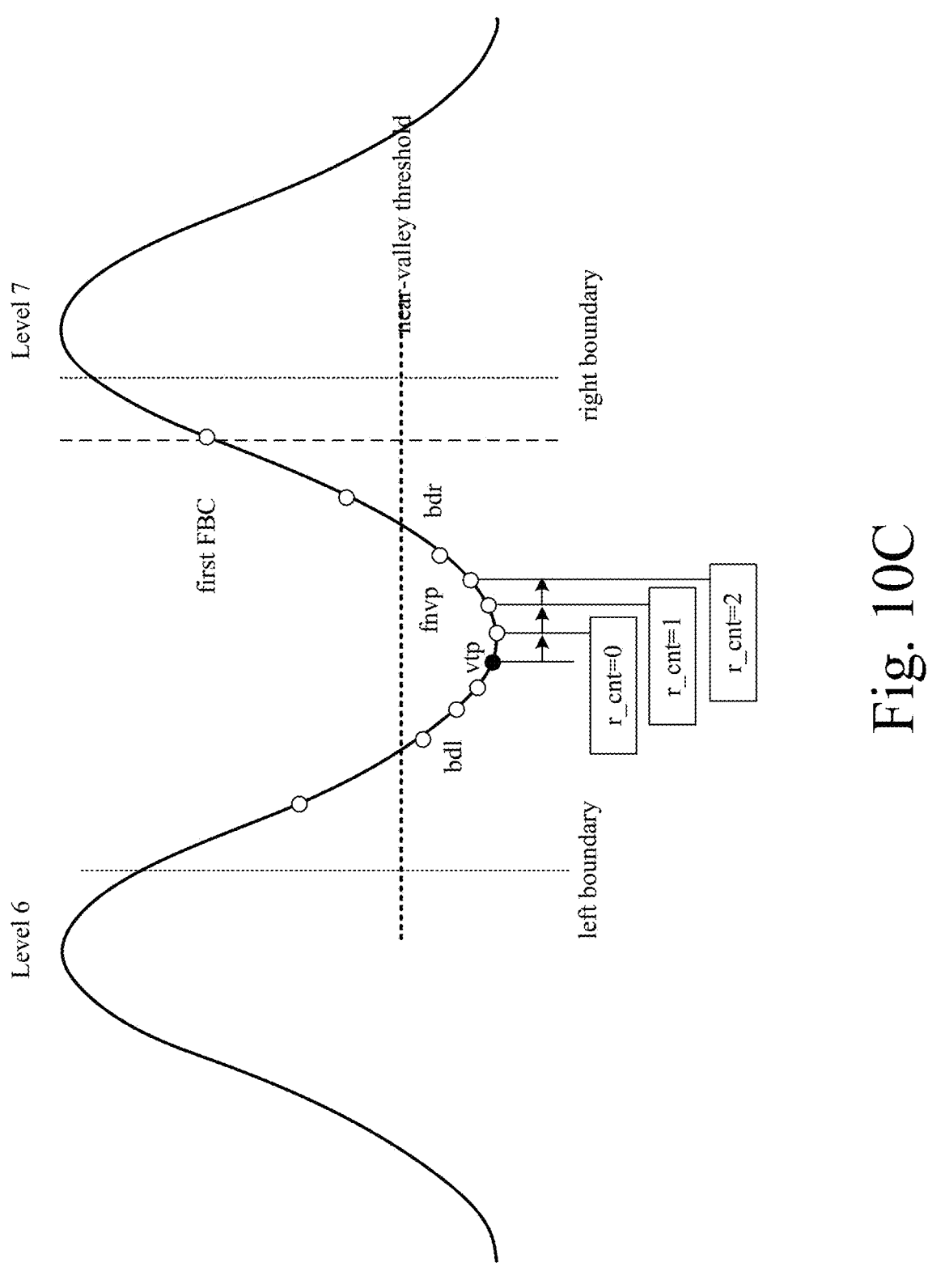
FIG. 10C is a schematic diagram of the statistics showing an upward trend when the second adjustment is made to the right provided by an example of the present disclosure.

In one example, as shown in FIG. 10C, starting from the knee point vtp, adjustments in the right direction are made with a second step size, and when a corresponding first result at the target read voltage after a next adjustment is greater than the corresponding first result at the target read voltage after a previous adjustment, one for upward trend is counted, in FIG. 10C, in making three second adjustments to the right, the first one shows the downward trend, and the total counted number of the upward trend is 0, while the other two adjustments show the upward trend, and the total counted number of the upward trend is 2. After that, according to the setting of the preset number, if the preset number has been reached, the second adjustment may be stopped; if the preset number has not been reached, it may continue to make adjustments to the right, and the second adjustment is stopped when the preset number is reached.

Figure 10D:
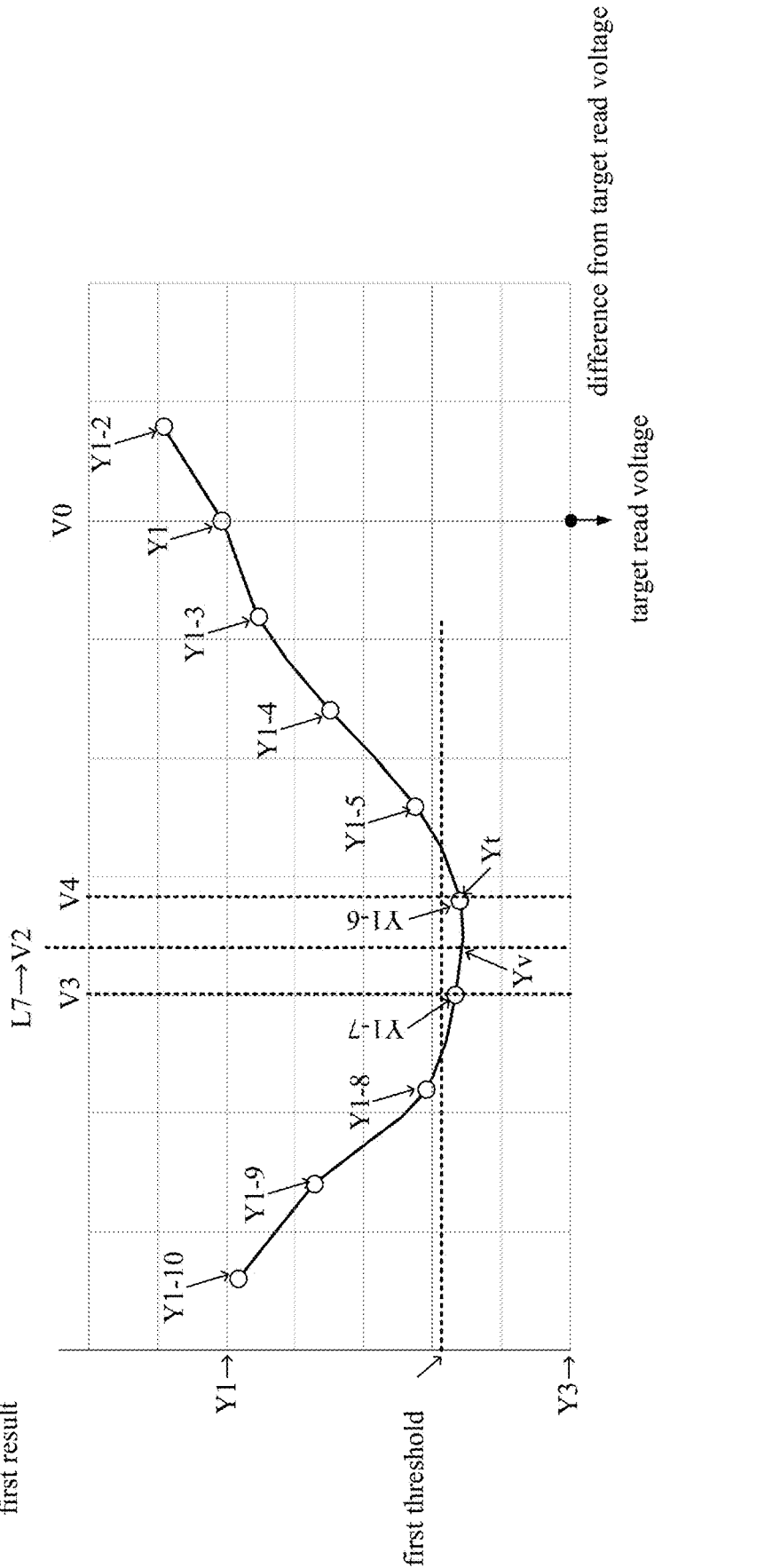
FIG. 10D is a schematic diagram of a method for confirming read voltages at the seventh level corresponding to the upper page shown in FIG. 9C provided by an example of the present disclosure.

FIG. 10D is a schematic diagram of a method for confirming read voltages at the seventh level corresponding to the upper page shown in FIG. 9C provided by an example of the present disclosure. As shown in FIG. 10D, in some examples, the peripheral circuit is configured to: make multiple first adjustments to the target read voltage with a first step size, and obtain the corresponding first results at the target read voltages after the multiple first adjustments respectively; determine the value of knee point in accordance with the first results corresponding to the obtained read voltages after the multiple first adjustments, the target read voltage corresponding to the value of knee point being the knee-point voltage; make multiple second adjustments to the knee-point voltage with a second step size, and obtain the corresponding first results at the target read voltages after the multiple second adjustments respectively; the second step size being lower than the first step size; determine the target valley voltage with the first results corresponding to the obtained target read voltages after the multiple second adjustments.

In some examples, as shown in FIG. 10D, taking the target read voltage at the seventh level being the target read voltage as an example, the peripheral circuit is configured to obtain the knee-point voltage V4 through the following operations:

after obtaining the corresponding first result Y1 at the target read voltage V0, taking the target read voltage V0 as a baseline value, making a first adjustment to the target read voltage with the first step size value (positive value) for the first time to obtain the first result Y1-2, and making a first adjustment to the target read voltage with the first step size value (negative value) for the second time to obtain the first result Y1-3;

in accordance with the first result Y1-2 being greater than the first result Y1 and the first result Y1-3 being lower than the first result Y1-1, it is determined to make multiple adjustments to the target read voltage with the first step size value (negative value) to obtain first results after the multiple adjustments (e.g., the first results Y1-4, Y1-5, Y1-6, Y1-7, or the first results Y1-4 to Y1-9, or the first results Y1-4 to Y1-10);

in accordance with at least one for upward trend, it is determined to stop making the first adjustment to the target read voltage; here, one for upward trend may be understood as, if the first result Y1-(N+1) obtained by making a first adjustment to the target read voltage with the first step size value (negative value) for the N-th time is lower than the first result Y1-(N+2) obtained by making a first adjustment to the target read voltage with the first step size value (negative value) for the (N+1)-th time, one for upward trend is determined; e.g., if the first result Y1-7 is greater than the first result Y1-6, or the first result Y1-8 is greater than the first result Y1-7, or the first result Y1-9 is greater than the first result Y1-8, or the first result Y1-10 is greater than the first result Y1-9, one for upward trend is determined;

taking the minimum value among the first results corresponding to the obtained read voltages after the multiple first adjustments as the value of knee point, and the target read voltage corresponding to the value of knee point being the knee-point voltage; e.g., the minimum value among multiple first results is the first result Y1-6, the first result Y1-6 is taken as the value of knee point Yt, and the target read voltage corresponding to the value of knee point Yt is the knee-point voltage V4.

As shown in FIG. 10D, in some examples, the corresponding first results at the target read voltages after multiple first adjustments include the first adjacent value and the second adjacent value adjacent to the value of knee point, and the peripheral circuit is configured to: in accordance with the difference between the first adjacent value and the value of knee point being lower than the difference between the second adjacent value and the value of knee point, the range of making the multiple second adjustments is limited to between the target read voltage corresponding to the first adjacent value and the knee-point voltage; and take the average of the read voltage corresponding to the first adjacent value and the knee-point voltage, and take the average value as the target valley voltage in accordance with the corresponding first result at the average value being lower than the first threshold; in accordance with the corresponding first result at the average value being greater than or equal to the first threshold, continue to make the second adjustment between the read voltage corresponding to the first adjacent value and the knee-point voltage until the corresponding first result at the adjusted target read voltage is lower than the first threshold.

In some examples, as shown in FIG. 10D, taking the target read voltage at the seventh level being the target read voltage as an example, the peripheral circuit is configured to: after obtaining the values of knee point Yt and the knee-point voltage V4, take the knee-point voltage V4 as a baseline value, make at least one second adjustment with the second step size to obtain the adjusted target read voltage. The detailed process of making at least one second adjustment with the second step size may be understood with reference to the detailed process of making at least one first adjustment with the first step size in the above example, where the first step size is greater than the second step size, which will not be repeated here.

Here, the absolute value of the first step size is greater than the absolute value of the second step size; in one example, in the adjustment in the second direction (or a right direction, or a positive direction), the value range of the first step size is set to 50 mV to 150 mV, the value may be 50 mV, 60 mV, 70 mV, 80 mV, 100 mV, 120 mV or 150 mV; or in the adjustment in the first direction (or a left direction, or a negative direction), the value range of the first step size is set to −50 mV to −80 mV, the value may be −50 mV, −60 mV, −70 mV, −80 mV, −100 mV, −120 mV or −150 mV. In the adjustment in the second direction (or a right direction, or a positive direction), the value range of the second step size is set to 20 mV to 40 mV, the value may be 20 mV, 30 mV, 40 mV; or in the adjustment in the first direction (or a left direction, or a negative direction), the value range of the second step size is set to −20 mV to −50 mV, the value may be −20 mV, −30 mV, −40 mV.

In some examples, as shown in FIG. 10D, taking the target read voltage at the seventh level being the target read voltage as an example, the peripheral circuit is configured to: in accordance with the difference between the first adjacent value (first result Y1-7) and the value of knee point Yt (first result Y1-6) is lower than the difference between the second adjacent value (first result Y1-5) and the value of knee point Yt, limit the range of the multiple second adjustments on between the target read voltage V3 corresponding to the first adjacent value (first result Y1-7) and the knee-point voltage V4; and obtain the average value of the read voltage V3 corresponding to the first adjacent value and the knee-point voltage V4, and in accordance with the first result Yv corresponding to the average value being lower than the first threshold, take the average value as the target valley voltage V2 and determine the target valley voltage V2 as the read voltage L7 at the seventh level.

In some examples, peripheral circuit is configured to: obtain the predicted valley voltage in the first stage in accordance with the corresponding first result at the target read voltage in the first stage, the stage number at which the first stage is, and the second mapping function; the second mapping function represents the relationship between the corresponding first result at the target read voltage, the stage number at which each stage is, and the predicted valley voltage.

In some examples, the predicted valley voltage in the first stage may refer to the predicted read voltage after predicting in accordance with the corresponding first result at the target read voltage in the first stage and usage scenario of the memory device. The predicted valley voltage in the first stage is obtained by querying the preset mapping table in accordance with the first result (here refers to the corresponding first result at the target read voltage in the first stage), the preset mapping table stores the empirical value of the predicted valley voltage in the first stage corresponding to the first result, and these empirical values are obtained through a large number of simulation experiments.

In some examples, the second mapping function represents the relationship between the difference of the corresponding first result at the target read voltage in the first stage relative to the first result threshold configured when the memory device leaves the factory, and the predicted valley voltage in the first stage, the stage number at which the predicted valley voltage in the first stage is, and the relationship between and the usage scenario of memory device and the predicted valley voltage in the first stage.

In one example, in the scenario of data retention, when the corresponding first result at the target read voltage in the first stage exceeds the threshold (such as 400), it may be considered that the threshold voltage VT of the memory cell of the memory device is in a strong left-offset state in accordance with the characteristics of the memory device, in accordance with the corresponding first result at the target read voltage in the first stage, the predicted valley voltage in the first stage may be obtained based on an adjustment by the second mapping function. The predicted valley voltage in the first stage is in a strong left-offset state relative to the target read voltage in the first stage.

In one example, in the scenario of read operation interference, when the corresponding first result at the target read voltage in the first stage exceeds the threshold (such as 300), it may be considered that the threshold voltage VT of the memory cell of the memory device is in a strong left-offset state in a strong left-offset state in accordance with the characteristics of the memory device, in accordance with the corresponding first result at the target read voltage in the first stage, the predicted valley voltage in the first stage may be obtained based on an adjustment by the second mapping function. The predicted valley voltage in the first stage is in a strong left-offset state relative to the target read voltage in the first stage.

In some examples, the peripheral circuit is configured to: read the storage data of at least one code word at the first read voltage to obtain a second result; read the storage data of at least one code word at the second read voltage to obtain a third result; perform a logical operation on the second result and the third result to obtain a fourth result; and count the number of bits in the fourth result which represent flip of bits in the third result relative to the second result to obtain a first result.

In one example, as shown in FIG. 9D, the data stored in the lower page of the memory cell in at least one code word is read at the first read voltage (V0 shown in FIG. 9D), the memory cell whose threshold voltage is lower than the first read voltage is marked as bit 1, and the memory cell whose threshold voltage is greater than the first read voltage is marked as bit 0; a second result is obtained.

In one example, as shown in FIG. 9D, the data stored in the lower page of the memory cell in at least one code word is read at the second read voltage (V1 shown in FIG. 9D), the memory cell whose threshold voltage is lower than the second read voltage is marked as bit 1, and the memory cell whose threshold voltage is greater than the second read voltage is marked as bit 0; a third result is obtained.

In one example, XOR is performed on the second result and the third result to obtain the fourth result. It should be noted that the XOR operation is one of the basic logical operations, in binary, if two binary numbers at the same position are the same, the result is "0"; and if two binary numbers at the same position are different, the result is "1" (e.g., same is 0, and different is 1).

In one example, a bit of 1 in the fourth result indicates that the data of a memory cell in at least one code word read at the first read voltage is different from that of reading at the second read voltage, a bit of 0 in the fourth result indicates that the data of a memory cell in at least one code word read at the first read voltage is the same as that of reading at the second read voltage, in other words, the number of bits 1 in the fourth result represents the number of bits in the at least one code word which are flipped in the two read results at the first read voltage and the second read voltage, the number of bits 0 in the fourth result represents the number of bits in the at least one code which are the same in two read results at the first read voltage and the second read voltage. Since the single level read mode is employed, e.g., both of the two read operations described above are to read one bit of data stored in the lower page of the memory cell of at least one code word, the number of bit 1 in the fourth result represents the number of memory cells in the at least one code word that are flipped in the two read results at the first read voltage and the second read voltage, the number is denoted as the corresponding first result at the first read voltage. For example, the first result Y1 corresponds to at least one code word at the target read voltage in the first stage (V0 shown in FIG. 9D), the first result Y2 corresponds to the at least one code word at the adjusted target read voltage in the first stage (V2 shown in FIG. 9D), the first result Y3 corresponds to the at least one code word at the adjusted target read voltage in the first stage (V22 shown in FIG. 9D).

In some examples, the peripheral circuit includes: a first latch, a second latch, and a third latch; the first latch is configured to store a second result; the second latch is configured to store a third result; and the third latch is configured to store a fourth result.

In one example, the storage data of at least one code word which is read at a first read voltage (e.g., a second result) is stored in a first latch, the storage data of at least one code word which is read at a second read voltage (e.g., a third result) is stored in a second latch, the data (e.g., the fourth result) obtained by performing an XOR operation on the second result and the third result is stored in a third latch.

In a first aspect, in the memory devices provided by examples of the present disclosure, by transmitting a first result (size of the first result may be several bytes) instead of at least one code word (e.g. size of the code word may be 4 KB), the amount of data transferred is reduced; the process of obtaining the first result is converged inside the memory device and does not occupy space of, e.g., a memory controller; thus, it is less dependent on, e.g., a memory controller; the process of obtaining the predicted valley voltage/target valley voltage in accordance with the first result is completed in the memory device; the transmission time of the output port is reduced; therefore suitable for MLC, TLC or QLC type memory devices.

Figure 11:
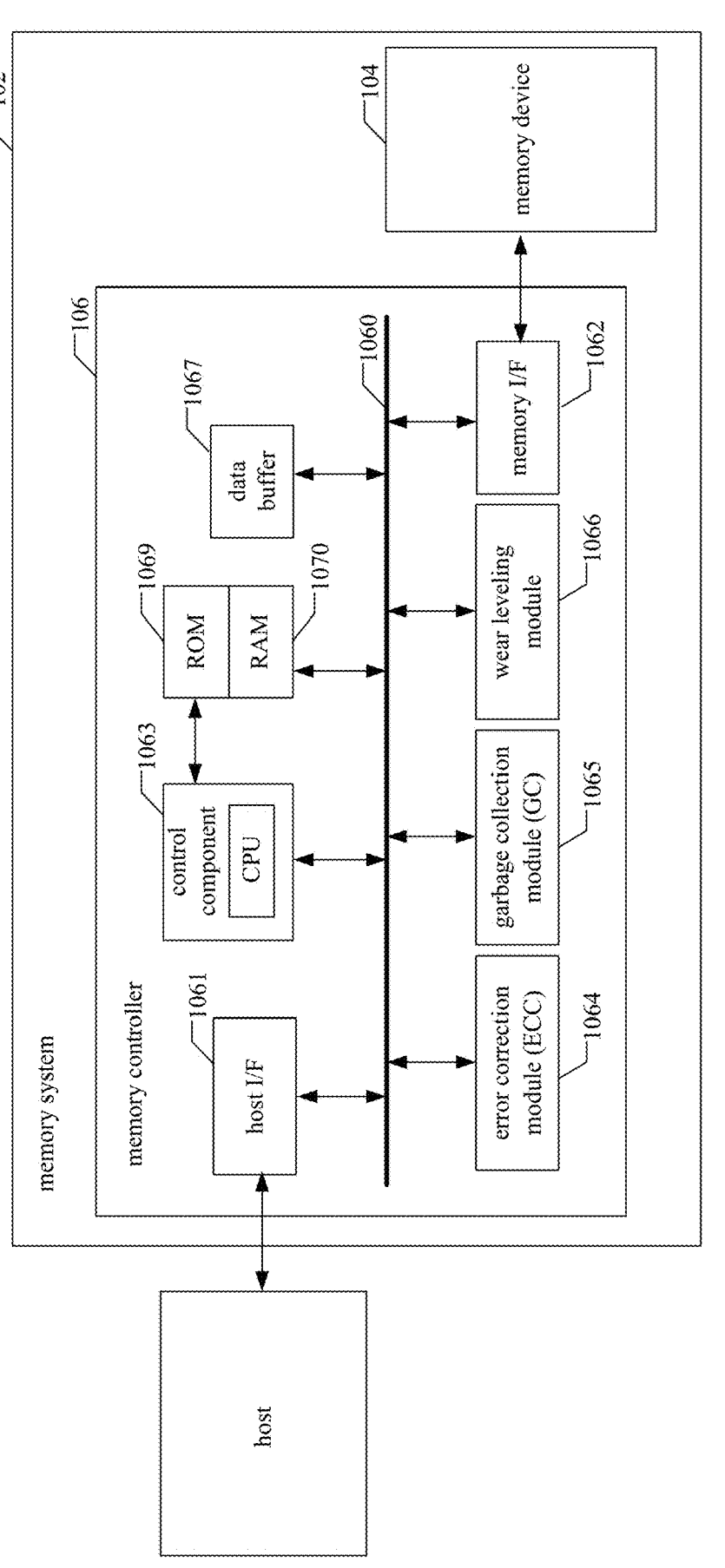
FIG. 11 is a schematic structural diagram of an example structure with a memory system provided by an example of the present disclosure.
Figure 12:
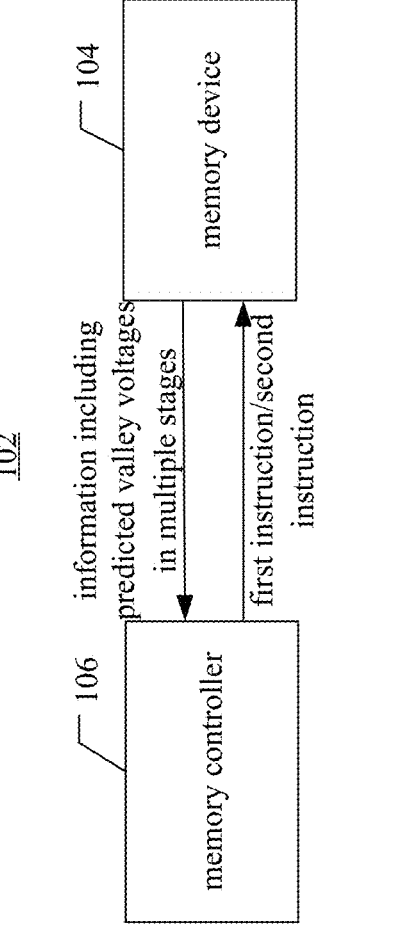
FIG. 12 is a block diagram of a memory system provided by an example of the present disclosure.

In a second aspect, an example of the present disclosure provides a memory system, as shown in FIGS. 11 and 12, the memory system 102 includes: one or more memory devices 104 of the first aspect; and a memory controller 106 coupled to and controlling the memory device 104.

As shown in FIG. 11, in some examples, the memory system 102 is coupled to the host, and responds to instructions from the host to perform various feedbacks. The memory system 102 may include: a memory controller 106 and a memory device 104, the memory controller 106 is to control the memory device 104 to perform operations such as read, write, and erase, and the memory controller 106 and the memory device 104 may also be coupled in any suitable manner.

The memory controller 106 may include a host interface (I/F) 1061, a memory interface (I/F) 1062, a control component 1063, a Read-Only Memory (ROM) 1069, a Random Access Memory (RAM) 1070, an error correction module 1064, a garbage collection module 1065, a wear leveling module 1066, a data buffer 1067 and a bus 1060. The host interface 1061 is a connection interface between the host 108 and the memory controller 106, the host interface 1061 allows the host and the memory controller to communicate according to a specific protocol, to send read request and write request, and to perform other operations. The memory interface 1062 is a connection interface between the memory controller 106 and the memory device 104, the memory interface 1062 is to implement data transmission between the memory controller 106 and the memory device 104. The control component 1063 is to control the memory system 102 as a whole, and the performed operations described above regarding the memory controller are mainly performed and completed by the control component 1063 here. In some examples, the control component 1063 is, e.g., a central processing unit (CPU), a microprocessor (MCU), etc. ROM 1069 typically contains firmware or firmware program code for the memory controller 106, which is to initialize and operate various components of the memory controller, and RAM 1070 is typically used to buffer data. The error correction module 1064 may further include an encode part and a decode part; the encode part is to encode the data to be stored to obtain check data, and the decode part is to decode the check data to detect and correct possible erroneous data during data transmission.

The garbage collection module 1065 is to read out the valid data on some memory blocks after the storage space of the memory device reaches a certain threshold, rewrite them, and then mark these memory blocks to obtain new spare memory blocks. The general implementation of garbage collection may be divided into three operations: selecting source memory blocks with less valid data; finding valid data from the source memory blocks; writing valid data to the target memory block. At this point, all data in the source memory block becomes invalid data, and the source memory block is marked and may be taken as a new spare memory block. The wear leveling module 1066 is to balance the wear (number of erases) of each memory block in the memory system through data statistics and algorithms. The general implementation of wear leveling may be divided into two operations: selecting the source memory block where the cold data is located; reading the valid data on the source memory block and writing it to the memory block with a relatively large number of erases, at this point, valid data in the source memory block becomes invalid data and is marked. The data buffer 1067 is to buffer data.

In some examples, the memory controller 106 is configured to control the memory device 104 to perform a first read operation on at least one code word.

In some examples, memory device 104 includes an array of memory cells, the array of memory cells includes a memory cell with multiple storage bits, and the multiple storage bits corresponding to multiple pages respectively; at least part of the pages corresponding to multiple stages, the multiple stages including the first stage and the second stage, and a read voltage in the second stage is lower than a read voltage in the first stage; peripheral circuit of the memory device 104, coupled to the array of memory cells and configured to perform the following operations: obtain a predicted valley voltage in the first stage in accordance with the corresponding first result at the target read voltage in the first stage; the first result includes the number of bits in the at least one code word formed by a preset number of the memory cells which are flipped in two read results at a first read voltage and a second read voltage; the difference between the first read voltage and the second read voltage is lower than a preset voltage; obtain the predicted valley voltage in the second stage in accordance with the predicted valley voltage in the first stage; perform a first read operation on at least one code word with the predicted valley voltage in the first stage and the predicted valley voltage in the second stage.

In some examples, the peripheral circuit of the memory device 104 is configured to: take both the predicted valley voltage in the first stage and the predicted valley voltage in the second stage as the initial target read voltages; obtain a corresponding first result at the initial target read voltage; determine the initial target read voltage to be the target valley voltage in accordance with the corresponding first result at the initial target read voltage meeting a preset condition; or make at least one adjustment to the initial target read voltage, and obtain a corresponding first result at the adjusted target read voltage after each adjustment; determine the adjusted target read voltage to be the target valley voltage in accordance with the corresponding first result at the adjusted target read voltage meeting a preset condition; perform a second read operation on at least one code word in accordance with the target valley voltage.

In some examples, the peripheral circuit of the memory device 104 is configured to: take the predicted valley voltage in the first stage as the initial target read voltage; obtain a corresponding first result at the initial target read voltage; determine the initial read voltage to be the target valley voltage in accordance with the corresponding first result at the initial read voltage meeting a preset condition; or make at least one adjustment to the initial target read voltage, and obtain the corresponding first result at the adjusted target read voltage after each adjustment; determine the target valley voltage in accordance with the corresponding first result at the adjusted target read voltage meeting a preset condition; obtain the predicted valley voltage in the second stage in accordance with the determined target valley voltage in the first stage; and perform a second read operation on at least one code word in accordance with the determined target valley voltage in the first stage and the predicted valley voltage in the second stage.

In some examples, each of the multiple pages includes multiple second stages; and the peripheral circuit of the memory device 104 is configured to: obtain the predicted valley voltage in the second stage corresponding to the highest read voltage among read voltages in the multiple second stages for each of the pages in accordance with the predicted valley voltage in the first stage/the target valley voltage in the first stage for each of the pages; and obtain the predicted valley voltage in the second stage corresponding to a lower read voltage than a read voltage in an adjacent second stage, in accordance with the predicted valley voltage in the second stage corresponding to a higher read voltage among read voltages in the multiple second stages for each of the pages in sequence, until the predicted valley voltage in each of the second stages for each of the pages is obtained.

In some examples, the peripheral circuit of the memory device 104 is configured to: obtain the predicted valley voltage in the second stage in accordance with the predicted valley voltage in the first stage/the target valley voltage in the first stage and a first mapping function. The first mapping function represents the relationship between the predicted valley voltage in the first stage/the target valley voltage in the first stage and the predicted valley voltage in the second stage.

In some examples, the peripheral circuit of the memory device 104 is configured to: in the process of making at least one adjustment to the initial target read voltage, take the initial target read voltage as a baseline value; starting from the baseline value, making adjustments in two opposite directions with a step size being smaller than the first preset step size, in the process of making adjustments in each direction, count one for upward trend in accordance with the corresponding first result at the read voltage after the next adjustment being greater than the corresponding first result at the read voltage after the previous adjustment, and determine the first voltage boundary and the second voltage boundary with total counted number being greater than or equal to the preset number; in the process of making adjustments in two directions, if the corresponding first result at the target read voltage after one adjustment is lower than the first threshold, or taking the minimum first result among multiple corresponding first results at the target read voltages after multiple adjustments as a reference value, when the number of first results from remaining first results which differ from the reference value with a difference being less than a second threshold is greater than a preset number, stop the adjustments and take the target read voltage corresponding to the minimum first result among the multiple first results as the target valley voltage.

In some examples, the peripheral circuit of the memory device 104 is configured to: in the process of making adjustments in two directions, take the corresponding adjusted target read voltages as the first voltage boundary and the second voltage boundary respectively in accordance with the total counted number being equal to the preset number; in the process of making adjustments in two directions, if the first voltage boundary and the second voltage boundary have been determined, take the target read voltage for the last adjustment as an average of the first voltage boundary and the second voltage boundary; take the read voltage corresponding to the minimum first result among the multiple corresponding first results at all the adjusted target read voltages as the target valley voltage.

In some examples, the peripheral circuit of the memory device 104 is configured to: obtain the predicted valley voltage in the first stage in accordance with the corresponding first result at the target read voltage in the first stage, the stage number at which the first stage is, and the second mapping function. The second mapping function represents the relationship between the corresponding first result at the target read voltage, the stage number at which each stage is, and the predicted valley voltage.

In some examples, the peripheral circuit of the memory device 104 is configured to: read the storage data of at least one code word at the first read voltage to obtain a second result; read the storage data of at least one code word at the second read voltage to obtain a third result; perform a logical operation on the second result and the third result to obtain a fourth result; counting the number of bits in the fourth result which represent flip of bits in the third result relative to the second result to obtain a first result.

In some examples, the peripheral circuit of the memory device 104 is configured to: a first latch, a second latch, and a third latch; the first latch is configured to store a second result; the second latch is configured to store a third result; and the third latch is configured to store a fourth result.

In some examples, the memory controller 106 is configured to: send a first instruction, where the first instruction indicates to obtain information representing target valley voltages in multiple stages; the memory device 104 is configured to: receive the first instruction, obtain information representing the predicted valley voltages in multiple stages, and send the obtained information representing the predicted valley voltages in multiple stages to the memory controller; and the memory controller 106 is further configured to: control the memory device to perform a first read operation with the predicted valley voltage in the information representing the predicted valley voltages in multiple stages, and perform a first error correction decode operation on the first read result of the first read operation.

In some examples, as shown in FIG. 12, the memory controller 106 is configured to: send a first instruction, where the first instruction indicates to obtain information representing target valley voltages in multiple stages; the memory device 104 is configured to: receive the first instruction, obtain information representing the predicted valley voltages in multiple stages, and send the obtained information representing the predicted valley voltages in multiple stages to the memory controller.

Figure 13:
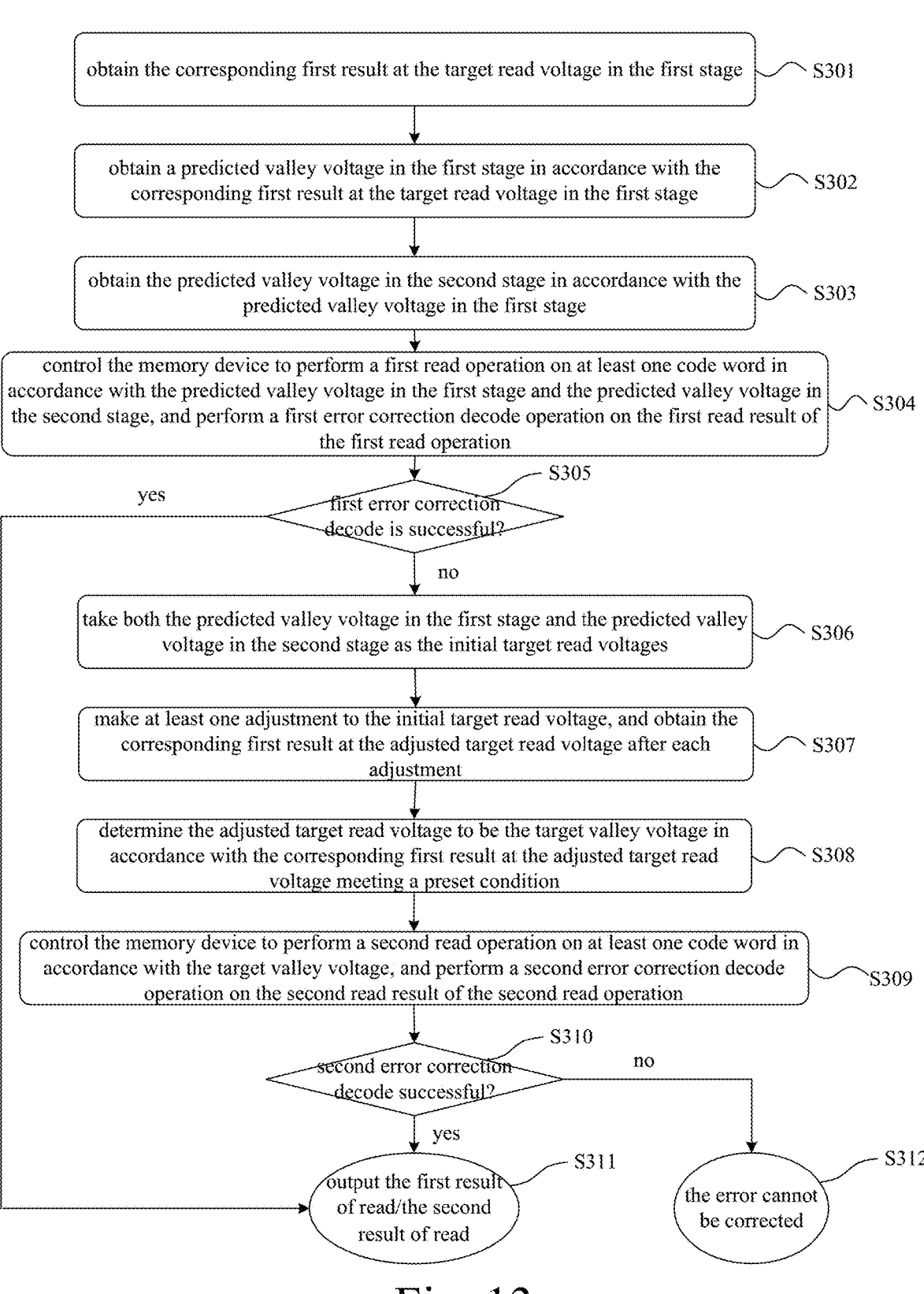
FIG. 13 is a flowchart of a method that the memory system provided by an example of the present disclosure is configured to perform.

In some examples, as shown in FIGS. 12 and 13, the memory device 104 is configured to receive a first instruction to obtain information representing predicted valley voltages in multiple stages, including performing the following operations.

Operation S301. obtain the corresponding first result at the target read voltage in the first stage.

Operation S302. obtain a predicted valley voltage in the first stage in accordance with the corresponding first result at the target read voltage in the first stage; the first result includes the number of bits in the at least one code word formed by a preset number of the memory cells which are flipped in two read results at a first read voltage and a second read voltage; the difference between the first read voltage and the second read voltage is lower than a preset voltage.

Operation S303: obtain the predicted valley voltage in the second stage in accordance with the predicted valley voltage in the first stage.

The memory controller 106 is further configured to perform the following operations.

Operation S304: control the memory device to perform a first read operation on at least one code word with the predicted valley voltage in the first stage and the predicted valley voltage in the second stage, and perform a first error correction decode operation on the first read result of the first read operation.

In one example, as shown in FIGS. 9A, 9B, and 9C, at least one code word corresponds to the lower page, the middle page, and the upper page. The multiple stages for the lower page include the first level and fifth level, the multiple stages for the middle page include the second level, fourth level, and sixth level, and the multiple stages for the upper page include the third level and the seventh level. The fifth level, sixth level and seventh level correspond to the predicted valley voltages in the first stages for the lower, middle and upper pages respectively; the first level, second level, fourth level and third level correspond to the predicted valley voltages in the second stages for the lower, middle and upper pages respectively.

In one example, the operations S301 to S304 described above may be performed on the lower page corresponding to at least one code word to obtain the predicted valley voltage in the first stage and the predicted valley voltage in the second stage corresponding to the lower page, the memory device is controlled to perform a first read operation on the lower page of at least one code word with the predicted valley voltage in the first stage and the predicted valley voltage in the second stage, and perform a first error correction decode operation on the first read result of the first read operation; Similarly, with reference to the details of performing the operations S301 to S304 described above on the lower page corresponding to at least one code word, the operations S301 to S304 described above may be performed on the middle page and the upper page of the at least one code word respectively. In this way, by performing the operations S301 to operation S304 described above on the lower page, middle page, and upper page corresponding to at least one code word, until the first read operation on the at least one code word is completed, and a first error correction decode operation is performed on the first read result of the first read operation.

In some examples, the memory controller 106 is configured to perform the following operations: output the first read result in accordance with the success of the first error correction decode; or send a second instruction in accordance with the failure of the first error correction decode. The second instruction indicates reobtaining the information representing the target valley voltages in the multiple stages. The memory device 104 is configured to: receive the second instruction, redetermine the target valley voltages in the multiple stages, and send second information representing the redetermined target valley voltages to the memory controller; the memory controller 106 is further configured to: control the memory device to perform a second read operation with the redetermined target valley voltage in the second information, and perform a second error correction decode operation on the second read result of the second read operation.

In some examples, as shown in FIG. 12, the memory controller 106 is configured to: send a second instruction. The second instruction indicates to reobtain the information representing target valley voltages in multiple stages; the memory device 104 is configured to: receive the second instruction, redetermine the target valley voltages in the multiple stages, and send second information representing the redetermined target valley voltages to the memory controller.

In some examples, as shown in FIGS. 12 and 13, the memory device 104 is configured to receive the second instruction and redetermine target valley voltages in the multiple stages, including performing the following operations.

Operation S306. take both the predicted valley voltage in the first stage and the predicted valley voltage in the second stage as the initial target read voltages.

Operation S307. make at least one adjustment to the initial target read voltage, and obtain the corresponding first result at the adjusted target read voltage after each adjustment.

Operation S308. determine the adjusted target read voltage to be the target valley voltage in accordance with the corresponding first result at the adjusted target read voltage meeting a preset condition.

The memory controller 106 is further configured to perform the following operations.

Operation S309. control the memory device to perform a second read operation on at least one code word in accordance with the target valley voltage, and perform a second error correction decode operation on the second read result of the second read operation.

In one example, the operations S306 to S309 described above may be performed on the lower page corresponding to at least one code word to obtain the adjusted target valley voltage in the first stage and the adjusted target valley voltage in the second stage corresponding to the lower page, the memory device is controlled to perform a first read operation on the lower page of at least one code word with the adjusted target read voltage in the first stage and the adjusted target read voltage in the second stage, and perform a first error correction decode operation on the first read result of the first read operation; Similarly, with reference to the details of performing the operations S306 to S309 described above on the lower page corresponding to at least one code word, the operations S306 to S309 described above may be performed on the middle page and the upper page of the at least one code word respectively. In this way, by performing the operations S306 to S309 described above on the lower page, middle page, and upper page corresponding to at least one code word, until the second read operation on the at least one code word is completed, and a second error correction decode operation is performed on the second read result of the second read operation.

In some examples, as shown in FIGS. 12 and 13, the memory controller 106 is configured to perform the following operations: operation S305: in accordance with the success of the first error correction decode, operation S311: output the first result of read; or operation S310: in accordance with the success of the second error correction decode, operation S311: output the second result of read.

In some examples, as shown in FIGS. 12 and 13, the memory controller 106 is configured to perform the following operations: operation S310: in accordance with the failure of the second error correction decode, operation S312: confirm that the error may not be corrected.

In some examples, the memory controller 106 is configured to: send a mode-setting command indicating to set a read mode of the memory device to a single level read mode; the single level read mode includes reading at least one bit of storage data stored in the memory cell through read voltages at a first level; the memory device 104 is configured to: enter a single level read mode in response to a mode set command, and, in the single level read mode, obtain a corresponding first result at least one code word at a target read voltage in the first stage.

In some examples, the error correction decode operation includes a hard decode or soft decode operation, and the error correction decode operation includes a first error correction decode operation or a second error correction decode operation.

In a second aspect, in a memory system provided by an example of the present disclosure, by transmitting a first result (size of the first result may be several bytes) instead of at least one code word (e.g. the size of code word may be 4 KB), the amount of data transferred between the memory device and the memory controller is reduced; the process of obtaining the first result is converged inside the memory device and does not occupy space of a memory controller, and is less dependent on a memory controller; the process of obtaining the predicted valley voltage/target valley voltage in accordance with the first result is completed in the memory device; the transmission time of the input and output ports of the memory device and/or the time of the error correction decode operation of the memory controller is reduced; saves the time for iteration of the error correction decode algorithm by the memory controller is saved, and the speed of the error correction decode is faster; therefore it is suitable for MLC, TLC or QLC type memory devices.

In a third aspect, an example of the present disclosure provides a memory controller, the memory controller is coupled to at least one memory device, and the memory device includes: an array of memory cells including a memory cell with multiple storage bits, and the multiple storage bits correspond to multiple pages respectively; at least part of the pages corresponds to multiple stages, the multiple stages include a first stage and a second stage, and a read voltage in the second stage is lower than a read voltage in the first stage; the memory controller includes: a control component configured to: obtain a predicted valley voltage in the first stage in accordance with the corresponding first result at the target read voltage in the first stage; the first result includes the number of bits in the at least one code word formed by a preset number of the memory cells which are flipped in two read results at a first read voltage and a second read voltage; the difference between the first read voltage and the second read voltage is lower than a preset voltage; obtain the predicted valley voltage in the second stage in accordance with the predicted valley voltage in the first stage; and control the memory device to perform a first read operation with the predicted valley voltage in the first stage and the predicted valley voltage in the second stage, and perform a first error correction decode on the first read result of the first read operation.

In some examples, the control component is configured to: take both the predicted valley voltage in the first stage and the predicted valley voltage in the second stage as the initial target read voltages in accordance with the failure of the first error correction decode; obtain a corresponding first result at the initial target read voltage; determine the initial target read voltage to be the target valley voltage in accordance with the corresponding first result at the initial target read voltage meeting a preset condition; or make at least one adjustment to the initial target read voltage, and obtain the corresponding first result at the adjusted target read voltage after each adjustment; determine the adjusted target read voltage to be the target valley voltage in accordance with the corresponding first result at the adjusted target read voltage meeting a preset condition; control the memory device to perform a second read operation on at least one code word in accordance with the target valley voltage, and perform a second error correction decode on the second read result of the second read operation.

In some examples, the control component is configured to: take the predicted valley voltage in the first stage as the initial target read voltage in accordance with the failure of the first error correction decode; obtain the first result for the initial target read voltage; determine the initial read voltage to be the target valley voltage in accordance with the corresponding first result at the initial read voltage meeting a preset condition; or make at least one adjustment to the initial target read voltage, and obtain the corresponding first result at the adjusted target read voltage after each adjustment; determine the target valley voltage in accordance with the corresponding first result at the adjusted target read voltage meeting a preset condition; obtain the predicted valley voltage in the second stage in accordance with the determined target valley voltage in the first stage; and control the memory device to perform a second read operation on at least one code word in accordance with the determined target valley voltage in the first stage and the predicted valley voltage in the second stage, and perform a second error correction decode on the second read result of the second read operation.

In some examples, each of the multiple pages includes multiple second stages; and the control component is configured to: obtain the predicted valley voltage in the second stage corresponding to the highest read voltage among read voltages in the multiple second stages for each of the pages in accordance with the predicted valley voltage in the first stage/the target valley voltage in the first stage for each of the pages; and obtain the predicted valley voltage in the second stage corresponding to a lower read voltage than a read voltage in an adjacent second stage, in accordance with the predicted valley voltage in the second stage corresponding to a higher read voltage among read voltages in the multiple second stages for each of the pages in sequence, until the predicted valley voltage in each of the second stages for each of the pages is obtained.

In some examples, the control component is configured to: obtain the predicted valley voltage in the second stage in accordance with the predicted valley voltage in the first stage/the target valley voltage in the first stage and a first mapping function, where the first mapping function represents the relationship between the predicted valley voltage in the first stage/the target valley voltage in the first stage and the predicted valley voltage in the second stage.

In some examples, the control component is configured to: in the process of making at least one adjustment to the initial target read voltage, take the initial target read voltage as a baseline value; starting from the baseline value, making adjustments in two opposite directions with a step size being smaller than the first preset step size, in the process of making adjustments in each direction, count one for upward trend in accordance with the corresponding first result at the read voltage after the next adjustment being greater than the corresponding first result at the read voltage after the previous adjustment, and determine the first voltage boundary and the second voltage boundary with total counted number being greater than or equal to the preset number; in the process of making adjustments in two directions, if the corresponding first result at the target read voltage after one adjustment is lower than the first threshold, or taking the minimum first result among multiple corresponding first results at the target read voltages after multiple adjustments as a reference value, when the number of first results from remaining first results which differ from the reference value with a difference being less than a second threshold is greater than a preset number, stop the adjustments and take the target read voltage corresponding to the minimum first result among the multiple first results as the target valley voltage.

In some examples, the control component is configured to: in the process of making adjustments in two directions, take the corresponding adjusted target read voltages as the first voltage boundary and the second voltage boundary respectively in accordance with the total counted number being equal to the preset number; in the process of making adjustments in two directions, if the first voltage boundary and the second voltage boundary have been determined, take the target read voltage for the last adjustment as an average of the first voltage boundary and the second voltage boundary; take the read voltage corresponding to the minimum first result among the multiple corresponding first results at all the adjusted target read voltages as the target valley voltage.

In some examples, the control component is configured to: control the memory device to output a corresponding read result in accordance with the success of the first error correction decode or the success of the second error correction decode; determine a failure of error correction in accordance with the failure of the second error correction decode.

In some examples, the control component is configured to: obtain the predicted valley voltage in the first stage in accordance with the corresponding first result at the target read voltage in the first stage, the stage number at which the first stage is, and the second mapping function; the second mapping function represents the relationship between the corresponding first result at the target read voltage, the stage number at which each stage is, and the predicted valley voltage.

In a third aspect, in a memory controller provided by an example of the present disclosure, by transmitting a first result (size of the first result may be several bytes) instead of at least one code word (e.g. the size of the code word may be 4 KB), the amount of data transferred between the memory device and the memory controller is reduced; the process of obtaining the first result is converged inside the memory device and does not occupy space of a memory controller, and is less dependent on a memory controller; completing the process of obtaining the predicted valley voltage/target valley voltage in accordance with the first result is more efficient in the memory controller than in the memory device; the transmission time of the input and output ports of the memory device and/or the time of the error correction decode operation of the memory controller is reduced; the time of the iteration of error correction decode algorithm by the memory controller is saved, and the speed of the error correction decode is faster; therefore it is suitable for MLC, TLC or QLC type memory devices.

In a fourth aspect, an example of the present disclosure provides a method for operating a memory device, the operating method includes: obtaining a predicted valley voltage in a first stage in accordance with a corresponding first result at a target read voltage in the first stage; the first result includes the number of bits in the at least one code word formed by a preset number of the memory cells in the memory device which are flipped in two read results at a first read voltage and a second voltage; the difference between the first read voltage and the second read voltage is lower than a preset voltage; the memory cell including multiple storage bits, and the multiple storage bits corresponding to multiple pages respectively; at least part of the pages corresponding to multiple stages, the multiple stages including the first stage and the second stage, and a read voltage in the second stage is lower than a read voltage in the first stage; obtaining the predicted valley voltage in the second stage in accordance with the predicted valley voltage in the first stage; and performing a first read operation on at least one code word with the predicted valley voltage in the first stage and the predicted valley voltage in the second stage.

In some examples, the operating method includes: taking both the predicted valley voltage in the first stage and the predicted valley voltage in the second stage as the initial target read voltages; obtaining the corresponding first result at the initial target read voltage; determining the initial target read voltage to be the target valley voltage in accordance with the corresponding first result at the initial target read voltage meeting a preset condition; or making at least one adjustment to the initial target read voltage, and obtain the corresponding first result at the adjusted target read voltage after each adjustment; determining the adjusted target read voltage to be the target valley voltage in accordance with the corresponding first result at the adjusted target read voltage meeting a preset condition; performing a second read operation on at least one code word in accordance with the target valley voltage.

In some examples, the operating method includes: taking the predicted valley voltage in the first stage as the initial target read voltage; obtaining the corresponding first result at the initial target read voltage; determining the initial read voltage to be the target valley voltage in accordance with the corresponding first result at the initial read voltage meeting a preset condition; or making at least one adjustment to the initial target read voltage, and obtaining the corresponding first result at the adjusted target read voltage after each adjustment; determining the target valley voltage in accordance with the corresponding first result at the adjusted target read voltage meeting a preset condition; obtaining the predicted valley voltage in the second stage in accordance with the determined target valley voltage in the first stage; and performing a second read operation on at least one code word in accordance with the determined target valley voltage in the first stage and the predicted valley voltage in the second stage.

In some examples, the operating method includes: obtaining the predicted valley voltage in the second stage corresponding to the highest read voltage among read voltages in the multiple second stages for each of the pages in accordance with the predicted valley voltage in the first stage/the target valley voltage in the first stage for each of the pages; and obtaining the predicted valley voltage in the second stage corresponding to a lower read voltage than a read voltage in an adjacent second stage, in accordance with the predicted valley voltage in the second stage corresponding to a higher read voltage among read voltages in the multiple second stages for each of the pages in sequence, until the predicted valley voltage in each of the second stages for each of the pages is obtained; each of the multiple pages includes multiple second stages.

In some examples, the operating method includes obtaining the predicted valley voltage in the second stage in accordance with the predicted valley voltage in the first stage/the target valley voltage in the first stage and a first mapping function. The first mapping function represents the relationship between the predicted valley voltage in the first stage/the target valley voltage in the first stage and the predicted valley voltage in the second stage.

In some examples, the operating method includes: in the process of making at least one adjustment to the initial target read voltage, taking the initial target read voltage as a baseline value; starting from the baseline value, making adjustments in two opposite directions with a step size being smaller than the first preset step size, in the process of making adjustments in each direction, counting one for upward trend in accordance with the corresponding first result at the read voltage after the next adjustment being greater than the corresponding first result at the read voltage after the previous adjustment, and determining the first voltage boundary and the second voltage boundary with total counted number being greater than or equal to the preset number; in the process of making adjustments in two directions, if the corresponding first result at the target read voltage after one adjustment is lower than the first threshold, or taking the minimum first result among multiple corresponding first results at the target read voltages after multiple adjustments as a reference value, when the number of first results from remaining first results which differ from the reference value with a difference being less than a second threshold is greater than a preset number, stopping the adjustments and taking the target read voltage corresponding to the minimum first result among the multiple first results as the target valley voltage.

In some examples, the operating method includes: in the process of making adjustments in two directions, taking the corresponding adjusted target read voltages as the first voltage boundary and the second voltage boundary respectively in accordance with the total counted number being equal to the preset number; in the process of making adjustments in two directions, if the first voltage boundary and the second voltage boundary have been determined, take the target read voltage for the last adjustment as an average of the first voltage boundary and the second voltage boundary; take the read voltage corresponding to the minimum first result among the multiple corresponding first results at all the adjusted target read voltages as the target valley voltage.

In some examples, the operating method includes: obtaining the predicted valley voltage in the first stage in accordance with the corresponding first result at the target read voltage in the first stage, the stage number at which the first stage is, and the second mapping function; the second mapping function represents the relationship between the corresponding first result at the target read voltage, the stage number at which each stage is, and the predicted valley voltage.

In some examples, the operating method includes: reading the storage data of at least one code word at the first read voltage to obtain a second result; reading the storage data of at least one code word at the second read voltage to obtain a third result; performing a logical operation on the second result and the third result to obtain a fourth result; and counting the number of bits in the fourth result which represent flip of bits in the third result relative to the second result to obtain a first result.

In a fifth aspect, an example of the present disclosure provides a method for operating a memory system, the operating method includes: sending, by a memory controller in the memory system, a first instruction, where the first instruction indicates to obtain information representing target valley voltages in multiple stages; receiving, by the memory device in the memory system, the first instruction, and obtaining information representing the predicted valley voltages in multiple stages in accordance with the any of methods for operating the memory device provided in the fourth aspect, and sending the information representing the predicted valley voltages in the multiple stages to the memory controller; controlling, by the memory controller, the memory device to perform a first read operation with the information which represents the predicted valley voltages in the multiple stages, and performing a first error correction decode operation on the first read result of the first read operation.

In some examples, a method for operating a memory device includes: obtaining a predicted valley voltage in the first stage in accordance with the corresponding first result at the target read voltage in the first stage; the first result includes the number of bits in the at least one code word formed by a preset number of the memory cells in the memory device which are flipped in two read results at a first read voltage and a second voltage; the difference between the first read voltage and the second read voltage is lower than a preset voltage; the memory cell including multiple storage bits, and the multiple storage bits corresponding to multiple pages respectively; at least part of the pages corresponding to multiple stages, the multiple stages including the first stage and the second stage, and a read voltage in the second stage is lower than a read voltage in the first stage; obtaining the predicted valley voltage in the second stage in accordance with the predicted valley voltage in the first stage; and performing a first read operation on at least one code word with the predicted valley voltage in the first stage and the predicted valley voltage in the second stage.

In a sixth aspect, an example of the present disclosure provides a method for operating a memory controller, the operating method includes: obtaining a predicted valley voltage in a first stage in accordance with a corresponding first result at a target read voltage in the first stage; the first result includes the number of bits in the at least one code word formed by a preset number of the memory cells in at least one memory device coupled to the memory controller which are flipped in two read results at a first read voltage and a second read voltage; the difference between the first read voltage and the second read voltage is lower than a preset voltage; the memory cell including multiple storage bits, and the multiple storage bits corresponding to multiple pages respectively; at least part of the pages corresponding to multiple stages, the multiple stages including the first stage and the second stage, and a read voltage in the second stage is lower than a read voltage in the first stage; obtaining the predicted valley voltage in the second stage in accordance with the predicted valley voltage in the first stage; and controlling the memory device to perform a first read operation at the predicted valley voltage in the first stage and the predicted valley voltage in the second stage, and performing a first error correction decode on the first read result of the first read operation.

In some examples, the operating method includes: taking both the predicted valley voltage in the first stage and the predicted valley voltage in the second stage as the initial target read voltages in accordance with the failure of the first error correction decode; obtaining the corresponding first result at the initial target read voltage; determining the initial target read voltage to be the target valley voltage in accordance with the corresponding first result at the initial target read voltage meeting a preset condition; or making at least one adjustment to the initial target read voltage, and obtaining the corresponding first result at the adjusted target read voltage after each adjustment; determining the adjusted target read voltage to be the target valley voltage in accordance with the corresponding first result at the adjusted target read voltage meeting a preset condition; controlling the memory device to perform a second read operation on at least one code word in accordance with the target valley voltage, and perform a second error correction decode on the second read result of the second read operation.

In some examples, the operating method includes: taking the predicted valley voltage in the first stage as the initial target read voltage in accordance with the failure of the first error correction decode; obtaining the first result for the initial target read voltage; determining the initial read voltage to be the target valley voltage in accordance with the corresponding first result at the initial read voltage meeting a preset condition; or making at least one adjustment to the initial target read voltage, and obtain the corresponding first result at the adjusted target read voltage after each adjustment; determining the target valley voltage in accordance with the corresponding first result at the adjusted target read voltage meeting a preset condition; obtaining the predicted valley voltage in the second stage in accordance with the determined target valley voltage in the first stage; and controlling the memory device to perform a second read operation on at least one code word in accordance with the determined target valley voltage in the first stage and the predicted valley voltage in the second stage, and performing a second error correction decode on the second read result of the second read operation.

In some examples, the operating method includes: obtaining the predicted valley voltage in the second stage corresponding to the highest read voltage among read voltages in the multiple second stages for each of the pages in accordance with the predicted valley voltage in the first stage/the target valley voltage in the first stage for each of the pages; and obtaining the predicted valley voltage in the second stage corresponding to a lower read voltage than a read voltage in an adjacent second stage, in accordance with the predicted valley voltage in the second stage corresponding to a higher read voltage among read voltages in the multiple second stages for each of the pages in sequence, until the predicted valley voltage in each of the second stages for each of the pages is obtained; each of the multiple pages includes multiple second stages.

In some examples, the operating method includes obtaining the predicted valley voltage in the second stage in accordance with the predicted valley voltage in the first stage/the target valley voltage in the first stage and a first mapping function. The first mapping function represents the relationship between the predicted valley voltage in the first stage/the target valley voltage in the first stage and the predicted valley voltage in the second stage.

In some examples, the operating method includes: in the process of making at least one adjustment to the initial target read voltage, taking the initial target read voltage as a baseline value; starting from the baseline value, making adjustments in two opposite directions with a step size being smaller than the first preset step size, in the process of making adjustments in each direction, counting one for upward trend in accordance with the corresponding first result at the read voltage after the next adjustment being greater than the corresponding first result at the read voltage after the previous adjustment, and determining the first voltage boundary and the second voltage boundary with total counted number being greater than or equal to the preset number; in the process of making adjustments in two directions, if the corresponding first result at the target read voltage after one adjustment is lower than the first threshold, or taking the minimum first result among multiple corresponding first results at the target read voltages after multiple adjustments as a reference value, when the number of first results from remaining first results which differ from the reference value with a difference being less than a second threshold is greater than a preset number, stopping the adjustments and taking the target read voltage corresponding to the minimum first result among the multiple first results as the target valley voltage.

In some examples, the operating method includes: in the process of making adjustments in two directions, taking the corresponding adjusted target read voltages as the first voltage boundary and the second voltage boundary respectively in accordance with the total counted number being equal to the preset number; in the process of making adjustments in two directions, if the first voltage boundary and the second voltage boundary have been determined, taking the target read voltage for the last adjustment as an average of the first voltage boundary and the second voltage boundary; taking the read voltage corresponding to the minimum first result among the multiple corresponding first results at all the adjusted target read voltages as the target valley voltage.

In some examples, the operating method includes: controlling the memory device to output a corresponding read result in accordance with the success of the first error correction decode or the success of the second error correction decode; determining a failure of error correction in accordance with the failure of the second error correction decode.

In some examples, the operating method includes: obtaining the predicted valley voltage in the first stage in accordance with the corresponding first result at the target read voltage in the first stage, the stage number at which the first stage is, and the second mapping function; the second mapping function represents the relationship between the corresponding first result at the target read voltage, the stage number at which each stage is, and the predicted valley voltage.

Figure 14A:
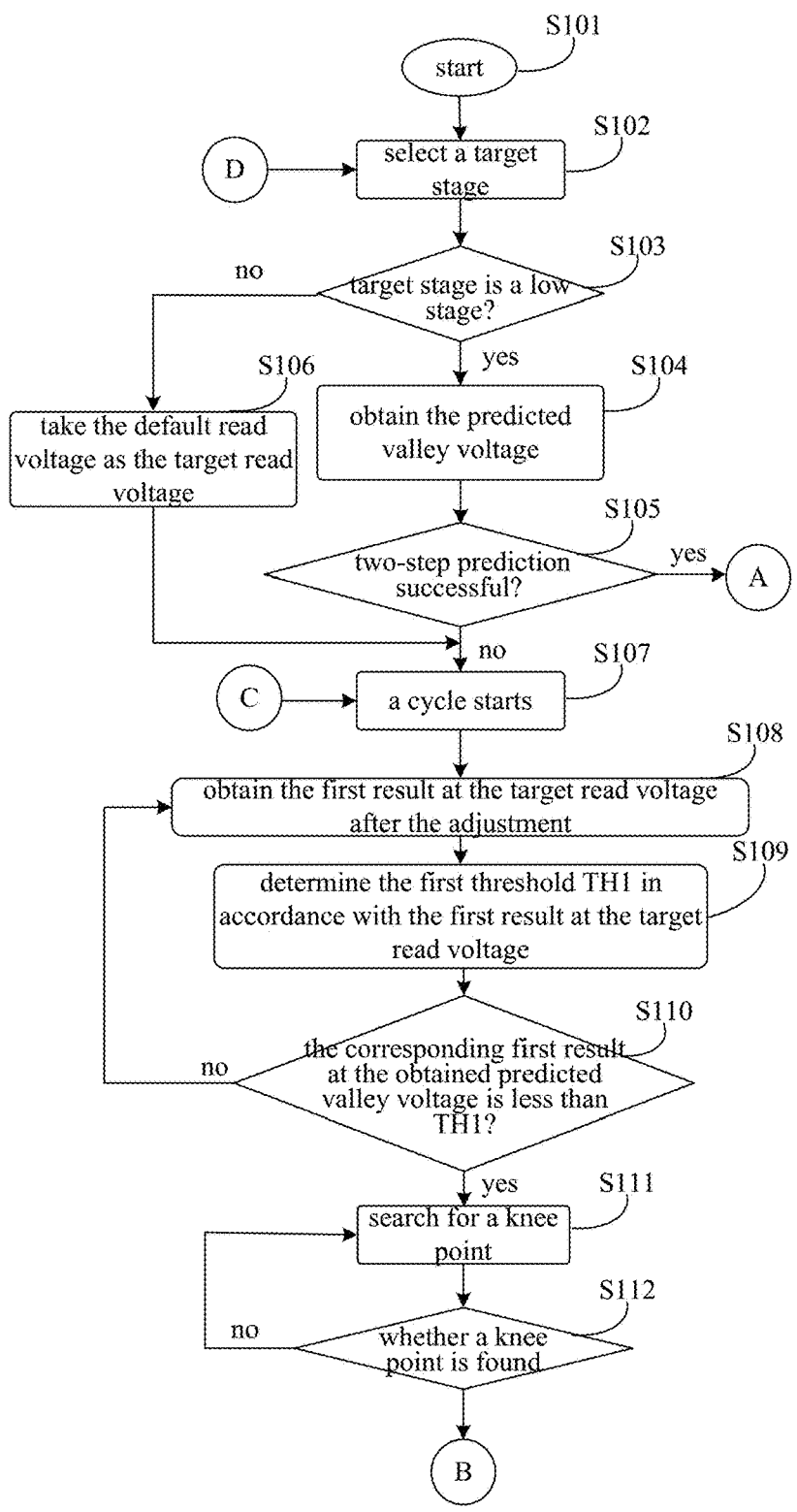
FIGS. 14A and 14B are a flowchart of a method for operating a memory device provided by an example of the present disclosure.
Figure 14B:
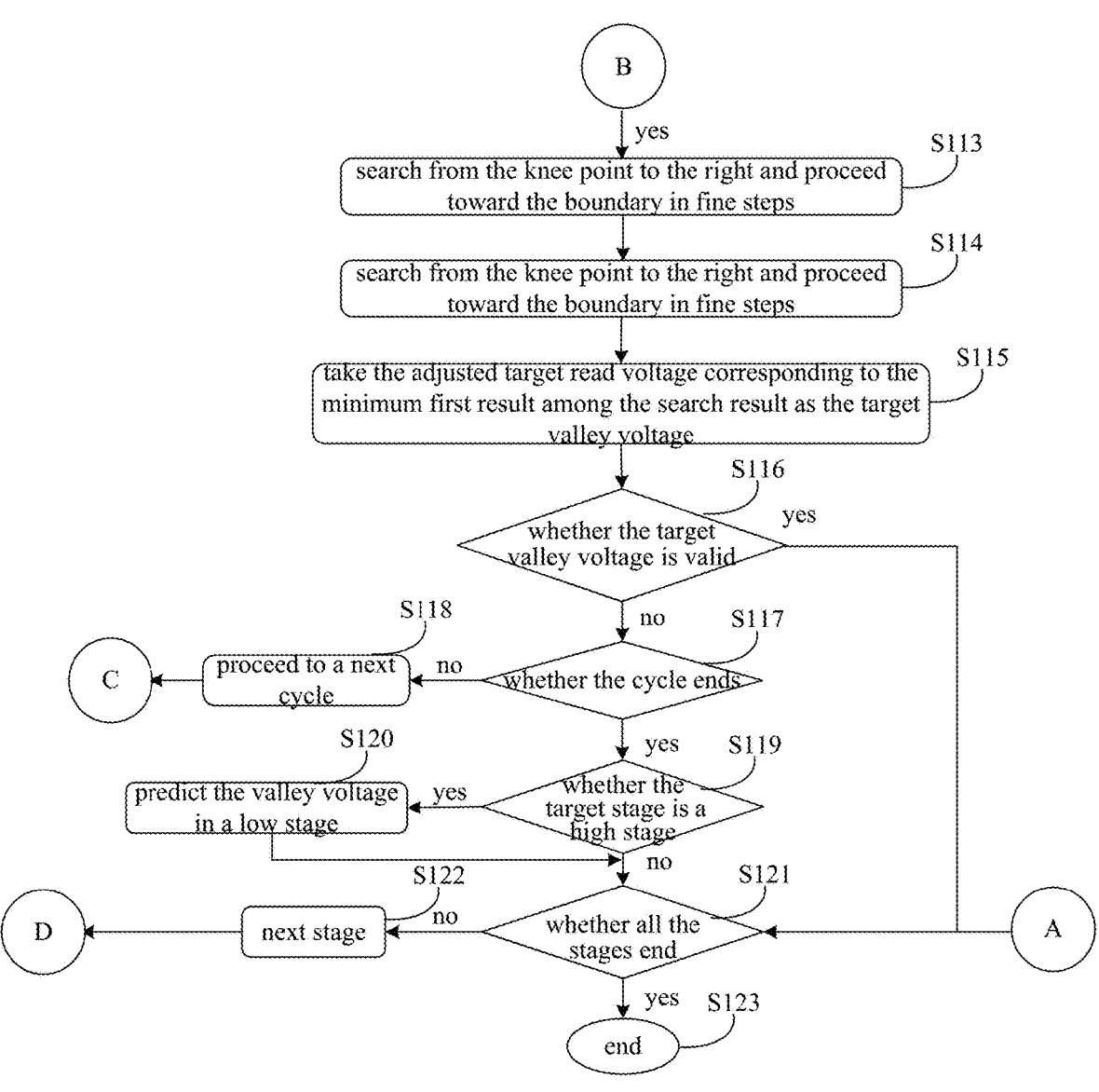

FIGS. 14A and 14B are a flowchart of a method for operating a memory device provided by an example of the present disclosure. The process of determining the target valley voltage will be described in detail below through FIGS. 14A and 14B. It should be noted that here and below, the target valley voltage refers to the voltage used to perform a read operation on the data to be read.

In operation S101, the program of obtaining the target valley voltage is triggered, and the process of obtaining the target valley voltage is started. Next, operation S102 is performed.

As mentioned above, in accordance with the memory cell including multiple storage bits, the multiple storage bits correspond to multiple pages respectively, and at least one page corresponds to multiple stages. When the target valley voltage is to be determined, the target valley voltage of read voltages in each stage among the read voltages in the at least one stage corresponding to each of the multiple pages is determined in sequence. In operation S103, one stage is selected from the multiple stages corresponding to one page as the target stage, and the target valley voltage corresponding to the read voltage in the target stage is first determined. For example, taking TLC as an example, the target valley voltages for the first-level read voltage L1 and the fifth-level read voltage L5 corresponding to the lower page is first determined, and one of L1 or L5 may be selected as the target stage. After the target stage is determined, operation S103 is performed.

In operation S103, the type to which the target stage belongs is mainly determined. Here, the target stage may be divided into two categories, the first stage (also referred to as high stage) and the second stage (also referred to as low stage). The read voltage in the first stage is greater than the read voltage in the second stage. For example, still taking the lower page of TLC as an example, L5 is in the first stage and L1 is in the second stage. If L1 is selected as the target stage in operation S103, the target stage is the second stage, which is the low stage; if L5 is selected as the target stage in operation S104, the target stage is the first stage, which is the high stage. If the target stage is a low stage, operation S104 is performed; if the target stage is a high stage, operation S106 is performed.

In operation S104, the predicted valley voltage is obtained; here, the predicted valley voltage is the predicted valley voltage corresponding to a low stage obtained in accordance with the target valley voltage corresponding to a high stage and the related mapping function. Here and below, the related mapping function may be obtained by fitting a large number of experimental results before the memory device leaves the factory, and is stored in the memory device. Next, operation S105 is performed.

In operation S105, it is determined whether the prediction by the two-step method is successful. Here, the so-called two-step prediction may include the first-step prediction and the second-step prediction, where the first-step prediction is to obtain a predicted valley voltage in high stage, and the implementation is to obtain the predicted valley voltage in high stage in accordance with the corresponding first result at the target read voltage (default read voltage), the stage number at which the high stage is, and the fourth mapping function; the second-step prediction is to obtain the predicted valley voltage in low stage, and the implementation is to obtain the predicted valley voltage in low stage in accordance with the aforementioned predicted valley voltage in high stage, the stage number at which the low stage is and the third mapping function. After the prediction by the two-step method, confirmation of the predicted valley voltage is not performed, and the predicted valley voltage in high stage and the predicted valley voltage in low stage are directly used for hard decode, if the hard decode passes, it indicates that the prediction by the two-step method is successful, at this point, the search for the target valley voltage is directly stopped and operation S121 is performed; If the hard decode fails, it indicates that the prediction by the two-step method fails, at this point, the point corresponding to the predicted valley voltage is taken as the near-valley point for subsequent iterations, and operation S107 is continued.

It should be noted that if the hard decode fails, it indicates that the prediction by the two-step method is unsuccessful, at this point, the target valley voltage needs to be determined through search or also called a cycle (or an iteration), therefore, when the prediction by the two-step method is unsuccessful, a process in a cycle will be entered, after the prediction by the two-step method fails, the search process may be performed directly from the beginning of the cycle, e.g., moving from operation S105 to S107.

If the target stage is a high stage, the determine of the target valley voltage in the high stage is prepared by the way of search or a cycle. In operation S106, the default read voltage is taken as the target read voltage. Here, the target read voltage may be taken as an initial value for subsequent searches or cycles. In some implementations, the default read voltage may be the read voltage when the threshold voltage of the memory cell does not offset, e.g., the corresponding read voltage when just written in, and the corresponding offset value at this point is 0 DAC, which is the voltage offset. Operation S107 is performed after operation S106.

It should be noted that here and below, the conversion relationship between DAC and the aforementioned mV is 1DAC=10 mV.

In operation S107, it is started to determine the target valley voltage by the way of searching or in a cycle. Operation S108 is performed after operation S107.

For performing a first cycle, in operation S108, the first result at the target read voltage is obtained; it may be understood that for performing subsequent cycles, in operation S108, the first result at the adjusted target read voltage is obtained. Operation S109 is performed after operation S108.

In operation S109, the first threshold TH1 is determined or adjusted in accordance with the first result at the target read voltage. It may be understood that when performing a read operation, the further the threshold voltage of the memory cell deviates from the threshold voltage at the time of writing, the first result of reading with the target read voltage will generally be higher, based on this, the value of the first result at the default read voltage may be used to confirm the first threshold TH1, and the first threshold TH1 represents the change (lifting) in the target valley voltage caused by the offset of the threshold voltage of the memory cell. Operation S110 is performed after operation S109.

It should be noted that operation S109 is mainly for the process of performing a first cycle, and for the process of performing subsequent cycles, this operation may be skipped.

In operation S110, the predicted valley voltage is obtained, and it is determined whether the predicted valley voltage is lower than the aforementioned first threshold TH1. In accordance with the corresponding first result at the target read voltage after the last adjustment and the related mapping function (e.g., the aforementioned second mapping function), the predicted read voltage after next adjustment is obtained, and the obtained predicted valley voltage is compared with the magnitude of the first threshold TH1. When the determination result in operation S110 is no, it indicates that the predicted valley voltage obtained at this point is greater than or equal to the first threshold TH1, and the operation S108 of the cycle continues where an adjustment is made to the target read voltage and the predicted valley voltage is reobtained, after each reobtaining of the predicted valley voltage, a comparison with the first threshold TH1 is performed until the obtained predicted read voltage is lower than the first threshold TH1. That is to say, the aforementioned prediction formula or related mapping function is used to perform the iteration of prediction until the obtained predicted read voltage is lower than the first threshold TH1. When the determination result in operation S110 is yes, it indicates that the predicted valley voltage obtained at this point is lower than the first threshold TH1, and the process proceeds to the next operation S111.

In operation S111, a knee point is searched. Here, the target read voltage after each adjustment is taken as the abscissa, and the corresponding first result at the corresponding adjusted target read voltage is taken as the ordinate, the abscissa and ordinate may form a point. The knee point may be understood as a point closer to the valley. In some examples, starting from the near-valley point, search with a coarse step size (a first step size) may be performed to the left boundary and the right boundary respectively until reaching the left boundary and the right boundary, and the point corresponding to the minimum first result during the search process is taken as the knee point. Here, the knee point is a point that is closer to the valley than the near-valley point, and the point lower than the first threshold in the preceding operation may be taken as a near-valley point, e.g., the near-valley point may be a point which is lower than the first threshold for the first time in the preceding operation. The first step size may be a larger step size, and in some examples, the first step size may be 5DAC-15DAC, in one example, the first step size may be 5DAC, 10DAC or 15DAC. Operation S112 is performed after operation S111.

In operation S112, it is determined whether the knee point has been found. If the knee point is not found, the search continues and operation S111 is continued until the knee point is found. After the knee point is found, operation S113 is performed.

In operations S113 and S114, starting from the near-valley point, search with a finer step size (a second step size) may be performed to the left boundary and the right boundary respectively until reaching the left boundary and the right boundary or the counted number for upward trend exceeds a preset number. Here, when a corresponding first result at the target read voltage after a next adjustment is greater than the corresponding first result at the target read voltage after a previous adjustment, one for upward trend is counted. In some examples, the preset number is 3, 4, 5, 6, or 7, in one example, the preset number may be 3, 5, or 7. It should be noted that the positions of operations S113 and S114 may be interchanged. The second step size may be a smaller step size, and in some examples, the second step size may be 2DAC-4DAC, in one example, the second step size may be 2DAC, 3DAC or 4DAC.

When the searches in operations S113 and S114 both satisfy the aforementioned conditions (the boundary is reached or the counted number for upward trend exceeds the preset number), operation S115 is performed.

In operation S115, the adjusted target read voltage corresponding to the minimum first result is taken as the target valley voltage. Operation S116 is performed after operation S115.

In operation S116, it is determined whether the target valley voltage is valid. Here, the way to determine whether the target valley voltage is valid may be: reading data with the target valley voltage, decoding the read data through the memory controller, and when the decode is successful, it indicates whether the target valley voltage is valid. When the determination result in operation S116 is yes, operation S121 is performed; when the determination result in operation S116 is no, operation S117 is performed.

In operation S117, it is determined whether the cycle ends. When the determination result in operation S117 is yes, operation S119 is performed; when the determination result in operation S117 is no, operation S118 is performed.

In operation S118, the next cycle is entered, and the searching continues. Operation S118 may move to operation S107.

In operation S119, it is determined whether the target stage is a high stage. When the determination result in operation S119 is yes, operation S120 is performed; when the determination result in operation S119 is no, operation S121 is performed.

In operation S120, a predicted valley voltage in low stage is obtained in accordance with the target valley voltage in high stage. Here, the predicted valley voltage in low stage may be obtained through the target valley voltage in high stage, the stage number at which the low stage is and the related mapping function (e.g., the aforementioned third mapping function). Operation S121 is performed after operation S120.

In operation S121, it is determined whether corresponding target valley voltages have been determined for read voltages in all stages contained in this page. When the determination result in operation S121 is yes, it indicates that target valley voltages corresponding to read voltages in all stages contained in this page have been determined, and operation S123 may be performed at this point; and when the determination result in operation S121 is no, it indicates that, for the target valley voltages corresponding to read voltages in all stages contained in this page, the target valley voltages in some stages have not been determined, and operation S122 may be performed at this point.

In operation S122, for the stages in which the target valley voltages are not determined, the target valley voltage in each of the stages is determined in sequence. Operation S122 may move to operation S102.

In operation S123, the process of obtaining the target valley voltage ends. It should be noted that after operation S123, the determination of the target valley voltage corresponding to the read voltages in all stages of the next page may be started.

Figure 15A:
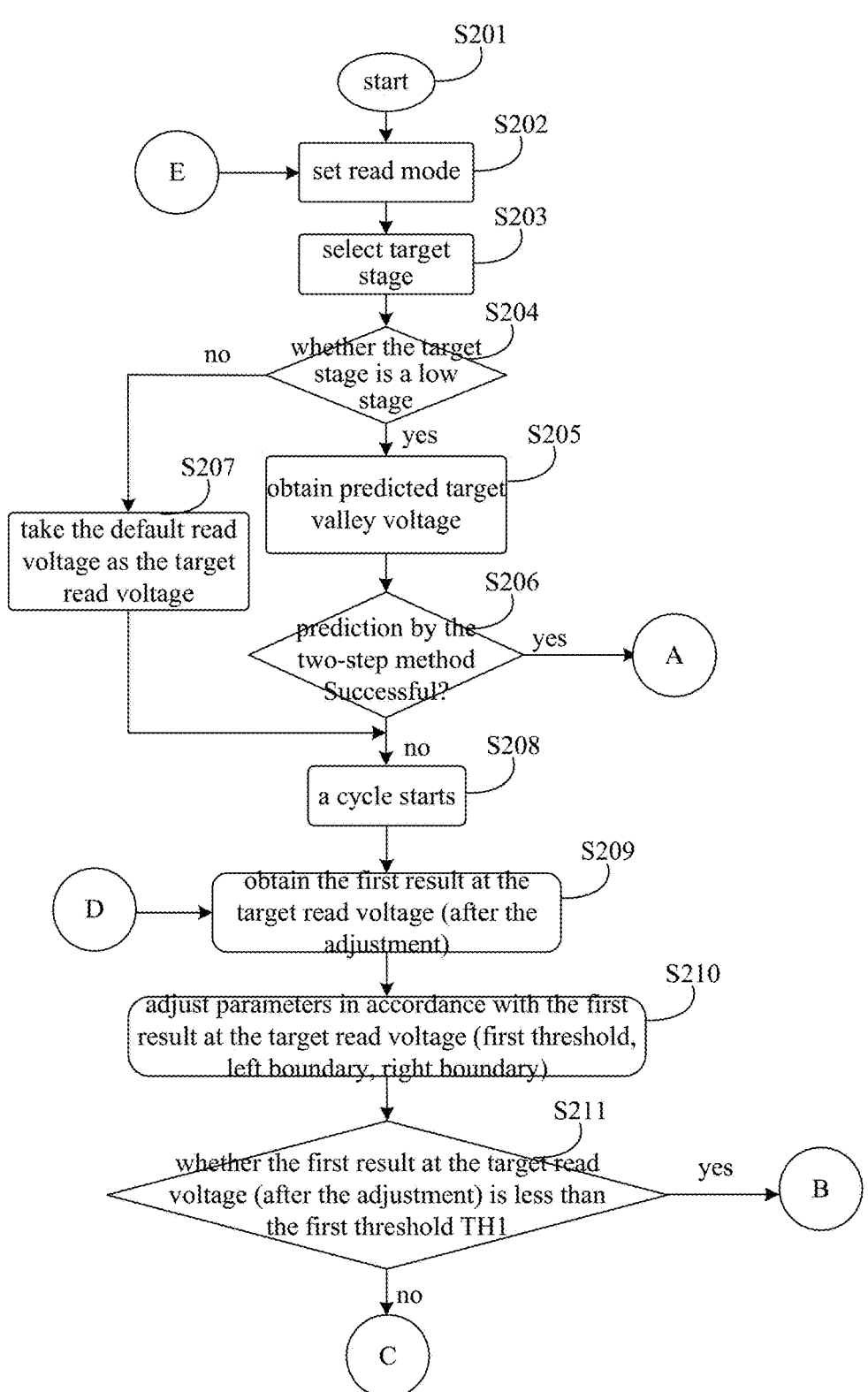
FIGS. 15A-15C are a flowchart of a method for operating a memory device provided by an example of the present disclosure.
Figure 15B:
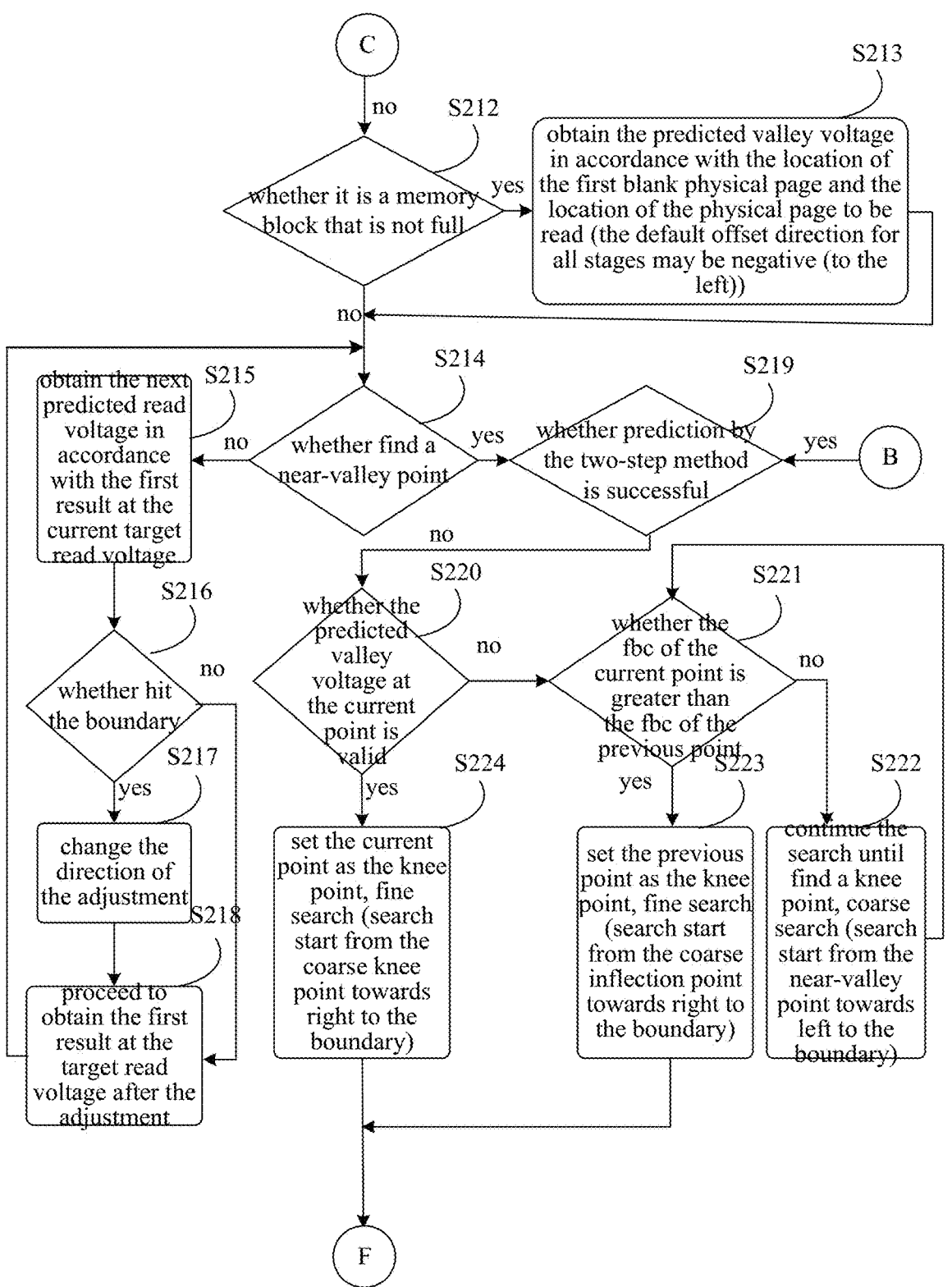
Figure 15C:
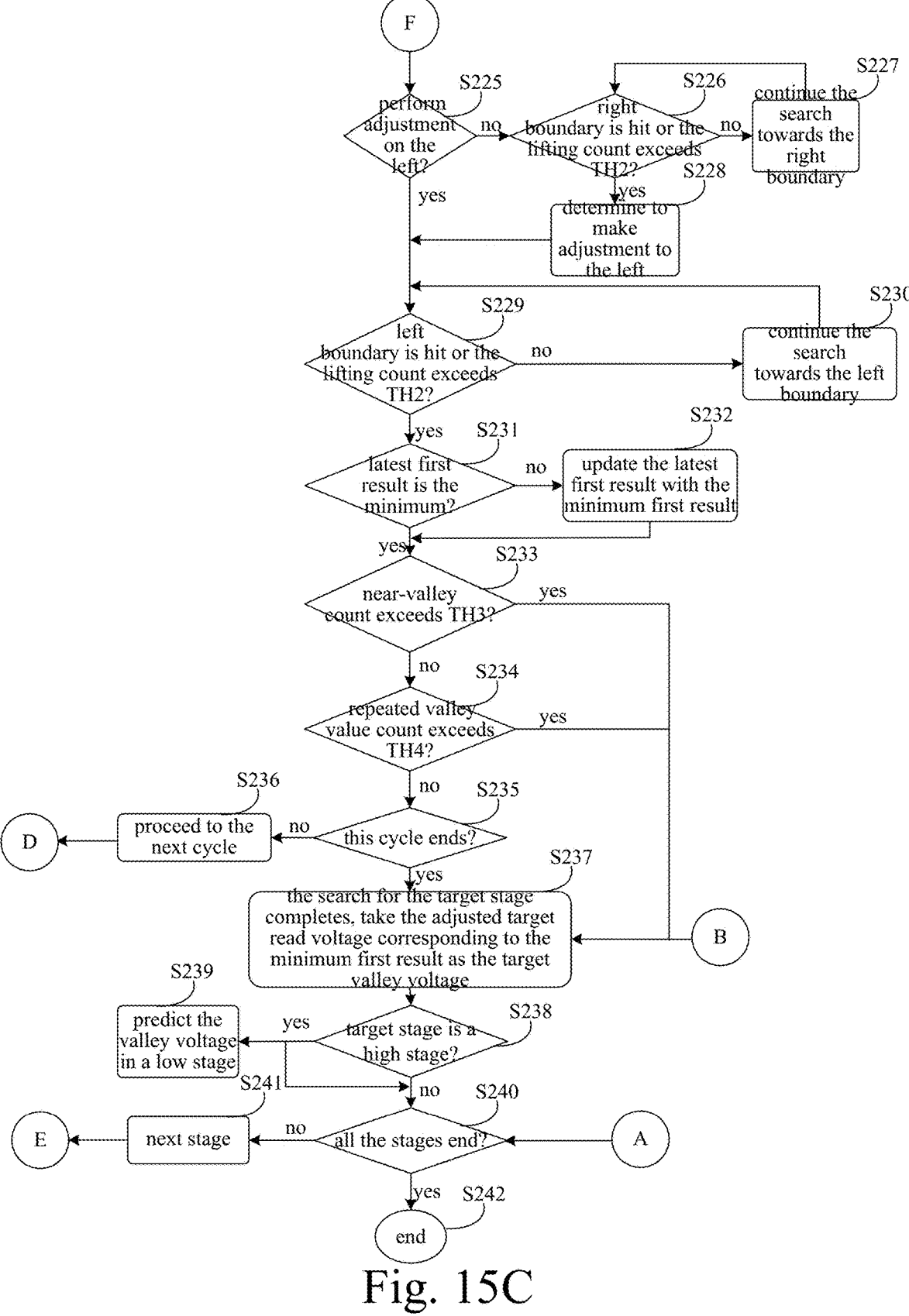

FIGS. 15A-15C are a flowchart of a method for operating a memory device provided by an example of the present disclosure. The process of determining the target valley voltage will be described in detail below through FIGS. 15A-15C.

In operation S201, the program of obtaining the target valley voltage is triggered, and the process of obtaining the target valley voltage is started. Next, operation S202 is performed.

In operation S202, in some examples, the read mode of the memory device is set to a single level read mode; here the single level read mode includes reading at least one bit of the storage data stored in the memory cell through a read voltage in the first stage. Next, operation S203 is performed.

As mentioned above, in accordance with the memory cell including multiple storage bits, the multiple storage bits correspond to multiple pages respectively, and at least one page corresponds to multiple stages. When determining the target valley voltage, the target valley voltage of read voltages in each of the stages among the read voltages in at least one stage corresponding to each of the multiple pages is determined in sequence. In operation S203, one stage is selected from the multiple stages corresponding to one page as the target stage, and the target valley voltage corresponding to the read voltage in the target stage is first determined. For example, taking TLC as an example, the target valley voltages of the first-level read voltage L1 and the fifth-level read voltage L5 corresponding to the lower page is first determined, and one of L1 or L5 may be selected as the target stage. After the target stage is determined, operation S204 is performed.

In operation S204, the type to which the target stage belongs is mainly determined. Here, the target stage may be divided into two categories, the first stage (also referred to as high stage) and the second stage (also referred to as low stage), where the read voltage in the first stage is greater than the read voltage in the second stage. For example, still taking the lower page of TLC as an example, L5 is in the first stage and L1 is in the second stage. If L1 is selected as the target stage in operation S203, the target stage is the second stage, which is the low stage; if L5 is selected as the target stage in operation S204, the target stage is the first stage, which is the high stage. If the target stage is a low stage, operation S205 is performed; if the target stage is a high stage, operation S207 is performed.

In operation S205, the predicted valley voltage is obtained; here, the predicted valley voltage is the predicted valley voltage corresponding to a low stage obtained in accordance with the target valley voltage corresponding to a high stage and the related mapping function. Here and below, the related mapping function may be obtained by fitting a large number of experimental results before the memory device leaves the factory, and is stored in the memory device. Next, operation S206 is performed.

In operation S206, it is determined whether the prediction by the two-step method is successful. Here, the so-called two-step prediction may include the first-step prediction and the second-step prediction, where the first-step prediction is to obtain a predicted valley voltage in high stage, the implementation is to obtain the predicted valley voltage in high stage in accordance with the corresponding first result at the target read voltage (default read voltage), the stage number at which the high stage is, and the fourth mapping function; the second operation of prediction is to obtain the predicted valley voltage in low stage, and the implementation is to obtain the predicted valley voltage in low stage in accordance with the aforementioned predicted valley voltage in high stage, the stage number at which the low stage is and the third mapping function. After the prediction by the two-step method, confirmation of the predicted valley voltage is not performed, and the predicted valley voltage in high stage and the predicted valley voltage in low stage are directly used for hard decode, if the hard decode passes, it indicates that the prediction by the two-step method is successful, at this point, the search for the target valley voltage is directly stopped and operation S245 is performed; if the hard decode fails, it indicates that the prediction by the two-step method fails, at this point, the point corresponding to the predicted valley voltage is taken as the near-valley point for subsequent iterations, and operation S220 is continued. Additional details of operation S220 are provided below.

It should be noted that if the hard decode fails, it indicates that the prediction by the two-step method is unsuccessful, then the target valley voltage is required to be determined through search or also called a cycle (or an iteration), therefore, when the prediction by the two-step method is unsuccessful, a process in a cycle will be entered, after the prediction by the two-step method fails, the search process may be performed directly from the beginning in a cycle, e.g., moving from operation S206 to S208; the point corresponding to the predicted valley voltage may also be directly taken as the near-valley point for subsequent iterations, e.g., moving from operation S206 (S219) to S220.

If the target stage is a high stage, the determine of the target valley voltage in the high stage through search or cycle is prepared. In operation S207, the default read voltage is taken as the target read voltage. Here, the target read voltage may be taken as an initial value for subsequent searches or cycles. In some implementations, the default read voltage may be the read voltage when the threshold voltage of the memory cell does not offset, e.g., the corresponding read voltage when just written in, and the corresponding offset value at this point is 0 DAC. Operation S208 is performed after operation S207.

In operation S208, it is started to determine the target valley voltage by searching or cycling. Operation S209 is performed after operation S208.

For the process of performing a first cycle, in operation S209, the first result at the target read voltage is obtained; it may be understood that for the process of performing subsequent cycles, in operation S209, the first result at the adjusted target read voltage is obtained. Operation S210 is performed after operation S209.

In operation S210, parameters are determined or adjusted in accordance with the first result at the target read voltage, the parameters here may at least include a first threshold, a first boundary voltage (the position corresponding to the first boundary voltage is also referred to as the left boundary) and a second boundary voltage (the position corresponding to the second boundary voltage is also referred to as the right boundary). It may be understood that when performing a read operation, the further the threshold voltage of the memory cell offsets away from the threshold voltage at the time of writing, the first result of read with the target read voltage will generally be higher, based on this, the value of the first result at the default read voltage may be used to confirm the first threshold, and the first threshold represents the change (lifting) in the target valley voltage caused by the offset of the threshold voltage of the memory cell. Here, the initial first boundary voltage and the initial second boundary voltage may be set in accordance with empirical values, etc., for example, a relatively large range of the initial first boundary voltage and an initial second boundary voltage are first set, and then the initial first boundary voltage and the initial second boundary voltage are adjusted in accordance with the first result at the target read voltage, e.g., narrowing the range of a boundary voltage and a second boundary voltage, to obtain the first boundary voltage and the second boundary voltage. Operation S211 is performed after operation S10.

It should be noted that operation S210 is mainly for the process of performing a first cycle, and for the process of performing subsequent cycles, this operation may be skipped.

For performing a first cycle, in operation S211, it is determined whether the first result at the target read voltage is lower than the first threshold; it may be understood that for the process of performing subsequent cycles, in operation S211, it is determined whether the first result at the adjusted target read voltage is lower than the first threshold. When the determination result in operation S211 is yes, it may be considered that the corresponding first result at the adjusted target read voltage at this point may meet the needs of decoding the read data; then, the operations may move to S242, the cycle ends, and the corresponding target valley voltage is output. When the determination result in operation S211 is no, operation S212 of the cycle continues.

In operation S212, it is determined whether the target memory block is not full. Here, the target memory block is the memory block at which at least one code word to be read is located. The memory block that is not full includes a memory block with two data states: program state and erase state. When the determination result in operation S212 is yes, operation S213 is performed; and when the determination result in operation S212 is no, operation S214 is performed.

It should be noted that operation S212 is mainly for the process of performing a first cycle, and for the process of performing subsequent cycles, this operation may be skipped. After skipping this operation, operation S214 is proceeded to be performed.

In operation S213, considering that the offset to the threshold voltage of memory cell in a memory block that is not full is more complicated compared to the offset to the threshold voltage of memory cell in a memory block that is full (a memory block that is full may be understood as a memory block for which the time of writing differs from that of a memory block that is not full with a difference being lower than the preset duration in the same application scenario). Compared with the memory block that is full, the offset to the threshold voltage of memory cell in a memory block that is not full is further related to the position of the first blank physical page in the memory block that is not full (the first blank physical page may be understood as the first physical page in which all the data states are in an erase state appearing in the memory block that is not full according to the program sequence) and the location of the physical page to be read (the physical page at which at least one code word to be read is located). Based on this, the predicted valley voltage may be obtained in accordance with the first offset corresponding to the memory block that is full, the second offset corresponding to the position of the first blank physical page in the memory block that is not full, and the third offset corresponding to the position of the physical page to be read, and then proceed to operation S214. It is to be understood that the obtained predicted valley voltage is more targeted than the blind adjustment of the target read voltage, and the search time may be shortened to a certain extent and the determination of the target valley voltage is faster.

In operation S214, it is determined whether a near-valley point is found. Here, the target read voltage after each adjustment is taken as the abscissa, and the corresponding first result at the corresponding adjusted target read voltage is taken as the ordinate, the abscissa and ordinate may form one point. In the process of making multiple adjustments to the target read voltage, the point corresponding to the first result that is lower than the near-valley threshold for the first time among multiple first results corresponding to multiple adjusted target read voltages may be taken as the near-valley point. The near-valley threshold represents the maximum value among the corresponding first results at the read voltages that is close to the target valley voltage. It should be noted that a difference between the near-valley threshold and the aforementioned first threshold exists, and when the first result is lower than the near-valley threshold, it indicates that a more refined search may be carried out next; and when the first result is lower than the first threshold, it indicates that the search may be considered to be stopped next. When the determination result in operation S214 is yes, operation S219 is performed; and when the determination result in operation S214 is no, operation S215 is performed.

In operation S215, when the near-valley point is not found, operation S215 is started, where in accordance with the corresponding first result at the target read voltage after the previous adjustment and the related mapping function (e.g., the aforementioned second mapping function), the predicted read voltage after next adjustment is obtained, that is, an iteration for prediction is performed with the aforementioned prediction equation or mapping function. Operation S216 is performed after operation S215.

In operation S216, it is determined whether the obtained predicted read voltage after next adjustment hits the boundary. The boundary here may be one of the aforementioned left boundary or right boundary, and hitting the boundary may be understood as being exactly on the boundary, or beyond the boundary. When the determination result in operation S216 is yes, operation S217 is performed; and when the determination result in operation S216 is no, operation S218 is performed.

In operation S217, the adjustment direction is changed. Here, in the process of making an adjustment to the target read voltage, there are two adjustment directions which are positive (to the right) and negative (to the left). Adjusting the offset direction may be understood as adjusting to the right before, and then starting to adjust to the left after hitting the right boundary; or adjusting to the left before, and starting to adjust to the right after hitting the left boundary. Operation S218 is performed after operation S217.

In operation S218, a first result at the adjusted target read voltage is obtained. After operation S218, operation S214 is performed; in other words, after each adjustment to the target voltage is made and the corresponding first result is obtained, a continued determination as to whether the latest adjustment point is a near-valley point is made. Here, one or more adjustments are made until the near-valley point is found.

It should be noted that if the next cycle is entered because the subsequent conditions are not met during the operations after finding the near-valley point, operations S215 to S218 may be skipped.

In operation S219, referring to the description of operation S206, in the process of entering a cycle when the prediction by the two-step method is unsuccessful, the point corresponding to the predicted valley voltage may also be directly taken as the near-valley point for subsequent iterations, e.g., moving from operation S219 to S220.

In operation S220, it is determined whether predicted valley voltage at the current point (the latest adjusted target read voltage) is valid. In some examples, it may be determined that the predicted valley voltage is valid by the fact that the corresponding first result at the latest adjusted target read voltage is lower than the first threshold. It should be noted that although in operation S211, when the first result at the (adjusted) target read voltage is not lower than the first threshold, operation S212 and subsequent operations are entered; but before the determination result in operation S214 is yes, at least one adjustment has been made to the target read voltage; thus, at this point, the new adjusted target read voltage may be lower than the first threshold. When the determination result in operation S220 is yes, operation S224 is performed; when the determination result in operation S220 is no, operation S221 is performed.

In operation S221, it is determined whether the first result FBC of the current point is greater than the FBC of the previous point. Here, after finding the near-valley point and starting to perform a coarse search for the knee point to the left, generally the magnitude of FBC may first decrease and then increase, and when the first result FBC of the current point is greater than the FBC of the previous point, it indicates that FBC may further increase during the subsequent adjustment to the left, and the previous point is a relatively small point; at this point, the previous point is set as the knee point. In some examples, the step size used in the coarse search may be a larger step size, e.g., it may be 5DAC-15DAC, in one example, it may be 5DAC, 10DAC or 15DAC. Based on this, when the determination result in operation S221 is yes, operation S223 is performed; and when the determination result in operation S221 is no, operation S222 is performed.

In operation S222, a coarse search is performed to the left starting from the near-valley point, and after each search, the FBC is compared with the FBC of the previous search until a point is found at which the decrease stops and the increase starts. After finding this point, it indicates that operation S222 has been completed and then move to operation S223.

In operation S223, the previous point (e.g., the aforementioned point at which the decrease stops and the increase starts) is set as a knee point, and a fine search starts from the knee point to the right. In some examples, the step size used in the fine search may be a small step size, e.g., it may be 1DAC-4DAC, in one example, it may be 2DAC or 3DAC. Operation S225 is performed after operation S223.

In operation S224, the current point is set as the knee point, and a fine search starts from the knee point to the right. In some examples, the step size used in the fine search may refer to operation S223. Operation S225 is performed after operation S224.

In operation S225, it is determined whether to adjust the target read voltage to the left. When the determination result in operation S225 is yes, operation S229 is performed; when the determination result in operation S225 is no, operation S226 is performed.

In operation S226, the target read voltage is adjusted to the right, and in the process of adjusting the target read voltage to the right, it is determined whether the right boundary is hit or the count for lifting upward (or count of upward trends, where when a corresponding first result at the target read voltage after a next adjustment is greater than the corresponding first result at the target read voltage after a previous adjustment, one for upward trend is counted) exceeds the preset number TH2. In some examples, the preset number is 3, 4, 5, 6, or 7, in one example, the preset number of may be 3, 5, or 7. When the determination result in operation S226 is yes, operation S228 is performed; when the determination result in operation S226 is no, operation S227 is performed.

In operation S227, when the right boundary is not hit or the count for lifting upward does not exceed the preset number TH2, the search continues to the right boundary, and a determination is made after each search until the right boundary is hit or the count for lifting upward exceeds the preset number TH2. That is to say, when operation S227 is completed, the operations may move to operation S228.

In operation S228, the target read voltage starts to be adjusted to the left.

In operation S229, during the process of adjusting the target read voltage to the left, it is determined whether the left boundary is hit or the count is lifted. The count for lifting upward here may be understood with reference to the aforementioned operation S226. The thresholds for left and right count for lifting upwards are generally set to the same value. When the determination result in operation S229 is yes, operation S231 is performed; and when the determination result in operation S229 is no, operation S230 is performed.

In operation S230, when the left boundary is not hit or the count for lifting upward does not exceed the preset number TH2, the search continues to the left boundary, and a determination is made after each search until the left boundary is hit or the count for lifting upward exceeds the preset number TH2. That is to say, when operation S230 is completed, the operations may move to operation S231.

In operation S231, it is determined whether the latest first result is the minimum. Here, the latest first result refers to whether the first result at the adjusted target read voltage after the last adjustment to the target read voltage is the minimum. At this point, it is necessary to traverse at least all the searched points in this cycle to find the adjusted target read voltage corresponding to the point with the minimum first result. When the determination result in operation S231 is yes, operation S233 is performed; and when the determination result in operation S231 is no, operation S232 is performed.

In operation S232, the latest first result is updated with the found minimum first result. Operation S233 is performed after operation S232.

In operation S233, it is determined whether the near-valley count exceeds the preset number TH3. Here, taking the minimum first result among multiple corresponding first results at the target read voltages after multiple adjustments as a reference value, when the number of first results from remaining first results which differ from the reference value with a difference being less than a second threshold (equal to the aforementioned preset difference) is greater than a preset number, searching is stopped and the target read voltage corresponding to the minimum first result among the multiple first results is taken as the target valley voltage. In some examples, a second threshold (equal to the aforementioned preset difference) and the preset quantity may be set together according to the actual situation, generally, if the second threshold (equal to the aforementioned preset difference) is set slightly larger, the preset quantity will be relatively larger; and if the second threshold (equal to the aforementioned preset difference) is set slightly smaller, the preset quantity will also be relatively smaller. When the determination result in operation S233 is yes, the search is stopped and operation S237 is performed; when the determination result in operation S233 is no, enter the next determination and operation S234 is performed.

In operation S234, it is determined whether the valley value being counted repeatedly exceeds the preset count TH4. Here, in the process of making multiple adjustments to the target read voltage, different adjustment methods may be employed for adjustment, in accordance with the adjusted target read voltage corresponding to more than preset number of adjustment methods among different adjustment methods is the same, and the corresponding first result at the same target read voltage is the minimum value among all first results, the same target read voltage is taken as the target valley voltage. In some examples, the preset number is 2-4, in one example, the preset number may be 2, 3, or 4. When the determination result in operation S234 is yes, the search is stopped and operation S237 is performed; when the determination result in operation S234 is no, the next determination is entered and operation S235 is performed.

It should be noted that operation S233 and operation S234 belong to different determination methods, and the positional relationship between them may be interchanged, that is to say, the valley value which are counted repeatedly may be first determined, and then a near-valley count may be determined if the repeated valley count does not meet the conditions. It is understood that other determinations may also be performed here to determine whether the cycle ends.

In operation S235, it is determined whether the cycle ends. When the determination result in operation S235 is yes, operation S237 is performed; and when the determination result in operation S235 is no, operation S236 is performed.

In operation S236, the next cycle is entered and searching continues. Operation S236 may move to operation S209.

In operation S237, the target stage search is completed, the adjusted target read voltage corresponding to the minimum first result is taken as the target valley voltage. Operation S238 is performed after operation S237.

In operation S238, it is determined whether the target stage is a high stage. When the determination result in operation S238 is yes, operation S239 is performed; and when the determination result in operation S238 is no, operation S240 is performed.

In operation S239, a predicted valley voltage in low stage is obtained in accordance with the target valley voltage in high stage. Here, the predicted valley voltage in low stage may be obtained through the target valley voltage in high stage, the stage number at which the low stage is and the related mapping function (e.g., the aforementioned fourth mapping function). Operation S240 is performed after operation S239.

In operation S240, it is determined whether corresponding target valley voltages have been determined for read voltages in all stages contained in this page. When the determination result in operation S240 is yes, it indicates that target valley voltages corresponding to read voltages in all stages contained in this page have been determined, and operation S242 may be performed at this point; and when the determination result in operation S240 is no, it indicates that, for the target valley voltages corresponding to read voltages in all stages contained in this page, the target valley voltages in some stages have not been determined, and operation S241 may be performed at this point.

In operation S241, for the stages in which the target valley voltages are not determined, the target valley voltage in each of the stages is determined in sequence. Operation S236 may move to operation S202.

In operation S242, the process of obtaining the target valley voltage ends. It should be noted that after operation S242, the determination of the target valley voltage corresponding to the read voltages in all stages for the next page may be started.

It should be noted that the methods disclosed in the examples of the present disclosure are able to solve many problems existing in the read retry operation, but are not used to limit the application scenarios in the examples of the present disclosure, and the methods disclosed in the examples of the present disclosure are also applicable to conventional read operations.

Figure 16:
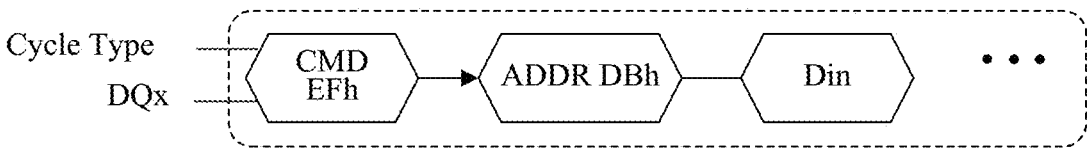
FIG. 16 is timing diagram for enabling an example single level read mode operation provided by this application.

FIG. 16 is an example timing diagram for starting a single level read mode operation provided by this application. DQx may be represented as a data bus signal, and Cycle Type may further represent the type of data bus signal.

As shown in FIG. 16, the set function command may include, e.g., a subcommand (e.g., EFh), in one example, the memory device starts the single level read mode upon receiving a subcommand EFh. In the single level read mode, the memory device transmits the address ADDR of the data to be read (e.g., two column addresses C1 to C2 and three row addresses R1 to R3) between received subcommands 00h and 30h. During the reading time, the corresponding data DATA (e.g., Dn) in the page of the receiving address may be buffered in the page buffer, and then the data DATA will be read on demand. It should be noted that in the example described above, transmission of the data corresponding to one physical page (e.g., Dn) needs to be frequently performed (Din/Dout) between the memory device and the memory controller when performing a read retry operation, and transmission of the data consumes a long time.

Figure 17:
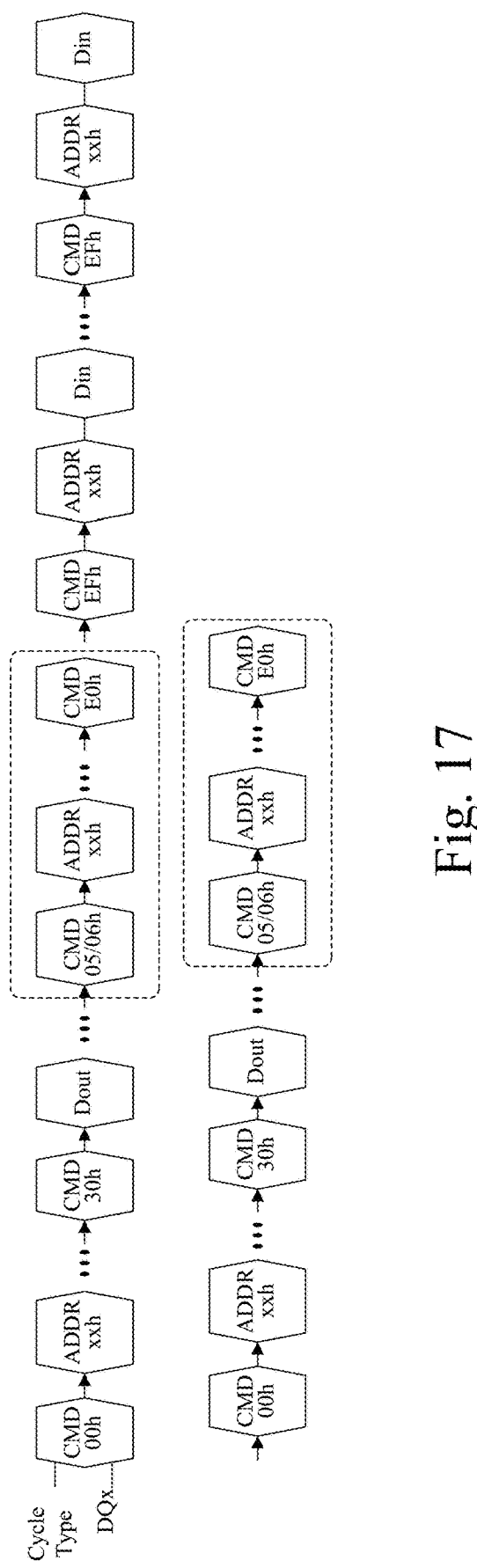
FIG. 17 is a timing diagram of predicting the valley voltage/target valley voltage and performing the read operation provided by an example of the present disclosure.

FIG. 17 is a timing diagram for determining the target valley voltage and performing a read operation provided by an example of the present disclosure. As shown in FIG. 17, the read command may include, e.g., two subcommands (e.g., 00h and 30h), and in one example, the memory device transmits the address ADDR of the data to be read (e.g., two column addresses C1 to C2 and three row addresses R1 to R3) between received subcommands 00h and 30h. After the memory device receives the subcommand 30h, during the reading time, the corresponding data DATA (e.g., Dn) in the page of the received address may be buffered in the page buffer, and then the data DATA will be read on demand. In an example, the memory device 104 transmits the address ADDR of the data to be read (e.g., two column addresses C1 to C2 and three row addresses R1 to R3) between received subcommands 00h and 30h. The memory device 104, after receiving the sub-command 30h, receives the sub-commands EFh and xxh of the first second instruction/the second instruction, the memory device 104 obtains first result corresponding to the code word at respective read voltage as indicated by the first second instruction/the second instruction, and sends the obtained first result to the memory controller. The memory controller determines a target valley voltage in accordance with the multiple first results corresponding to multiple different read voltages received from the memory device respectively; and perform a read operation on data stored in the memory device in accordance with the target valley voltage.

As shown in FIG. 17, in some examples, the first instruction/second instruction includes subcommands 05/06h and E0h, and in the process of determining the target valley voltage, there are only two timings for the subcommands 05/06h and E0h at most. In an example, one subcommand 05/06h and E0h means to control at least one code word of the memory device to perform one read operation, and to perform an error correction decode operation on the read result of the one read operation, in the process of determining the target valley voltage, one read operation may be performed at most twice, and then two error correction decode operations may be performed at most, the decoding of at least one code word may be achieved with the minimum number of iterations (up to 2), thereby greatly improving decode efficiency.

In some examples, the memory controller 106 is configured to: send a first instruction including subcommands 05/06h and E0h to instruct the memory device to perform a first read operation; the memory device 104 is configured to: receive the first instruction, perform a first read operation in accordance with the predicted valley voltage in the information representing the predicted valley voltages in the multiple stages; and send the obtained information representing the first read result of the first read operation to the memory controller; the memory controller 106 is further configured to: perform a second error correction decode operation on the first read result of the first read operation.

In some examples, the memory controller 106 is configured to: output the first read result in accordance with the success of the first error correction decode; or, in accordance with the failure of the first error correction decode, send a second instruction including subcommands 05/06h and E0h to instruct the memory device to perform a second read operation; the memory device 104 is configured to: receive the second instruction, perform a second read operation with the predicted valley voltage in the reobtained information representing the predicted valley voltages in the multiple stages; and send the obtained information representing the second read result of the second read operation to the memory controller; the memory controller 106 is further configured to: perform a second error correction decode operation on the second read result of the second read operation. It should be noted that the second instruction provided in the example of the present disclosure is only an example and should not unduly limit the claimed scope of the present disclosure. In some examples, the data amount of the first result is lower than the threshold for the preset data amount, e.g., the data amount of the first result ranges from 1 byte to 4 byte, therefore, in the process of determining the target valley voltage, the data transferred between the memory device and the memory controller is in a small amount and at a fast speed, which is beneficial to improve the overall speed of the read operation.

Figure 18:
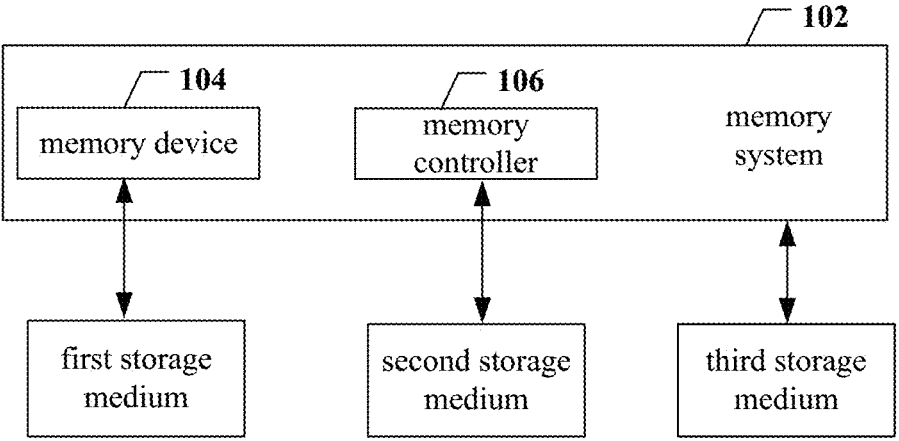
FIG. 18 is a schematic structural diagram of a storage medium provided by an example of present disclosure.

Referring to FIG. 18, FIG. 18 is a schematic structural diagram of a storage medium provided by an example of present disclosure. In a seventh aspect, an example of the present disclosure provides a storage medium, as shown in FIG. 18, executable instructions are stored on the storage medium, and the executable instructions, when executed by a processor, implement the operations of any one of the operating methods provided by the fourth aspect, the fifth aspect and the sixth aspect.

In some examples, the storage medium may be memory such as Ferromagnetic Random-Access Memory (FRAM), Read Only Memory (ROM), Programmable Read-Only Memory (PROM), Erasable Programmable Read-Only Memory (EPROM), Electrically Erasable Programmable Read-Only Memory (EEPROM), Flash Memory, Magnetic Surface Memory, Optical Disk, or Compact Disc Read-Only Memory (CD-ROM); or may also be various devices including one or any combination of the memory devices described above.

In some examples, executable instructions may take the form of a program, software, software module, script, or code, written in any form of programming language (including compiled or interpreted languages, or declarative or procedural languages), and may be deployed in any form, including as a stand-alone program or as a module, component, subroutine, or other unit suitable for use in a computing environment.

As an example, executable instructions may, but do not necessarily correspond to, files in a file system, and may be stored as part of a file holding other programs or data, e.g., one or more scripts stored in a HyperText Markup Language (HTML) document, stored in a single file specific to the program discussed, or stored in multiple collaborative files (e.g., a file that stores one or more modules, subroutines, or portions of code).

As examples, executable instructions may be deployed to execute on one electronic device, or on multiple electronic devices located at one location, or to execute on multiple electronic devices distributed across multiple locations and interconnected by a communications network.

FIG. 18 is a schematic structural diagram of a storage medium provided by an example of present disclosure; the storage medium includes a first storage medium corresponding to the memory device 104, a second storage medium corresponding to the memory controller 106, and a third storage medium corresponding to the memory system 102; when the executable instructions are executed by the memory device, the first storage medium may be used to implement the operations of the method for operating the memory device in the examples of the present disclosure described above; when the executable instructions are executed by the memory controller, the second storage medium may be used to implement the operations of the method for operating the memory controller in the examples of the present disclosure described above; when the executable instructions are executed by the memory system, the third storage medium may be used to implement the operations of the method for operating the memory system in the examples of the present disclosure described above.

In some examples, a method for operating a memory device includes: obtaining a predicted valley voltage in the first stage in accordance with the corresponding first result at the target read voltage in the first stage; the first result includes the number of bits in the at least one code word formed by a preset number of the memory cells in the memory device which are flipped in two read results at a first read voltage and a second voltage; the difference between the first read voltage and the second read voltage is lower than a preset voltage; the memory cell including multiple storage bits, and the multiple storage bits corresponding to multiple pages respectively; at least part of the pages corresponding to multiple stages, the multiple stages including the first stage and the second stage, and a read voltage in the second stage is lower than a read voltage in the first stage; obtaining the predicted valley voltage in the second stage in accordance with the predicted valley voltage in the first stage; and performing a first read operation on at least one code word with the predicted valley voltage in the first stage and the predicted valley voltage in the second stage.

In some examples, a method for operating a memory system includes: sending, by a memory controller in the memory system, a first instruction, where the first instruction indicates to obtain information representing target valley voltages in multiple stages; receiving, by the memory device in the memory system, the first instruction, and obtaining information representing the predicted valley voltages in multiple stages in accordance with the method for operating any of the memory device provided in the fourth aspect, and sending the information representing the predicted valley voltages in the multiple stages to the memory controller; controlling, by the memory controller, the memory device to perform a first read operation with the information which represents the predicted valley voltages in the multiple stages, and performing a first error correction decode operation on the first read result of the first read operation.

In some examples, a method for operating a memory controller includes: obtaining a predicted valley voltage in a first stage in accordance with a corresponding first result at a target read voltage in the first stage; the first result includes the number of bits in the at least one code word formed by a preset number of the memory cells in at least one memory device coupled to the memory controller flipped in two read results at a first read voltage and a second read voltage; the difference between the first read voltage and the second read voltage is lower than a preset voltage; the memory cell including multiple storage bits, and the multiple storage bits corresponding to multiple pages respectively; at least part of the pages corresponding to multiple stages, the multiple stages including the first stage and the second stage, and a read voltage in the second stage is lower than a read voltage in the first stage; obtaining the predicted valley voltage in the second stage in accordance with the predicted valley voltage in the first stage; and controlling the memory device to perform a first read operation with the predicted valley voltage in the first stage and the predicted valley voltage in the second stage, and perform a first error correction decode on the first read result of the first read operation.

Figure 19A:
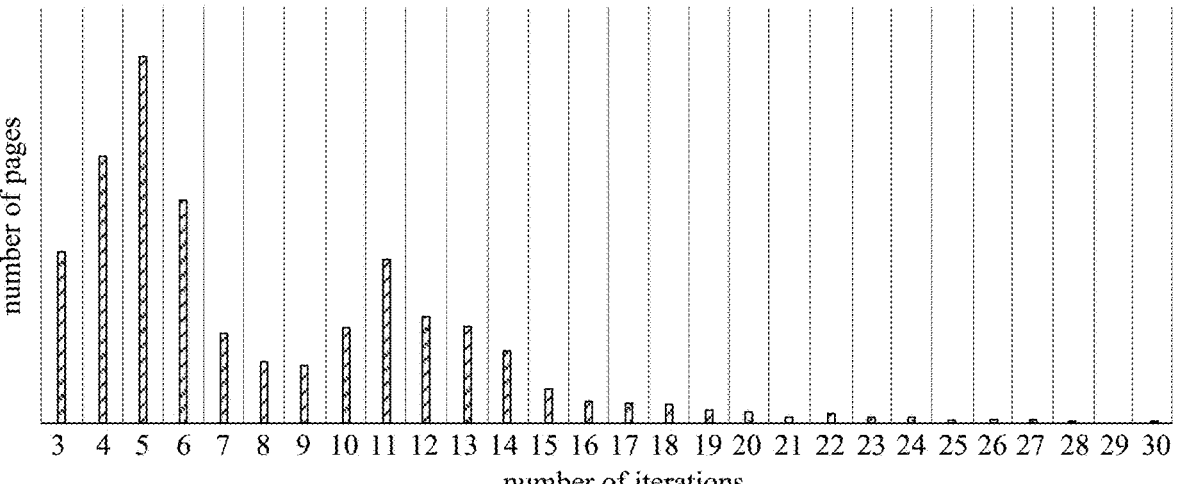
FIG. 19A shows statistics of the number of iterations for all pages at the block level in the array of memory cells of a first example memory system/memory device provided by the example of the present disclosure using the memory system/memory device provided by the example of the present disclosure.
Figure 19B:
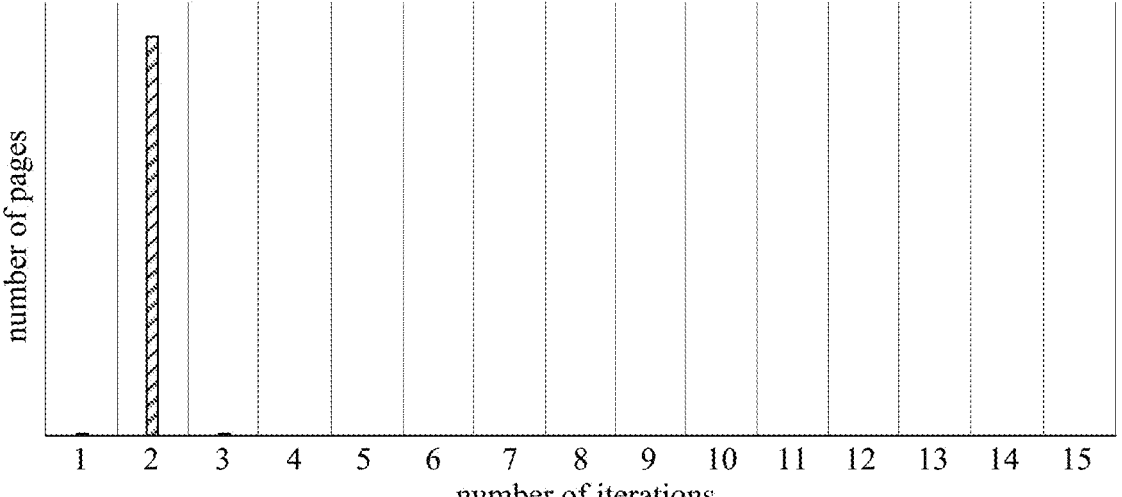
FIG. 19B shows statistics of the number of iterations for all pages at the block level in the array of memory cells of a second example memory system/memory device provided by the example of the present disclosure using the memory system/memory device provided by the example of the present disclosure.

FIG. 19A shows statistics of the number of iterations for all pages at the block level in the array of memory cells of the first example memory system/memory device provided by the example of the present disclosure using a memory system/memory device provided by the example of the present disclosure; FIG. 19B shows statistics of the number of iterations for all pages at the block level in the array of memory cells of the memory system/memory device provided by the example of the present disclosure using a second example memory system/memory device provided by the example of the present disclosure. As shown in FIGS. 19A and 19B, compared with the average number of iterations (understood as the number of iterations of the error correction decode algorithm) in the first example memory system/memory device, which is approximately 8.07, the average number of iterations (understood as the number of iterations of the error correction decode algorithm) in the second example memory system/memory device provided by an example of the present disclosure is approximately 2.01, the number of transmissions at the input/output (I/O) ports of the memory device and/or the number of error correction decode operations of the memory controller is reduced, the number of iterations of the memory controller error correction (Low-density parity-check code, LDPC code) decode algorithm is saved, and the error correction decode is faster.

In a memory device and its operating method, and a memory system and its operating method provided by examples of the present disclosure, by transmitting a first result (size of the first result may be several bytes) instead of at least one code word (e.g. the size of the code word may be 4 KB), the amount of data transferred by the memory device is reduced; the process of obtaining the first result is converged inside the memory device and does not occupy space of, e.g., a memory controller, and is less dependent on, e.g., a memory controller; the transmission time of the input and output ports of the memory device and/or the time of the error correction decode operation of the memory controller is reduced; saves the iteration time of the memory controller error correction decode algorithm is saved, and the error correction decode speed is faster; therefore suitable for MLC, TLC or QLC type memory devices/memory systems.

The memory device and its operating method, the memory system and its operating method provided by the examples of the present disclosure are able to effectively avoid the problems of long time consumption and incomplete scene coverage caused by using the retry table, and to save the space occupied by the retry table, find the target valley voltage more quickly and accurately, thereby effectively reducing the time delay in determining the target valley voltage. Meanwhile performing read operations at the obtained target valley voltage greatly increases the probability of correctly reading the storage data, thereby improving product reliability and user experience.

It should be understood that baseline throughout the description to "one example" or "an example" means that a particular feature, structure or characteristic related to the example is included in at least one example of the present disclosure. Thus, appearances of "in one example" or "in an example" in various places throughout the description are not necessarily referring to a same example. Furthermore, these particular features, structures or characteristics may be combined in any appropriate manner in one or more examples. It should be understood that in various examples of the present disclosure, sequence numbers of the processes described above do not mean the execution order, and the execution order of each process should be determined by its function and internal logic, and should not constitute any limitation to implementation process of examples of the present disclosure. The serial numbers of examples of the present disclosure described above are for the purpose of description only, and do not represent the advantages and disadvantages of the examples.

The above is only a preferred example of the present disclosure, and does not limit the patent scope of the present disclosure, and under the inventive concept of the present disclosure, any equivalent structural transformation made by using content of the present disclosure and the accompanying drawings, or direct/indirect application in other related technical fields are included in the patent protection scope of the present disclosure.

INDUSTRIAL APPLICABILITY

The memory device and its operating method, the memory system and its operating method provided by the examples of the present disclosure are able to effectively avoid the problems of long time consumption and incomplete scene coverage caused by using the retry table, and to save the space occupied by the retry table, find the target valley voltage more quickly and accurately, thereby effectively reducing the time delay in determining the target valley voltage. Meanwhile performing read operations at the obtained target valley voltage greatly increases the probability of correctly reading the storage data, thereby improving product reliability and user experience.

What is claimed is:

1. A memory device, comprising:
an array of memory cells including a memory cell with multiple storage bits, wherein a preset number of memory cells form one code word, and the multiple storage bits correspond to multiple pages respectively; and wherein at least part of the pages corresponds to multiple stages, the multiple stages include a first stage and a second stage, and a read voltage in the second stage is lower than the read voltage in the first stage;
peripheral circuit coupled to the array of memory cells and configured to:
obtain a predicted valley voltage in the first stage in accordance with a corresponding first result at a target read voltage in the first stage; wherein the first result includes the number of bits of at least one code word which are flipped in two read results at a first read voltage and a second read voltage; and wherein a difference between the first read voltage and the second read voltage is lower than a preset voltage;
obtain a predicted valley voltage in the second stage in accordance with the predicted valley voltage in the first stage; and
perform a first read operation on the at least one code word with the predicted valley voltage in the first stage and the predicted valley voltage in the second stage.

2. The memory device of claim 1, wherein the peripheral circuit is configured to:
take both the predicted valley voltage in the first stage and the predicted valley voltage in the second stage as initial target read voltages;
obtain a corresponding first result at the initial target read voltage; and determine the initial target read voltage to be a target valley voltage in accordance with the corresponding first result at the initial target read voltage meeting a preset condition; or make at least one adjustment to the initial target read voltage, and obtain a corresponding first result at the target read voltage after each adjustment; determine the adjusted target read voltage to be a target valley voltage in accordance with the corresponding first result at the adjusted target read voltage meeting a preset condition; and perform a second read operation on the at least one code word in accordance with the target valley voltage.

3. The memory device of claim 1, wherein the peripheral circuit is configured to:

take the predicted valley voltage in the first stage as an initial target read voltage, and obtain a corresponding first result at the initial target read voltage; determine the initial target read voltage to be a target valley voltage in accordance with the corresponding first result at the initial target read voltage meeting a preset condition; or make at least one adjustment to the initial target read voltage, and obtain a corresponding first result at the adjusted target read voltage after each adjustment; determine a target valley voltage in accordance with the corresponding first result at the adjusted target read voltage meeting a preset condition;

obtain the predicted valley voltage in the second stage in accordance with the determined target valley voltage in the first stage; and perform a second read operation on the at least one code word in accordance with the determined target valley voltage in the first stage and the predicted valley voltage in the second stage.

4. The memory device of claim 1, wherein each of the multiple pages includes multiple second stages;

the peripheral circuit is configured to:

obtain the predicted valley voltage in the second stage corresponding to the highest read voltage among read voltages in the multiple second stages for each of the pages in accordance with the predicted valley voltage in the first stage or a target valley voltage in the first stage for each of the pages; and obtain the predicted valley voltage in the second stage corresponding to a lower read voltage than a read voltage in an adjacent second stage, in accordance with the predicted valley voltage in the second stage corresponding to a higher read voltage among read voltages in the multiple second stages for each of the pages in sequence, until the predicted valley voltage in each of the second stages for each of the pages is obtained.

5. The memory device of claim 1, wherein the peripheral circuit is configured to:

obtain the predicted valley voltage in the second stage in accordance with the predicted valley voltage in the first stage or the target valley voltage in the first stage and a first mapping function, wherein the first mapping function represents a relationship between the predicted valley voltage in the first stage or a target valley voltage in the first stage and the predicted valley voltage in the second stage.

6. The memory device of claim 2, wherein the peripheral circuit is configured to:

in a process of making at least one adjustment to the initial target read voltage, take the initial target read voltage as a baseline value;

starting from the baseline value, making adjustments in two opposite directions with a step size being smaller than a first preset step size, in a process of making adjustments in each direction, count one for upward trend in accordance with the corresponding first result at a read voltage after a next adjustment being greater than the corresponding first result at a read voltage after a previous adjustment, and determine a first voltage boundary and a second voltage boundary with a total counted number being greater than or equal to a preset number; and in a process of making adjustments in two directions, if the corresponding first result at the target read voltage after one adjustment is lower than a first threshold, or taking the minimum first result among multiple first results corresponding to target read voltages after multiple adjustments as a reference value, when the number of first results from remaining first results which differ from the reference value with a difference being less than a second threshold is greater than a preset number, stop the adjustments and take the target read voltage corresponding to the minimum first result among the multiple first results as the target valley voltage.

7. The memory device of claim 6, wherein the peripheral circuit is configured to:

in the process of making adjustments in two directions, take the corresponding adjusted target read voltages as the first voltage boundary and the second voltage boundary respectively in accordance with the total counted number being equal to the preset number;

in the process of making adjustments in two directions, if the first voltage boundary and the second voltage boundary have been determined, take the target read voltage for the last adjustment as an average of the first voltage boundary and the second voltage boundary; and take the read voltage corresponding to the minimum first result among the multiple corresponding first results at all the adjusted target read voltages as the target valley voltage.

8. The memory device of claim 1, wherein the peripheral circuit is configured to:

obtain the predicted valley voltage in the first stage in accordance with the corresponding first result at the target read voltage in the first stage, a stage number associated with the first stage, and a second mapping function; wherein the second mapping function represents a relationship between the corresponding first result at the target read voltage, a respective stage number associated with each stage, and the predicted valley voltage.

9. The memory device of claim 1, wherein the peripheral circuit is configured to:

read storage data of the at least one code word at the first read voltage to obtain a second result;

read storage data of the at least one code word at the second read voltage to obtain a third result;

perform a logical operation on the second result and the third result to obtain a fourth result; and count the number of bits in the fourth result that represent flip of bits in the third result relative to the second result to obtain the first result.

10. The memory device of claim 9, wherein the peripheral circuit includes:

a first latch configured to: store the second result;

a second latch configured to: store the third result; and a third latch configured to: store the fourth result.

11. A memory system, including:

one or more memory device, the memory device comprising:

an array of memory cells including a memory cell with multiple storage bits, wherein a preset number of memory cells form one code word, and the multiple storage bits correspond to multiple pages respectively; and wherein at least part of the multiple pages corresponds to multiple stages, the multiple stages include a first stage and a second stage, and a read voltage in the second stage is lower than a read voltage in the first stage;

peripheral circuit coupled to the array of memory cells and configured to:

obtain a predicted valley voltage in the first stage in accordance with a corresponding first result at a target read voltage in the first stage; wherein the first result includes the number of bits of at least one code word which are flipped in two read results at a first read voltage and a second read voltage; and wherein a difference between the first read voltage and the second read voltage is lower than a preset voltage;

obtain a predicted valley voltage in the second stage in accordance with the predicted valley voltage in the first stage; and perform a first read operation on the at least one code word with the predicted valley voltage in the first stage and the predicted valley voltage in the second stage; and a memory controller coupled to the memory device and controlling the memory device.

12. The memory system of claim 11, wherein the memory controller is configured to: send a first instruction, wherein the first instruction indicates to obtain information representing target valley voltages in multiple stages;

the memory device is configured to: receive the first instruction, obtain information representing the predicted valley voltages in multiple stages, and send the obtained information representing the predicted valley voltages in multiple stages to the memory controller; and the memory controller is further configured to: control the memory device to perform a first read operation with the predicted valley voltage in the information representing the predicted valley voltages in multiple stages, and perform a first error correction decode operation on a first read result of the first read operation.

13. The memory system of claim 12, wherein the memory controller is configured to:

output the first read result in accordance with a success of the first error correction decode; or send a second instruction in accordance with a failure of the first error correction decode, wherein the second instruction indicates to reobtain the information representing the target valley voltages in the multiple stages;

the memory device is configured to:

receive the second instruction, redetermine the target valley voltages in the multiple stages, and send second information representing the target valley voltages to the memory controller; and the memory controller is further configured to:

control the memory device to perform a second read operation with the target valley voltage in the second information, and perform a second error correction decode operation on a second read result of the second read operation.

14. A memory controller, comprising:

a control component configured to:

obtain a predicted valley voltage in a first stage in accordance with a corresponding first result at a target read voltage in the first stage; wherein the first result includes a number of bits of at least one code word formed by a preset number of memory cells which are flipped in two read results at a first read voltage and a second read voltage; wherein a difference between the first read voltage and the second read voltage is lower than a preset voltage; and wherein the memory controller is coupled to at least one memory device; wherein the memory device includes a memory cell with multiple storage bits, and the multiple storage bits correspond to multiple pages respectively; wherein at least part of the multiple pages correspond to multiple stages; wherein the multiple stages include the first stage and a second stage, and a read voltage in the second stage is lower than the read voltage in the first stage;

obtain a predicted valley voltage in the second stage in accordance with the predicted valley voltage in the first stage; and control the memory device to perform a first read operation with the predicted valley voltage in the first stage and the predicted valley voltage in the second stage, and perform a first error correction decode on a first read result of the first read operation.

15. The memory controller of claim 14, wherein the control component is configured to:

take both the predicted valley voltage in the first stage and the predicted valley voltage in the second stage as initial target read voltages in accordance with a failure of the first error correction decode; obtain a corresponding first result at the initial target read voltage; determine the initial target read voltage to be a target valley voltage in accordance with the corresponding first result at the initial target read voltage meeting a preset condition; or make at least one adjustment to the initial target read voltage, and obtain a corresponding first result at the adjusted target read voltage after each adjustment;

determine the adjusted target read voltage to be the target valley voltage in accordance with the corresponding first result at the adjusted target read voltage meeting a preset condition; and control the memory device to perform a second read operation on the at least one code word in accordance with the target valley voltage, and perform a second error correction decode on a second read result of the second read operation.

16. The memory controller of claim 14, wherein the control component is configured to:

take the predicted valley voltage in the first stage as an initial target read voltage in accordance with a failure of the first error correction decode, obtain the first result for the initial target read voltage; determine the initial read voltage to be a target valley voltage in accordance with the corresponding first result at the initial read voltage meeting a preset condition; or make at least one adjustment to the initial target read voltage, and obtain a corresponding first result at the adjusted target read voltage after each adjustment;

determine the target valley voltage in accordance with the corresponding first result at the adjusted target read voltage meeting a preset condition;

obtain the predicted valley voltage in the second stage in accordance with the determined target valley voltage in the first stage; and control the memory device to perform a second read operation on the at least one code word in accordance with the determined target valley voltage in the first stage and the predicted valley voltage in the second stage, and perform a second error correction decode on a second read result of the second read operation.

17. The memory controller of claim 14, wherein each of the multiple pages includes multiple second stages;

the control component is configured to:

obtain the predicted valley voltage in the second stage corresponding to the highest read voltage among read voltages in the multiple second stages for each of the pages in accordance with the predicted valley voltage in the first stage or the target valley voltage in the first stage for each of the pages; and obtain the predicted valley voltage in the second stage corresponding to a lower read voltage than a read voltage in an adjacent second stage, in accordance with the predicted valley voltage in the second stage corresponding to a higher read voltage among read voltages in the multiple second stages for each of the pages in sequence, until the predicted valley voltage in each of the second stages for each of the pages is obtained.

18. The memory controller of claim 14, wherein the control component is configured to:

obtain the predicted valley voltage in the second stage in accordance with the predicted valley voltage in the first stage or the target valley voltage in the first stage and a first mapping function, and wherein the first mapping function represents a relationship between the predicted valley voltage in the first stage or the target valley voltage in the first stage and the predicted valley voltage in the second stage.

19. The memory controller of claim 15, wherein the control component is configured to:

in a process of making at least one adjustment to the initial target read voltage, take the initial target read voltage as a baseline value;

starting from the baseline value, making adjustments in two opposite directions with a step size being smaller than a first preset step size, in a process of making adjustments in each direction, count one for upward trend in accordance with the corresponding first result at a read voltage after a next adjustment being greater than the corresponding first result at a read voltage after a previous adjustment, and determine a first voltage boundary and a second voltage boundary with a total counted number greater than or equal to a preset number; and in a process of making adjustments in two directions, if a corresponding first result at a target read voltage after one adjustment is lower than a first threshold, or taking the minimum first result among multiple first results corresponding to target read voltages after multiple adjustments as a reference value, when the number of first results from remaining first results which differ from the reference value with a difference being less than a second threshold is greater than a preset number, stop the adjustments and take the target read voltage corresponding to the minimum first result among the multiple first results as the target valley voltage.

20. The memory controller of claim 19, wherein the control component is configured to:

in the process of making adjustments in two directions, take the corresponding adjusted target read voltages as the first voltage boundary and the second voltage boundary respectively in accordance with the total counted number being equal to the preset number;

in the process of making adjustments in two directions, if the first voltage boundary and the second voltage boundary have been determined, take the target read voltage for the last adjustment as an average of the first voltage boundary and the second voltage boundary; and take the read voltage corresponding to the minimum first result among the multiple corresponding first results at all the adjusted target read voltages as the target valley voltage.

\* \* \* \* \*